(12) United States Patent
Sasago et al.

(10) Patent No.: US 9,293,508 B2
(45) Date of Patent: Mar. 22, 2016

(54) SEMICONDUCTOR STORAGE DEVICE AND METHOD OF FABRICATING SAME

(75) Inventors: Yoshitaka Sasago, Tokyo (JP);
Masaharu Kinoshita, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/349,386

(22) PCT Filed: Oct. 7, 2011

(86) PCT No.: PCT/JP2011/005641
§ 371 (c)(1),
(2), (4) Date: May 2, 2014

(87) PCT Pub. No.: WO2013/051066
PCT Pub. Date: Apr. 11, 2013

(65) Prior Publication Data
US 2014/0246646 A1    Sep. 4, 2014

(51) Int. Cl.
*H01L 21/00*     (2006.01)
*H01L 27/24*     (2006.01)
*H01L 45/00*     (2006.01)

(52) U.S. Cl.
CPC ........ *H01L 27/2481* (2013.01); *H01L 27/2409* (2013.01); *H01L 27/2454* (2013.01); *H01L 45/06* (2013.01); *H01L 45/124* (2013.01); *H01L 45/1226* (2013.01); *H01L 45/1233* (2013.01); *H01L 45/144* (2013.01); *H01L 45/1683* (2013.01)

(58) Field of Classification Search
CPC ............ H01L 27/2481; H01L 27/2409; H01L 27/2454; H01L 45/1233; H01L 45/124; H01L 45/06; H01L 45/1226; H01L 45/144; H01L 45/1683

USPC ........................................................ 257/4–5
See application file for complete search history.

(56) References Cited

U.S. PATENT DOCUMENTS

| 8,563,961 | B2 * | 10/2013 | Sasago et al. ............... 257/4 |
| 2008/0149913 | A1 * | 6/2008 | Tanaka et al. ............... 257/5 |
| 2011/0122676 | A1 * | 5/2011 | Murooka et al. ........... 365/148 |
| 2012/0248399 | A1 * | 10/2012 | Sasago et al. ............... 257/4 |
| 2013/0141968 | A1 * | 6/2013 | Sasago et al. ........... 365/163 |
| 2013/0228739 | A1 * | 9/2013 | Sasago et al. ............... 257/4 |

(Continued)

FOREIGN PATENT DOCUMENTS

| JP | 2008-160004 A | 7/2008 |
| JP | 2011-114016 A | 6/2011 |

(Continued)

*Primary Examiner* — Laura Menz
(74) *Attorney, Agent, or Firm* — Miles & Stockbridge PC

(57) ABSTRACT

A memory cell array having such a structure that can be realized with a simpler process and ideal for realizing a higher density is provided. Memory cells have a structure in which channel layers (88p and 89p) are formed on the side surfaces of each of a plurality of stacked structures which extends in the Y direction and is periodically formed in the X direction with a gate insulator film layer (9) interposed, and a resistance-change material layer (7) is formed so as to be electrically connected to two adjacent channel layers of the channel layers. Due to such a structure, it is not necessary to perform such a very difficult step that processes the resistance-change material and the silicons collectively and it is possible to provide the memory cell array with a simpler process.

15 Claims, 45 Drawing Sheets

(56) References Cited

U.S. PATENT DOCUMENTS

2013/0234101 A1* 9/2013 Sasago et al. .............. 257/4
2014/0246646 A1* 9/2014 Sasago et al. .............. 257/5

FOREIGN PATENT DOCUMENTS

| WO | WO 2011/074545 A1 | 6/2011 |
| WO | WO 2012/168981 A1 | 12/2012 |

* cited by examiner (a)

(b)

A-A CROSS-SECTION

B-B CROSS-SECTION

A-A CROSS-SECTION

B-B CROSS-SECTION

A-A CROSS-SECTION

B-B CROSS-SECTION

A-A CROSS-SECTION

B-B CROSS-SECTION

A-A CROSS-SECTION

B-B CROSS-SECTION

A-A CROSS-SECTION

B-B CROSS-SECTION

A-A CROSS-SECTION (a)

(b)

RESET/SET/READ OPERATION

| | 00 | 01 | 10 | 11 |
|---|---|---|---|---|
| C3 | SET | SET | SET | RESET |
| C2 | SET | SET | RESET | SET |
| C1 | SET | RESET | SET | SET |

(b)

| | 000 | 001 | 010 | 100 | 011 | 101 | 110 | 111 |
|---|---|---|---|---|---|---|---|---|
| C7 | SET | SET | SET | SET | SET | SET | SET | RESET |
| C6 | SET | SET | SET | SET | SET | SET | RESET | SET |
| C5 | SET | SET | SET | SET | SET | RESET | SET | SET |
| C4 | SET | SET | SET | SET | RESET | SET | SET | SET |
| C3 | SET | SET | SET | RESET | SET | SET | SET | SET |
| C2 | SET | SET | RESET | SET | SET | SET | SET | SET |
| C1 | SET | RESET | SET | SET | SET | SET | SET | SET |

(c)

| | 000 | 001 | 010 | 100 | 011 | 101 | 110 | 111 |
|---|---|---|---|---|---|---|---|---|
| C8 | SET | SET | SET | SET | SET | SET | SET | RESET |
| C7 | SET | SET | SET | SET | SET | SET | RESET | SET |
| C6 | SET | SET | SET | SET | SET | RESET | SET | SET |
| C5 | SET | SET | SET | SET | RESET | SET | SET | SET |
| C4 | SET | SET | SET | RESET | SET | SET | SET | SET |
| C3 | SET | SET | RESET | SET | SET | SET | SET | SET |
| C2 | SET | RESET | SET | SET | SET | SET | SET | SET |
| C1 | RESET | SET | SET | SET | SET | SET | SET | SET |

SEMICONDUCTOR STORAGE DEVICE AND METHOD OF FABRICATING SAME

TECHNICAL FIELD

This invention relates to a semiconductor storage device and a method of fabricating the same.

BACKGROUND ART

In recent years, phase-change memories which use chalcogenide materials as recording materials have been studied actively. A phase-change memory is one type of resistance-change memories that store information by exploiting such behavior that recording materials between electrodes have different resistance states.

A phase-change memory stores information by exploiting such behavior that a phase-change material such as $Ge_2Sb_2Te_5$ has different resistivity in its amorphous and crystalline states. The resistance is high in the amorphous state and is low in the crystalline state. Thus, a read is performed by biasing a voltage difference between both ends of a device to measure electric current flowing in the device and determining whether the device is in a high resistance state or a low resistance state.

In phase-change memories, data programming/erasing is performed by changing electrical resistance of a phase-change film to a different state using the Joule heat generated by electric current. Reset operation (that is, operation of changing the electrical resistance to a high resistive amorphous state) is performed by biasing a large amount of current for a short period to fuse the phase-change material and then quickly decreasing the current to rapidly cool the phase-change material. On the other hand, set operation (that is, operation of changing the electrical resistance to a low resistive crystalline state) is performed by biasing an amount of current sufficient for maintaining the phase-change material at its crystallization temperature for a long period. Theoretically, the phase-change memories are ideal for reduction of memory cell size because the amount of current required for changing the state of a phase-change film decreases along with reduction of memory cell size. Due to this, studies on phase-change memories have been conducted actively.

Moreover, PTL 2 discloses an example of a phase-change memory in which a channel layer extending to a direction perpendicular to a substrate is formed between stripe-shaped stacked gates, phase-change materials being in contact with the facing channel layers are separated by an insulator film, and a select transistor that controls the current flowing in the respective channels independently is used so that information can be recorded in the respective separated phase-change material layers independently.

As a method of realizing the integration of memory which uses a resistance-change device, PTL 1 discloses a configuration in which a plurality of gate electrode materials and a plurality of insulator films are alternately stacked to form a stacked structure, a plurality of through-holes is formed in a collectively patterning manner so as to penetrate through the entire layer, and a gate insulator film, a channel layer, and a phase-change film are deposited and patterned inside the through-holes. Moreover, PTL 3 discloses an example of a resistance-change memory rather than a phase-change memory in which a channel layer extending in a direction perpendicular to a substrate is formed between stripe-shaped stacked gates and a resistance-change material is formed in a region interposed between the facing channel layers.

CITATION LIST

Patent Literature

PTL 1: JP 2008-160004 A
PTL 2: WO 2011/074545 A
PTL 3: JP 2011-114016 A

SUMMARY OF INVENTION

Technical Problem

However, the phase-change memory disclosed in PTL 1 has the following problems.

A select transistor that selects one vertical chain cell is a vertical transistor. In this select transistor, a plurality of select transistors is provided for one common source line, and these select transistors need to be selectable independently. Thus, gate electrodes need to be separated by an insulator film, and as a result, a gap is formed in the common source line direction, which makes it difficult to increase the degree of integration (that is, it is difficult to reduce the cost). Specifically, since the width of a gate electrode of the select transistor is 2F (F: minimum feature size) and the width between the gate electrodes is F, the pitch of a memory cell is 3F. Since the pitch of a memory cell in the extension direction of a gate electrode is 2F, the area of a memory cell is $6F^2$ in each layer.

Moreover, PTL 2 has the following problems. Unlike PTL 1, since diodes are used as select devices, memory arrays are formed at a pitch of 2F in both two in-plane directions. That is, in each layer, $2F \times 2F = 4F^2$ is the area of a unit cell in an array in which memory cells are formed periodically. Moreover, in an example in which a gate is patterned in a line-and-space form, since two independent memory cells can be formed in the unit cell, the area of the memory cell is $2F^2$ in each layer. However, this fabricating process requires a step of collectively patterning the phase-change material and silicon deposited inside a deep groove that is formed in a stacked structure of a gate and an inter-gate space insulator film. Since this step is a process of collectively patterning different materials in a groove having a high aspect ratio, this step is highly difficult and becomes a cause that limits the number of stacked layers, which makes it difficult to reduce the cost.

Moreover, PTL 3 has the following problems. Since the gate electrode of the memory cell is formed in a line-and-space form having a pitch of 2F like PTL 2, the area of a unit cell is $4F^2$ in each layer. However, since the same voltage in each layer within the memory array is biased to the stacked gate and the select transistor is not present, two channels present at the intersection of upper and lower electrode wires are selected simultaneously, and only one memory cell in each layer within the unit cell can operate. That is, the area of the memory cell is $4F^2$ in each layer. Moreover, since a device for selecting an intersection of upper and lower electrodes as the diode of PTL 2 is not present, a large amount of current leaks from a semi-selected portion, and it is necessary to reduce the size of a memory cell array. Thus, if the volume is the same, since the number of memory cell arrays increases, the number of peripheral circuits increases. Therefore, the area of the peripheral circuit also increases, and the cell occupancy (=(area occupied by memory cell)/((area occupied by memory cell)+(area of peripheral circuit)) decreases, which makes it difficult to reduce the cost.

One of the problems common to PTLs 1, 2, and 3 is associated with operation of storing 1-bit information in each cell of series-connected chain cells during programming of information. Although this method is beneficial to improvement of recording density only, since 1-bit information is programmed to all cells, a programming transfer rate is not improved and data destruction due to programming disturbance may occur.

Therefore, an object of this invention is to provide a memory cell array which has such a structure that can be realized with a simpler process and that is ideal for realizing a higher density and which can reduce a bit cost of memory. Another object of this invention is to provide a data recording method for realizing high reliability and a high transfer rate.

The above objects and novel features of this invention will become apparent from the description of the present specification and the accompanying drawings.

Solution to Problem

Outlines of representative examples among inventions disclosed in the present application are briefly described below.

According to a second aspect of the invention, there is provided a semiconductor storage device including: a plurality of stacked structures in which a plurality of first insulator film layers and a plurality of first gate semiconductor layers extending in a Y direction when X-axis and Y-axis are defined as being orthogonal to each other in parallel to a main surface of a semiconductor substrate are alternately stacked and which is periodically formed in an X direction; a plurality of first gate insulator film layers provided on a side surface in the X direction of each of the plurality of stacked structures; a plurality of first channel layers which is formed on a side of the side surface in the X direction of each of the plurality of first gate insulator film layers where the stacked structure is not formed and which is periodically formed in the Y direction; and a plurality of resistance-change material layers which is periodically formed in the Y direction between two adjacent stacked structures of the plurality of stacked structures and is electrically connected to two adjacent channel layers of the plurality of first channel layers and which is formed from a material of which the resistivity changes with a current flowing therein.

According to a second aspect of the invention, there is provided a method of fabricating a semiconductor storage device including the steps of: (a) forming a plurality of stacked structures in which a plurality of first insulator film layers and a plurality of first gate semiconductor layers are alternately stacked above a semiconductor substrate so as to extend in a Y direction when X-axis and Y-axis are defined as being orthogonal to each other in parallel to a main surface of the semiconductor substrate; (b) forming a plurality of gate insulating layers along a side surface of each of the plurality of stacked structures; (c) forming a plurality of channel layers along a side surface of each of the plurality of gate insulating layers; (d) forming a plurality of second insulating layers and a plurality of third insulating layers between the plurality of channel layers so as to extend in the X direction and be formed alternately in the Y direction; (e) selectively removing the plurality of second insulating layers from the plurality of second insulating layers and the plurality of third insulating layers; and (f) forming a plurality of resistance-change material layers along a region of the side surface of each of the plurality of channel layers where the second insulating layer is removed.

Advantageous Effects of Invention

According to this invention, it is possible to fabricate memory cell arrays ideal for reduction of memory cell size and a semiconductor storage device with high density, and reduce the bit cost or to improve a data transfer rate.

BRIEF DESCRIPTION OF DRAWINGS

FIGS. 31(a) and 31(b) are partial cross-sectional views in an XY plane parallel to a substrate, of the semiconductor storage device according to the first embodiment of this invention, in which FIG. 31(a) is a cross-sectional view at the height of a gate polysilicon 24$p$ and FIG. 31(b) is a cross-sectional view at the height of an insulator film 14.

FIGS. 34(a) and 34(b) are partial cross-sectional views in an XY plane parallel to a substrate, of the semiconductor storage device according to the first embodiment of this invention, in which FIG. 34(a) is a cross-sectional view at the height of a gate polysilicon 24$p$ and FIG. 34(b) is a cross-sectional view at the height of an insulator film 14.

FIGS. 45(a) to 45(c) are diagrams illustrating a data storing method using the semiconductor storage device according to the first embodiment of this invention, in which FIG. 45(a) is a diagram when storing two bits using three cells, FIG. 45(b) is a diagram when storing three bits using seven cells, and FIG. 45(c) is a diagram when storing three bits using eight cells.

DESCRIPTION OF EMBODIMENTS

Figure 1:
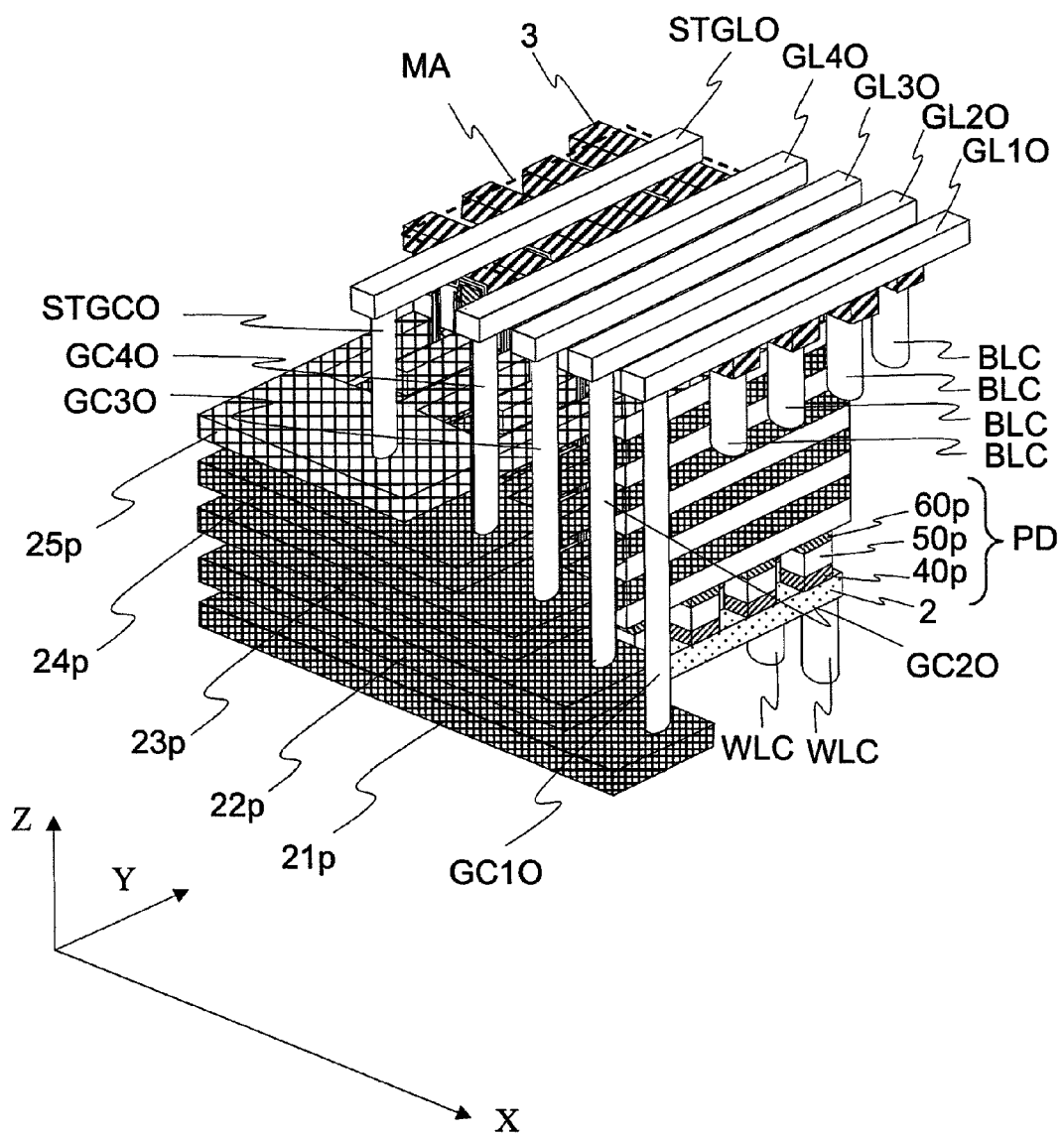
FIG. 1 is a partial 3-dimensional schematic view of a semiconductor storage device according to a first embodiment of this invention.

Hereinafter, embodiments of this invention are described in detail based on the drawings. In all drawings used for illustrating the embodiments, members having the same function are denoted by the same reference numerals, and redundant description thereof will not be provided. Moreover, it should be noted that the characteristic aspects of the invention are not limited to the embodiments and that the same effects are obtained when other embodiments have the same aspects.

<Configuration of Memory Array>

FIG. 1 is a partial 3-dimensional schematic view of a semiconductor storage device according to a first embodiment of this invention and illustrates part of memory cell arrays, wires, and contacts. FIG. 1 illustrates a portion including: a word line 2; a contact hole WLC that connects the word line 2 and a peripheral circuit; a diode layer PD including a polysilicon layer 40$p$ doped with p-type impurities, a polysilicon layer 50$p$ doped with low-concentration impurities, and a polysilicon layer 60$p$ doped with n-type impurities; gate polysilicon layers 21$p$, 22$p$, 23$p$, and 24$p$ of a memory cell; a gate polysilicon layer 25$p$ of a select transistor; metal wires GL1O, GL2O, GL3O, and GL4O for supplying current to the gate polysilicon layers of the memory cell; contacts GC1O, GC2O, GC3O, and GC4O for connecting the gate polysilicon layers 21$p$, 22$p$, 23$p$, and 24$p$ of the memory cell and the wires GL1O, GL2O, GL3O, and GL4O; a metal wire STGLO for supplying current to the gate polysilicon layer 25$p$ of the select transistor; a contact STGCO for connecting the gate polysilicon layer 25$p$ of the select transistor and the wire STGLO; a bit line 3; and a contact hole BLC for connecting the bit line 3 and the peripheral circuit.

The gate polysilicon layers 21$p$, 22$p$, 23$p$, and 24$p$ of the memory cell and the gate polysilicon layer 25$p$ of the select transistor are patterned in a line-and-space form in a memory array MA and are alternately connected at the ends in the Y direction. In FIG. 1, odd-numbered layers 21$p$, 22$p$, 23$p$, 24$p$, and 25$p$ are connected. Although not illustrated in the figure, even-numbered layers 21$p$, 22$p$, 23$p$, 24$p$, and 25$p$ are connected at the ends on the opposite side in the Y direction, and metal wires GL1E, GL2E, GL3E, and GL4E for supplying current to the gate polysilicon layers of the memory cell, contacts GC1E, GC2E, GC3E, and GC4E for connecting the gate polysilicon layers 21p, 22p, 23p, and 24p of the memory cell and the wires GL1E, GL2E, GL3E, and GL4E, a metal wire STGLE for supplying current to the gate polysilicon layer 25p of the select transistor, and a contact STGCE for connecting the gate polysilicon layer 25p of the select transistor and the wire STGLE are formed.

Figure 2:
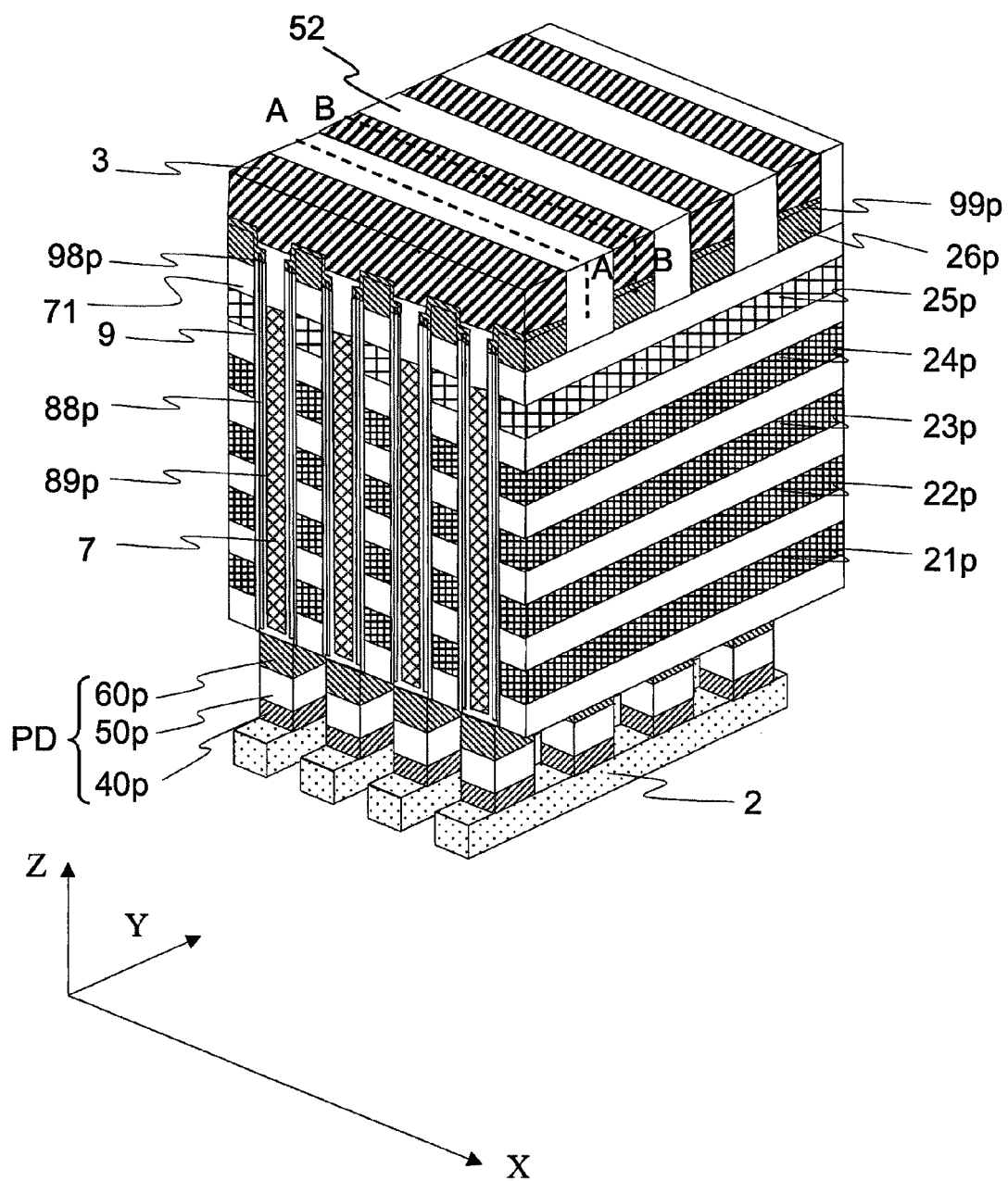
FIG. 2 is a partial 3-dimensional schematic view of the semiconductor storage device of the first embodiment of this invention.

FIG. 2 is a diagram illustrating the portion of the memory array MA in particular in FIG. 1. Diode layers PDs formed from polysilicon are provided on a plurality of word lines 2 extending in the Y direction. Here, the diode layers PDs are periodically provided in the Y direction with an insulator film (not illustrated) interposed. A stacked film of the gate polysilicon layers 21p, 22p, 23p, 24p, and 25p and the insulator film layers 11, 12, 13, 14, 15, and 71 is patterned in a stripe form in the Y direction parallel to the extension direction of the word line 2. The bit line 3 is disposed on the insulator film 71 in a stripe form extending in the X direction perpendicular to the word line 2 and is buried between the insulator films 52 extending in the same X direction.

In the space portion of the stacked film of the gate polysilicon layers 21p, 22p, 23p, 24p, and 25p and the insulator film layers 11, 12, 13, 14, 15, and 71, sidewalls of the gate polysilicon layers 21p, 22p, 23p, and 24p are stacked under the bit line 3, and a gate insulator film 9, channel polysilicon layers 88p and 89p, and a phase-change material layer 7 is stacked in this order under the sidewalls of the insulator film layers 11, 12, 13, and 14 and the sidewall of the insulator film 15. The gate insulator film layer 9 and the channel polysilicon layers 88p and 89p are stacked above the sidewall of the insulator film layer 15 and on the sidewalls of the gate polysilicon layer 25p and the insulator film layer 71. An insulator film layer 92 is buried between the channel polysilicon layers of both surfaces. In the bottom portion of the lower portion of the bit line 3 in the space portion of the stacked film of the gate polysilicon layers 21p, 22p, 23p, 24p, and 25p and the insulator film layers 11, 12, 13, 14, 15, and 71, an upper surface of the polysilicon layer 60p is in contact with the channel polysilicon layer 89p. The polysilicon layer 50p is further connected to the wire 2 with a polysilicon layer 40p interposed. The polysilicon layers 60p, 50p, and 40p form the diode layer (PD).

Figure 3:
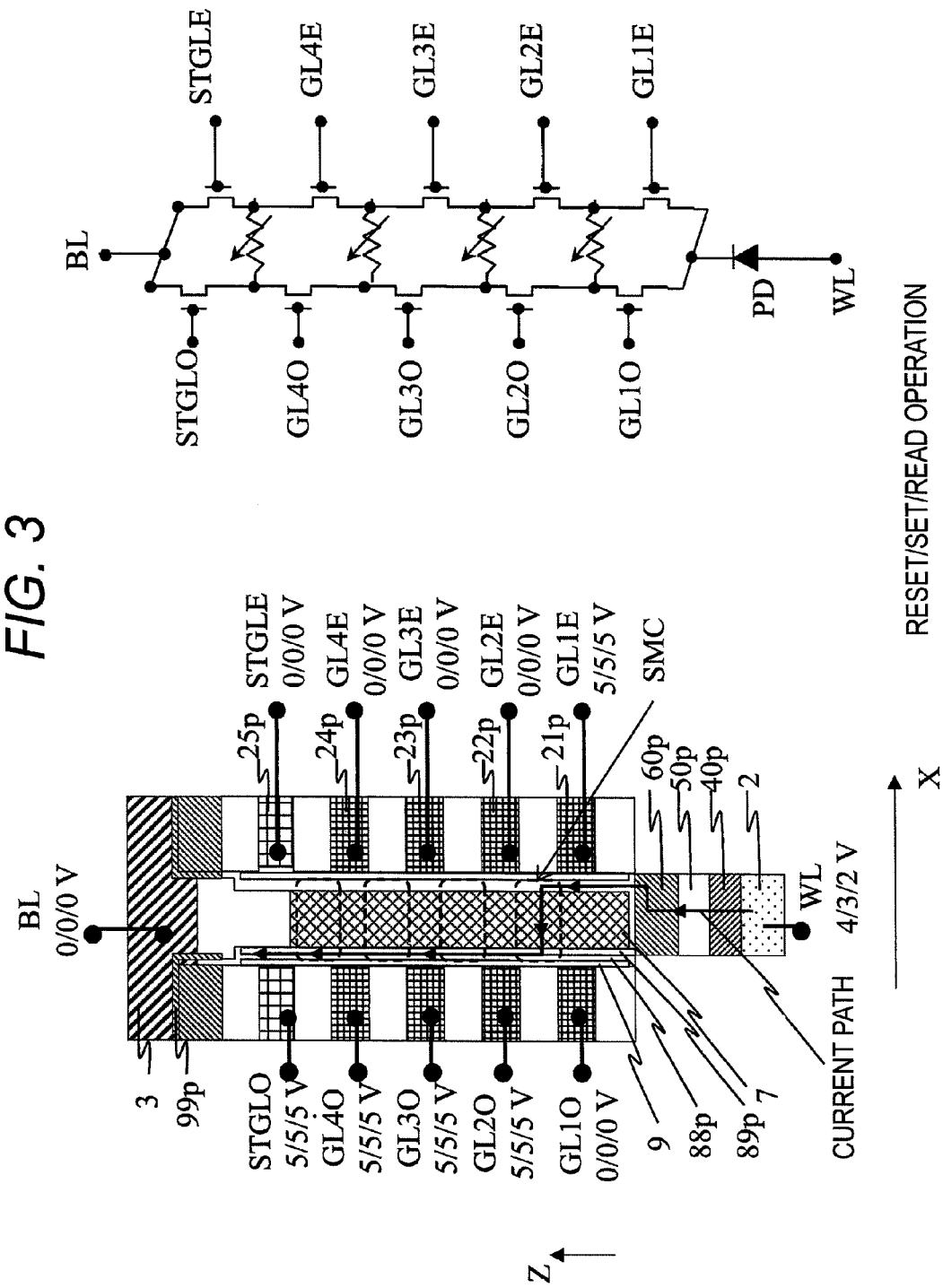
FIG. 3 is a diagram illustrating reset operation, set operation, and read operation of the semiconductor storage device according to the first embodiment of this invention.

In this manner, the memory array (MA) of FIG. 3 has a configuration in which a stacked structure having a plurality of first gate semiconductor layers (21p to 24p) extending in the Y direction so as to be provided above the diode layer PD and stacked on each other with the insulator film (11 to 15) interposed and a second gate semiconductor layer (25p) extending in the Y direction so as to be provided above the first gate semiconductor layers is periodically formed in the X direction.

The memory array includes a plurality of first gate insulator film layers (9) provided on the +X and −X side surfaces of the first and second gate semiconductor layers, a plurality of first channel layers (8p+X) provided on the +X side surface of the first and second gate semiconductor layers with the first gate semiconductor layer interposed, formed periodically in the Y direction, and electrically connected to the diode layer PD, a plurality of second channel layers (8p−X) provided on the side surface in the same manner as the plurality of first channel layers, and a plurality of first resistance-change material layers provided on the +X side surface of the first gate semiconductor layer with the first gate insulator film layer and the first channel layer interposed and on the −X side surface with the second channel layer interposed, formed periodically in the Y direction, and formed from a mat of which the resistivity changes with current flowing therein.

Due to such a configuration, when the minimum feature size is F, the repetition cycle is 2F in both X and Y directions. Thus, the area of a unit cell is $4F^2$. However, as will described later with reference to FIGS. 3 and 4, two memory cells can be formed in the unit cell per each of the first stacked gate semiconductor layers, and the memory cell area per each of the first gate semiconductor layer is $2F^2$. This memory cell is smaller than $6F^2$ and $4F^2$ disclosed in the techniques of PTLs 1 and 3.

Moreover, in order to allow a 3-dimensional memory array MA to function as a storage device, it is ideal that select operation can be realized in each X, Y, and Z direction, and the select operation can be realized with the above-described configuration of the memory array. The reasons thereof will be described below.

A semiconductor storage device of this invention stores information by exploiting such behavior that a phase-change material such as $Ge_2SB_2Te_5$ included in the phase-change material layer 7 has different resistivity in its amorphous and crystalline states. The resistance is high in the amorphous state and is low in the crystalline state. Thus, read is performed by biasing a voltage difference between both ends of a resistance-change device to measure electric current flowing in the device and determining whether the device is in a high resistance state or a low resistance state.

Operation (that is, set operation) of changing the state of a phase-change material from a high resistive amorphous state to a low resistive crystalline state can be realized by heating the phase-change material in the amorphous state to its crystallization temperature or higher and maintaining it for approximately $10^{-6}$ seconds or longer to create a crystalline state. Moreover, the phase-change material in the crystalline state can be put into the amorphous state by heating the phase-change material up to its melting point or higher to liquify the same and then rapidly cooling the same.

<First Select Operation in Z Direction>

In the present specification, voltages that put transistors into the same state are represented as the same value (for example, gate voltages that put transistors into the ON state are represented as "5 V"). However, a specific value of the gate voltage may be adjusted by respective transistors. Specifically, an optimal voltage may be biased to respective gate lines in such a way that, when transistors are put into the same state, 5 V is biased to a gate line GL1O and 5.1 V is biased to a gate line GL2O. Based on this, in the present specification, it cannot be said that the same gate voltage is biased to transistors that are defined to be in the same state, and the transistors defined to be in the same state include transistors in which the same state is realized although the gate voltages biased thereto are different.

Figure 4:
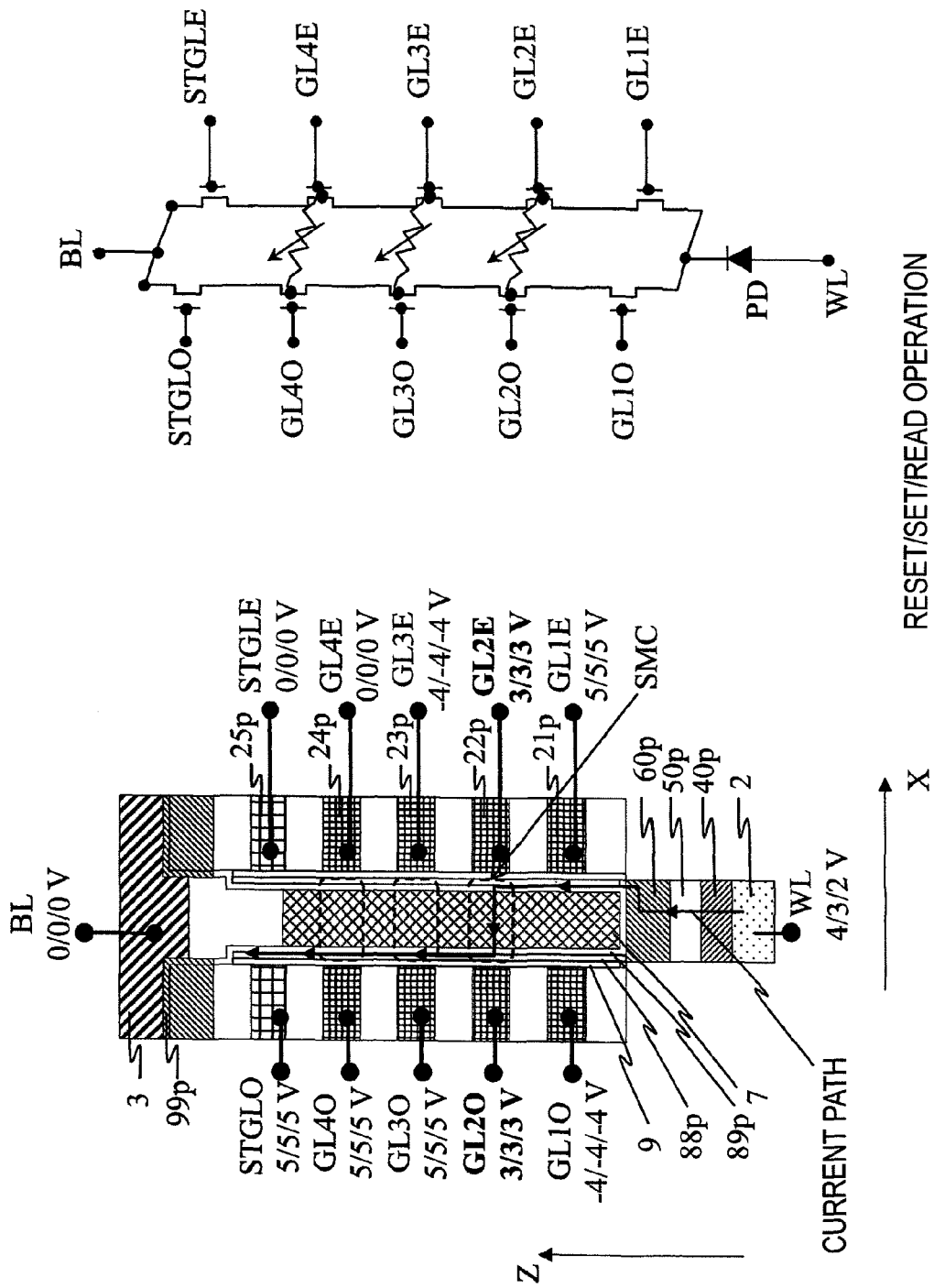
FIG. 4 is a diagram illustrating reset operation, set operation, and read operation of the semiconductor storage device according to the first embodiment of this invention.

FIGS. 3 and 4 illustrate a portion of a cross-section in the XZ plane of the memory cell array MA of FIG. 2. Although an insulator film layer 31 is not depicted in FIGS. 1 and 2 for the sake of simplicity, the insulator film layer 31 is an insulator film buried in the space between PDs.

In FIG. 3, a select cell SMC corresponds to the phase-change material film 7 at the height (the distance from the substrate surface in the Z-axis direction, the same herein below) of the insulator film layer 12 at the boundary between the gate polysilicon layers 21p and 22p. As described in FIG. 1, the left and right gate polysilicon layers are connected to different wires (for example, as GL1O and GL1E are connected to 21p), respectively, and are configured to supply independent voltage.

0 V is biased to the gate line GL1O so that transistors of which the channels are the channel silicon layers 88p and 89p on the sidewalls (particularly represents the portions at the same height as the gate polysilicon layer, the same herein below) of the gate polysilicon 21*p* are put into the OFF state. 5 V is biased to the gate lines GL2O, GL3O, GL4O, and STGLO so that transistors of which the channels are the channel silicon layers 88*p* and 89*p* on the sidewalls are put into the ON state. 5 V is biased to the gate line GL1E so that transistors of which the channels are the channel silicon layers 88*p* and 89*p* on the sidewalls are put into the ON state. 0 V is biased to the gate lines GL2E, GL3E, GL4E, and STGLE so that transistors of which the channels are the channel silicon layers 88*p* and 89*p* on the sidewalls are put into the OFF state.

Portions of the channel silicons 88*p* and 89*p* on the left side (−X side) extending from the bit line 3 to the select cell SMC are in the low resistance state due to the gate and are electrically connected, whereas portions extending from the SMC to the diode layer PD are electrically disconnected. Portions of the channel silicons 88*p* and 89*p* on the right side (+X side) extending from the bit line 3 to the select cell SMC are electrically disconnected, whereas portions extending from the SMC to the diode layer PD are in the low resistance state due to the gate and are electrically connected.

0 V is biased to the bit line BL, and 4 V, 3 V, and 2 V are biased to the word line WL during reset operation, set operation, and read operation, respectively. Due to a voltage difference between the bit line BL and the word line WL, as illustrated in FIG. 3, current flows through the channel silicon layer from the diode layer PD to the SMC on the +X side and flows through the channel silicon layer from the SMC to the bit line 3 again on the −X side via the phase-change material layer 7 of the SMC. During the reset operation and the set operation, the operation is performed by changing the resistivity of the phase-change material with the current flowing through the phase-change material layer 7 using the SMC. During the read, the operation is performed by determining the current value flowing through the phase-change material layer 7 using the SMC.

The above-described read method of FIG. 3 is summarized as follows.

First, it is assumed that n (n is a natural number and is 4 in FIG. 3) first gate semiconductor layers are included in each of the first stacked structures (GL1O to GL4O and the insulator film layers disposed therebetween) and the second stacked structures (GL1E to GL4E and the insulator film layers disposed therebetween).

In this case, voltage is biased to a k-th (1≤k≤n−1) gate semiconductor layer (GL1O) from the bottom among the first gate semiconductor layers included in the first stacked structure so that transistors including the first gate semiconductor layer are put into the OFF state, and voltage is biased to the other gate semiconductor layers (GL2O to GL4O) so that transistors including the first gate semiconductor layers are put into the ON state (herein, k is 1<k≤n−1, and FIG. 3 illustrates an example of k=1).

Moreover, voltage is biased to a k-th gate semiconductor layer (GL1E) from the bottom among the first gate semiconductor layers included in the second stacked structure so that transistors including the first gate semiconductor layer are put into the ON state, and voltage is biased to the other gate semiconductor layers (GL2E to GL4E) so that transistors including the first gate semiconductor layers are put into the OFF state.

Here, the ON-state resistivity of the channel of the transistor that includes the first gate semiconductor layer is naturally smaller than that of the OFF state. Thus, since the channel silicon layers 88*p* and 89*p* on the sidewalls of the GL1O and the channel silicon layers 88*p* and 89*p* on the sidewalls of the GL2E are in the high resistance state, the current flowing from the word line 2 first flows through the channel silicon layer on the side surface of the second stacked structure and then flows into the channel silicon layer on the side surface of the first stacked structure via the phase-change material layer 7 at the height of the insulator film layer 12. By using such a current path, it is possible to realize the set, reset, and read on the phase-change material layer 7 at the height of the insulator film at the gate polysilicon layer boundary. As a result, the respective regions surrounded by dot lines in FIG. 3 function as memory cells.

<Second Select Operation in Z Direction>

Although FIG. 3 illustrates a method of performing the set, reset, and read on the phase-change material layer 7 at the height of the insulator film at the gate polysilicon layer boundary, programming may be performed at the height of the gate polysilicon layer as illustrated in FIG. 4. In the following description, since a plurality of ON states and a plurality of OFF states are used, the state simply referred to as "ON state" in the description of FIG. 3 will be referred to as a "first ON state" and the state simply referred to as "OFF state" will be referred to as a "first OFF state".

−4 V is biased to the gate line GL1O and transistors of which the channels are the channel silicon layers 88*p* and 89*p* on the sidewalls are put into a second OFF state. Here, since the application voltage of −4 V in the second OFF state is lower than the application voltage (0 V) in the first OFF state, the function in the second OFF state, of the gate line GL1O putting the channel silicon layer in the vicinity thereof into the high resistance state is stronger than that of the first OFF state. As a result, the channel silicon layers 88*p* and 89*p* on the sidewalls at the height of the insulator film 12 as well as the height of the gate line GL1O are in the high resistance state. 3 V is biased to the gate line GL2O and transistors including the channel silicon layers 88*p* and 89*p* on the sidewalls are put into the second ON state. Here, the function in the second ON state, of the gate line GL2O putting the channel silicon layers 88*p* and 89*p* on the sidewalls thereof into the low resistance state is weaker than that of the first ON state.

Further, the function in the second ON state, of the gate line GL2O putting the channel silicon layers 88*p* and 89*p* of the sidewalls into the low resistance state is weaker than the function in the second OFF state, of the gate line GL1O putting the channel silicon layers 88*p* and 89*p* of the sidewalls into the high resistance state. In the present embodiment, such a relation is realized by setting the absolute value of the application voltage (3 V) to the gate line GL2O to be smaller than the absolute value of the application voltage (−4 V) to the gate line GL1O (however, the relation of the absolute values may be reversed by adjusting the application voltage). Thus, the effect of the gate line GL1O putting the channel silicon layers 88*p* and 89*p* on the sidewalls of the insulator film into the high resistance state is not too weak to be negated by the gate line GL2O. 5 V is biased to the gate lines GL3O, GL4O, and STGLO so that transistors of which the channels are the channel silicon layers 88*p* and 89*p* on the sidewalls are put into the first ON state.

5 V is biased to the gate line GL1E so that transistors of which the channels are the channel silicon layers 88*p* and 89*p* on the sidewalls are put into the first ON state. 3 V is biased to the gate line GL2E so that transistors of which the channels are the channel silicon layers 88*p* and 89*p* on the sidewalls are put into the second ON state similarly. −4 V is biased to the gate line GL3E so that transistors of which the channels are the channel silicon layers 88*p* and 89*p* on the sidewalls are put into the second OFF state. Here, the effect of biasing 3 V to the gate line GL2E and biasing −4 V to the gate line GL3E is the same as the effect of biasing voltages to the gate lines GL1O and GL2O. That is, the channel silicon layers 88*p* and 89*p* on the sidewalls of the insulator film 13 between the gate lines GL2E and GL3E are put into the high resistance state. 0 V is biased to the gate lines GL4E and STGLE so that transistors of which the channels are the channel silicon layers 88*p* and 89*p* on the sidewalls are put into the first OFF state.

The above-described read method of FIG. 4 is summarized as follows.

First, voltage is biased to a k-th ($1<k\leq n-1$) gate semiconductor layer (GL2O) from the bottom among the first gate semiconductor layers included in the first stacked structure so that transistors including the first gate semiconductor layer are put into the second ON state, voltage is biased to the first to (k−1)th gate semiconductor layers (GL1O) from the bottom so that transistors including the first gate semiconductor layers are put into the second OFF state, and voltage is biased to the (k+1)th to n-th gate semiconductor layers (GL3O to GL4O) from the bottom so that transistors including the first gate semiconductor layers are put into the first ON state (FIG. 4 illustrates an example of k=2).

Subsequently, voltage is biased to the k-th gate semiconductor layer (GL2E) from the bottom among the first gate semiconductor layers included in the second stacked structure so that transistors including the first gate semiconductor layer are put into the second ON state, voltage is biased to the first to (k−1)th gate semiconductor layers (GL1E) from the bottom so that transistors including the first gate semiconductor layers are put into the first ON state, and voltage is biased to the (k+1)th gate semiconductor layer (GL3E) from the bottom so that transistors including the first gate semiconductor layer are put into the second OFF state. Voltage is biased to the (k+2)th and subsequent gate semiconductor layers (GL4E) so that transistors including the first gate semiconductor layers are put into the first OFF state. Although voltage may be biased to these gate semiconductor layers so that the second OFF state is created, it is preferable to bias voltage that can create the first OFF state in order to prevent a large voltage difference from being biased to an unnecessary portion of the gate insulator film.

Here, the first ON-state resistivity of the channel of the transistor that includes the first gate semiconductor layer is smaller than that of the second ON state, and the second OFF-state resistivity of the channel is larger than that of the first OFF state. Thus, in the transistor (the second OFF state) including the GL1O, the channel silicon layer at the height of the insulator film layer 12 as well as the channel silicon layer on the sidewall are in the high resistance state. Similarly, in the transistor (second OFF state) including the GL3E, the channel silicon layer at the height of the insulator film layer 13 as well as the channel silicon layer on the sidewall are in the high resistance state. As a result, the current flowing from the word line 2 first flows through the channel silicon layer on the side surface of the second stacked structure and then flows into the channel silicon layer on the side surface of the first stacked structure via the phase-change material layer 7 at the height of the gate lines GL2O and GL2E. By using such a current path, it is possible to realize the set, reset, and read operations on the phase-change material layer 7 at the height of the gate polysilicon layer. As a result, the respective regions surrounded by dot lines in FIG. 4 function as memory cells.

<Summary of Select Operation in Z Direction>

In summary, portions of the channel silicon layers 88*p* and 89*p* on the left side (−X side) extending from the bit line 3 to the select cell SMC are in the low resistance state due to the gate and are electrically connected, whereas portions extending from the SMC to the diode layer PD as well as the sidewall of the insulator film 12 are in the high resistance state due to the gate and are electrically disconnected. Portions of the channel silicon layers 88*p* and 89*p* on the right side (+X side) extending from the bit line 3 to the select cell SMC as well as the sidewall of the insulator film 13 are electrically disconnected due to the gate, whereas portions extending from the SMC to the diode layer PD are in the low resistance state due to the gate and are electrically connected.

0 V is biased to the bit line BL, and 4 V, 3 V, and 2 V are biased to the word line WL during reset operation, set operation, and read operation, respectively. Due to voltage difference between the bit line BL and the word line WL, as illustrated in FIGS. 3 and 4, current flows through the channel silicon layer from the diode layer PD to the SMC on the +X side and flows through the channel silicon layer from the SMC to the bit line 3 on the −X side via the phase-change material layer 7 of the SMC. During the reset operation and the set operation, the operation is performed by changing the resistivity of the phase-change material 7 with the current flowing through the phase-change material layer 7 using the SMC. During the read operation, the operation is performed by determining the current value flowing through the phase-change material layer 7 using the SMC.

In this case, the select operation of the SMC includes the two methods described in FIGS. 3 and 4, and a twice-large amount of information can be stored in the same cell area. Thus, it is possible to reduce the effective cell area by ½.

<Select Operation in X and Y Directions>

Figure 5:
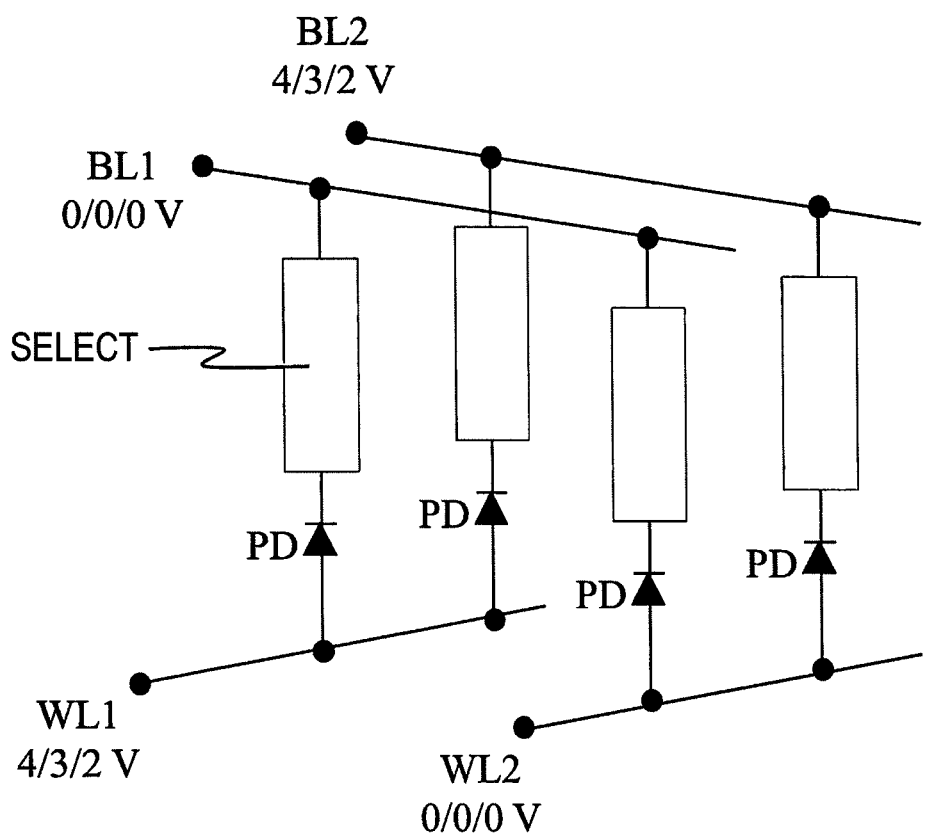
FIG. 5 is a diagram illustrating reset operation, set operation, and read operation of the semiconductor storage device according to the first embodiment of this invention.

FIG. 5 illustrates an equivalent circuit diagram of a memory array MA in which the vertical cells of FIGS. 3 and 4 are arranged in the XY directions and illustrates a voltage relation between the bit lines BL1 and BL2 and the word lines WL1 and WL2 when reset operation, set operation, and read operation are performed. Similarly to FIGS. 3 and 4, for example, the voltages 4/3/2 V of the WL1 are the voltages during the reset operation, the set operation, and the read operation, respectively. Similarly, the voltages of the other terminals of FIG. 5 indicate the voltages during the reset operation, the set operation, and the read operation, respectively. The vertical cells disposed at the intersections of the BL1 and WL1 are in the select state. Since a voltage is biased at the intersection of the BL1 and WL1 so that a forward bias is biased to the diode, a cell select operation can be performed by biasing such a voltage as illustrated in FIGS. 3 and 4 to the vertical cells.

Since the bit lines and the word lines at the intersection of the BL1 and WL2 and the intersection of the BL2 and WL1 are at the same voltage, no current flows. Since a reverse bias is biased to the diode PD at the intersection of the BL2 and WL2, no current flows. Thus, it is possible to select only the intersection of the BL1 and WL1 and to allow current to flow.

In summary, it is possible to select one intersection of the bit line and the word line to perform operation. Thus, it is possible to perform the select operation in the X and Y directions with the configuration of the present embodiment.

<Fabricating Process>

Figure 6:
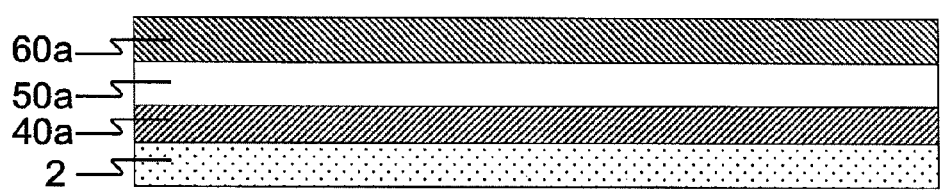
FIGS. 6(a) and 6(b) are partial cross-sectional views illustrating a method of fabricating the semiconductor storage device according to the first embodiment of this invention.
Figure 6:
Figure 6:
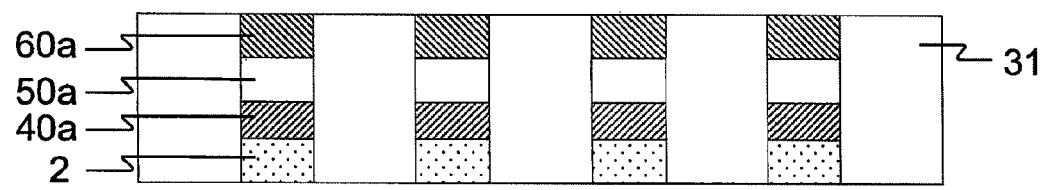
Figure 6:
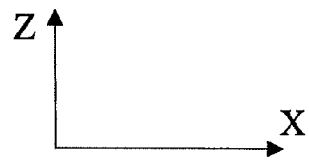

By referring to FIGS. 6(*a*) to 29, a method of fabricating the semiconductor storage device according to the first embodiment of this invention will be described. As illustrated in FIG. 6(*a*), a tungsten film layer 2 serving as a word line, an amorphous silicon layer 40*a* doped with p-type impurities, an amorphous silicon layer 50*a* doped with low-concentration impurities, and an amorphous silicon layer 60*a* doped with n-type impurities are deposited in that order on a semiconductor substrate 1, in which a peripheral circuit and a word line contact WLC are formed, with an interpoly dielectric film.

Subsequently, as illustrated in FIG. 6(b), after the deposited films are patterned in a stripe form extending in the word line direction, the spaces are buried with an insulator film 31, an upper portion of the insulator film 31 is removed and flattened according to a CMP method to expose the upper surface of the amorphous silicon layer 60a. Since the amorphous silicon layers 40a, 50a, 61a, and 62a and the word line are collectively patterned in a self-aligned manner at the time of pattering, misalignment between the word line and each layer of the amorphous silicon pillars does not occur, and the reliability of a memory programming/erasing operation can be improved.

Figure 7:
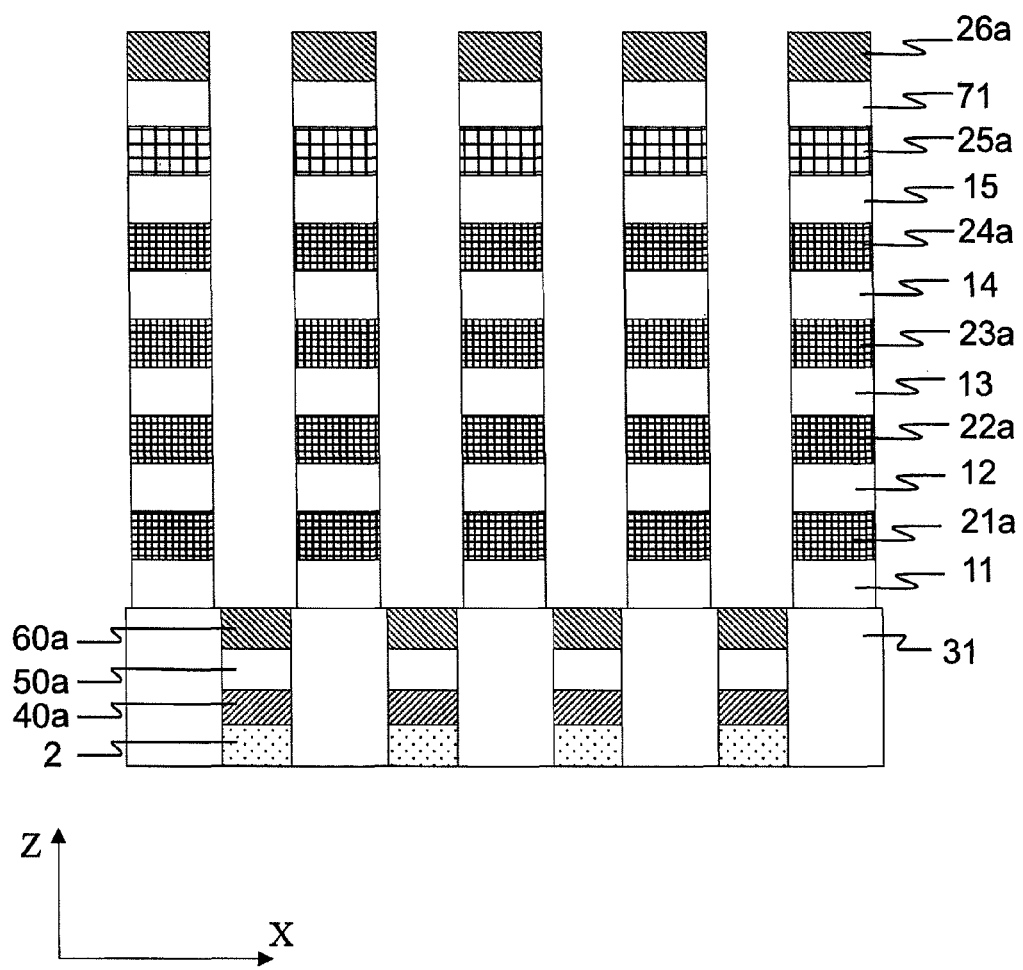
FIG. 7 is a partial cross-sectional view illustrating a method of fabricating the semiconductor storage device according to the first embodiment of this invention.

Subsequently, an insulator film layer 11, an amorphous silicon layer 21a, an insulator film layer 12, an amorphous silicon layer 22a, an insulator film layer 13, an amorphous silicon layer 23a, an insulator film layer 14, an amorphous silicon layer 24a, an insulator film layer 15, an amorphous silicon layer 25a, an insulator film layer 71, and an amorphous silicon layer 26a are deposited sequentially. The amorphous silicon layers 21a to 26a are doped with phosphorous (P), for example. After that, the deposited stacked film is patterned in a stripe form parallel to the extension direction of the word line 2 so that the space portion of the stripes of the stacked film including the insulator film layer 11, the amorphous silicon layer 21a, the insulator film layer 12, the amorphous silicon layer 22a, the insulator film layer 13, the amorphous silicon layer 23a, the insulator film layer 14, the amorphous silicon layer 24a, the insulator film layer 15, the amorphous silicon layer 25a, the insulator film layer 71, and the amorphous silicon layer 26a is formed immediately above the word line 2. As a result, the cross-sectional view as illustrated in FIG. 7 is obtained.

Figure 8:
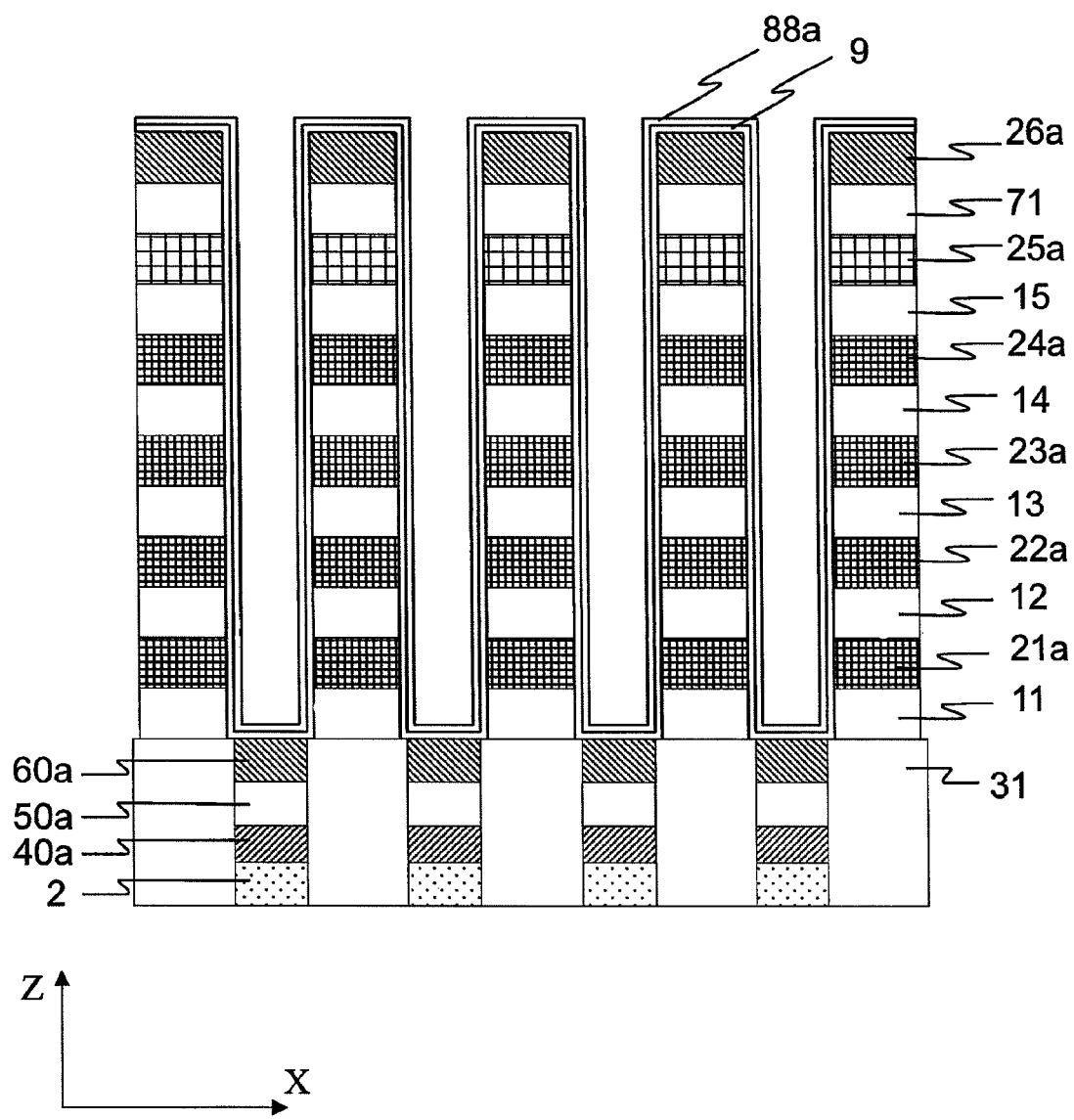
FIG. 8 is a partial cross-sectional view illustrating a method of fabricating the semiconductor storage device according to the first embodiment of this invention.

Subsequently, an insulator film 9 and an amorphous silicon layer 88a are sequentially deposited so as not to completely bury the formed spaces. As a result, the cross-sectional view as illustrated in FIG. 8 is obtained.

Figure 9:
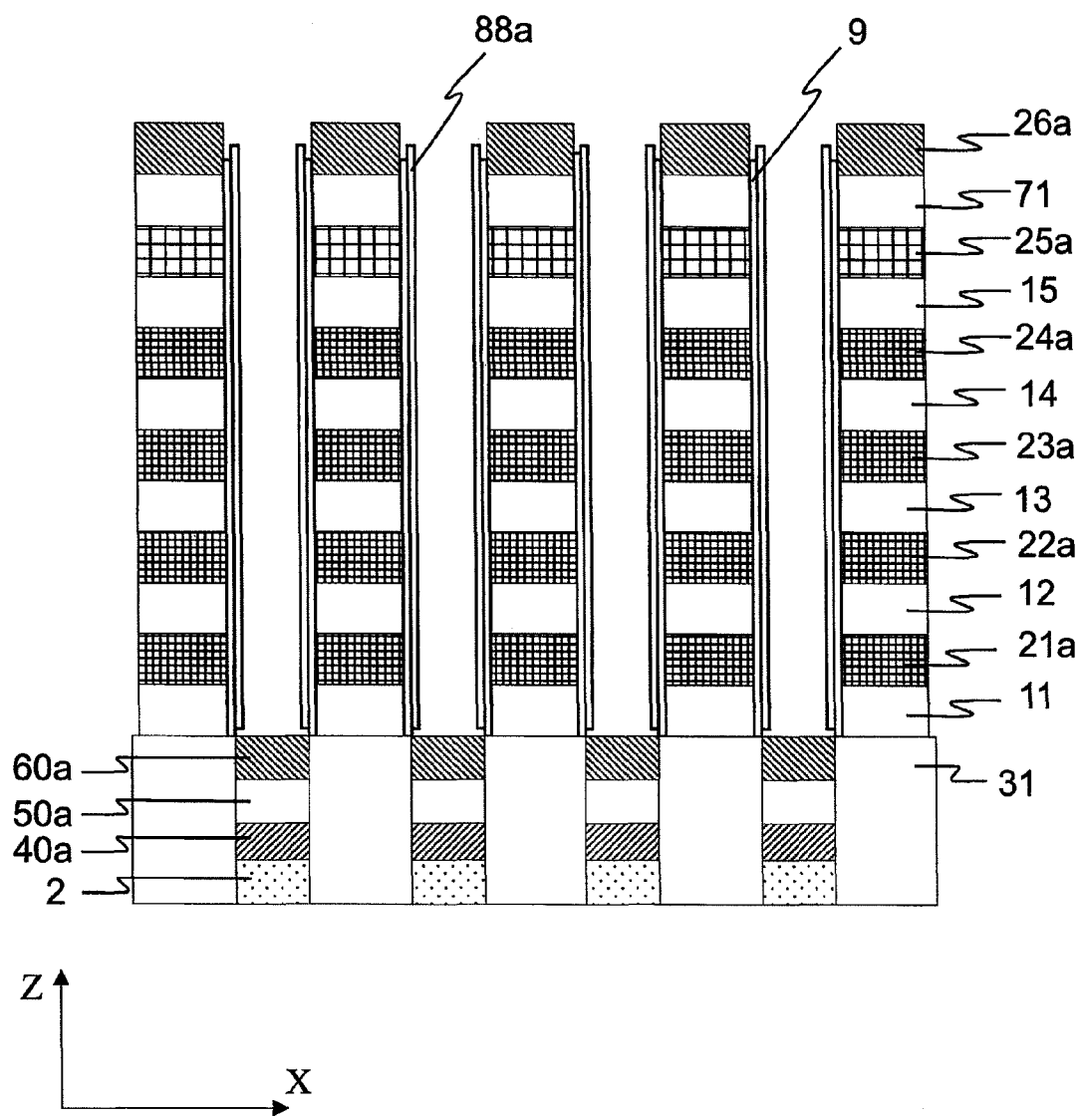
FIG. 9 is a partial cross-sectional view illustrating a method of fabricating the semiconductor storage device according to the first embodiment of this invention.

After that, the uppermost surface of the amorphous silicon 88a and a portion of the amorphous silicon 88a deposited on the amorphous silicon 60a with the insulator film 9 interposed are removed by etch-back. Subsequently, the insulator film 9 on the amorphous silicon 60a exposed by the etch-back is partially removed by etch-back. As a result, the cross-sectional view as illustrated in FIG. 9 is obtained.

Figure 10:
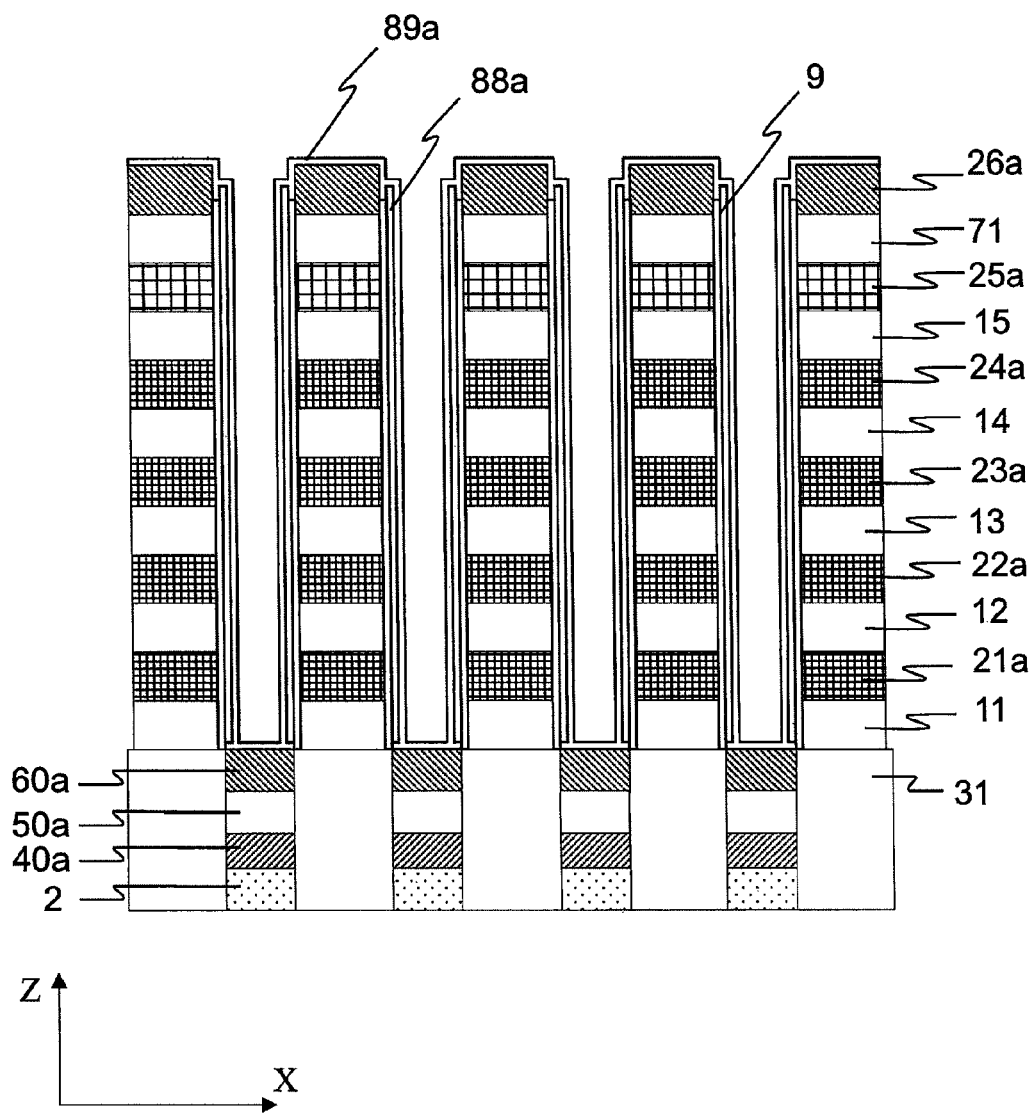
FIG. 10 is a partial cross-sectional view illustrating a method of fabricating the semiconductor storage device according to the first embodiment of this invention.

Subsequently, an amorphous silicon layer 89a is deposited so as not to completely bury the spaces as illustrated in FIG. 10. Subsequently, after, a dummy insulator film 51 is deposited so as to completely bury the spaces, the upper portions of the amorphous silicons 88a and 89a are doped with impurities (for example, arsenic (As) or phosphorous (P)) of the same conductivity type as the amorphous silicon 60a by ion implantation. The doped amorphous silicons 88a and 89a become amorphous silicons 98a and 99a.

Figure 11:
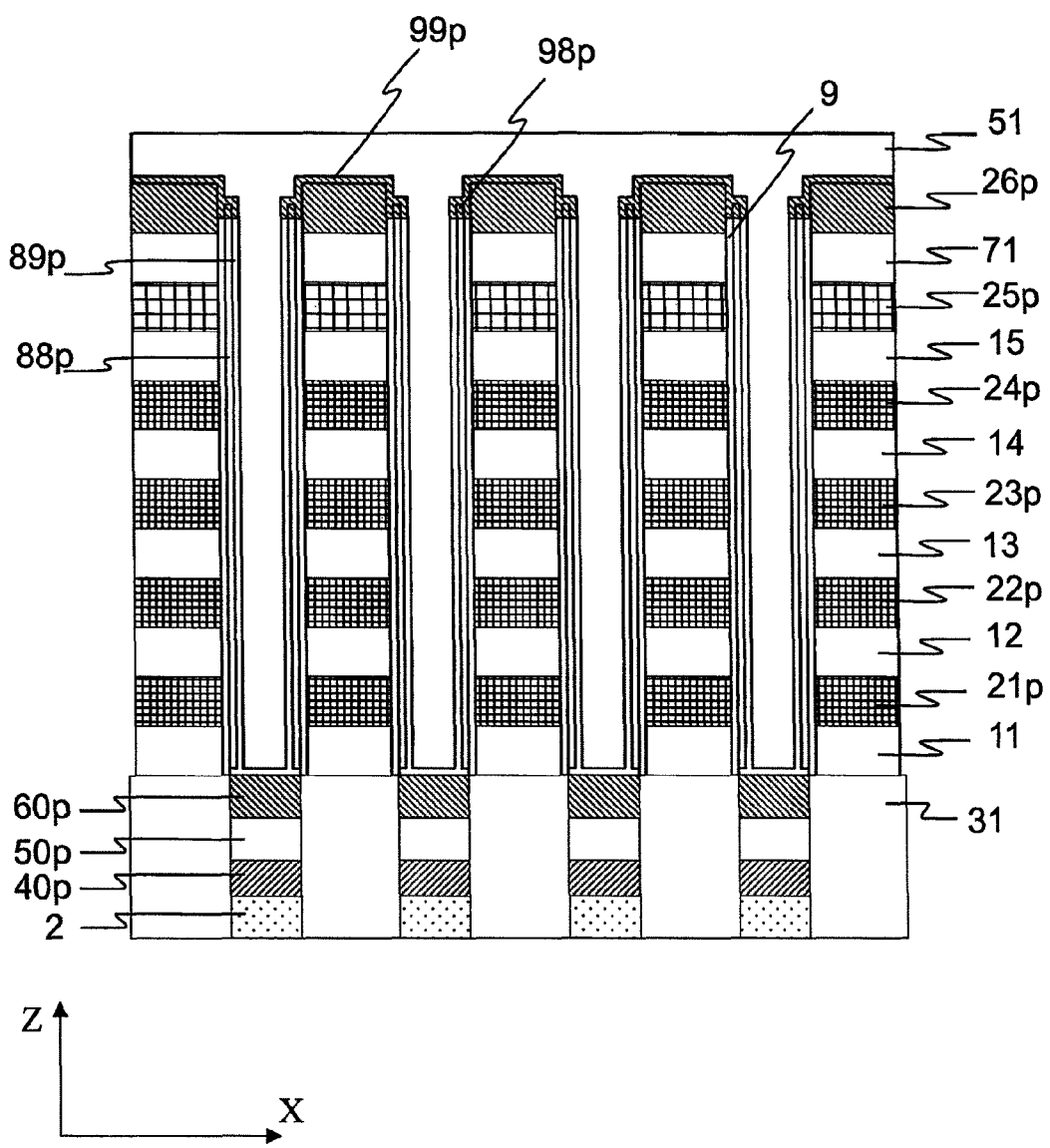
FIG. 11 is a partial cross-sectional view illustrating a method of fabricating the semiconductor storage device according to the first embodiment of this invention.
Figure 12:
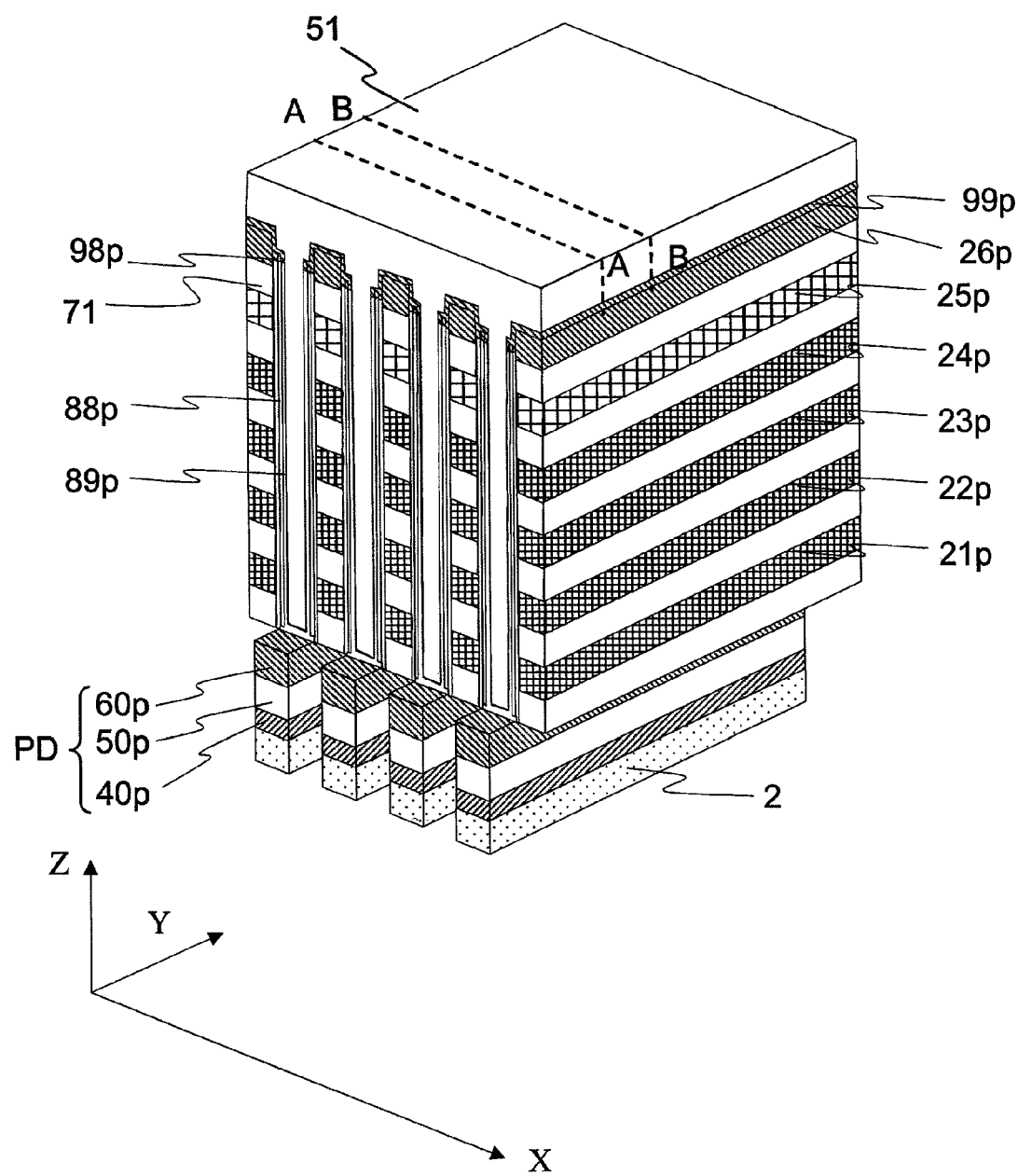
FIG. 12 is a partial 3-dimensional schematic view illustrating a method of fabricating the semiconductor storage device according to the first embodiment of this invention.

Subsequently, annealing is performed so that the amorphous silicon layers 40a, 50a, 60a, 88a, 89a, 98a, 99a, 21a, 22a, 23a, 24a, 25a, and 26a are crystallized and impurities contained in these amorphous silicon layers are activated. The amorphous silicon layers 40a, 50a, 60a, 88a, 89a, 98a, 99a, 21a, 22a, 23a, 24a, 25a, and 26a become polysilicon layers 40p, 50p, 60p, 88p, 89p, 98p, 99p, 21p, 22p, 23p, 24p, 25p, and 26p, respectively, and the cross-sectional view as illustrated in FIG. 11 is obtained. Moreover, the 3-dimensional schematic view corresponding to FIG. 11 is as illustrated in FIG. 12. The insulator film 31 in FIG. 11 is not depicted in FIG. 12 for the sake of simplicity. The following fabricating processes will be described with reference to the 3-dimensional schematic view, the A-A cross-section, and the B-B cross-section.

Figure 13:
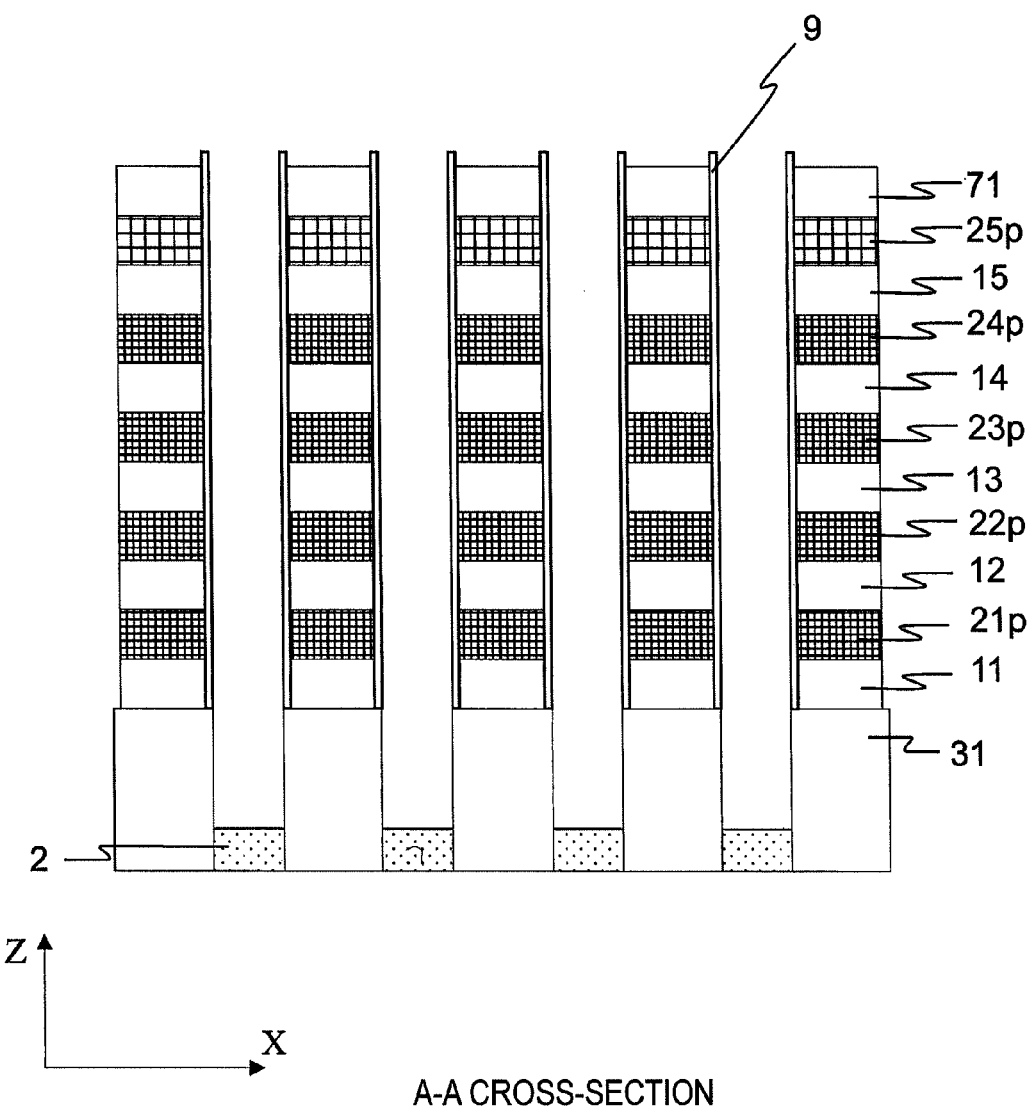
FIG. 13 is a partial cross-sectional view illustrating a method of fabricating the semiconductor storage device according to the first embodiment of this invention.

Subsequently, the n-type polysilicon layers 98p and 99p, the dummy insulator film layer 51, the channel polysilicon layers 88p and 89p, and the polysilicon layers 60p, 50p, and 40p are patterned in a stripe form extending in the direction perpendicular to the word line 2. During the processing, although the stacked film of the gate polysilicon layers 21p, 22p, 23p, 24p, and 25p and the insulator film layers 11, 12, 13, 14, 15, and 71 and the gate insulator film layer 9 in the portion corresponding to the A-A cross-section of FIG. 2 remain unprocessed as illustrated in FIG. 11, the channel polysilicon layers 88p, 89p, 98p, 99p, and 26p are removed (FIG. 13). Further, the polysilicon diode PD on the word line 2 in the A-A cross-section is also removed simultaneously with the patterning of the stripe form. Although the pattern of the polysilicons 40p, 50p, and 60p has a stripe form extending in the direction of the word line 2 before processing, the pattern is processed so that the pattern remains at the intersections of the word lines and the bit lines by the step of FIG. 13. In the portion corresponding to the B-B cross-section of FIG. 2, since the processing of the step of FIG. 13 is not performed, the portion has the shape as illustrated in FIG. 11. With this step, the 3-dimensional schematic view as illustrated in FIG. 14 is obtained.

Figure 14:
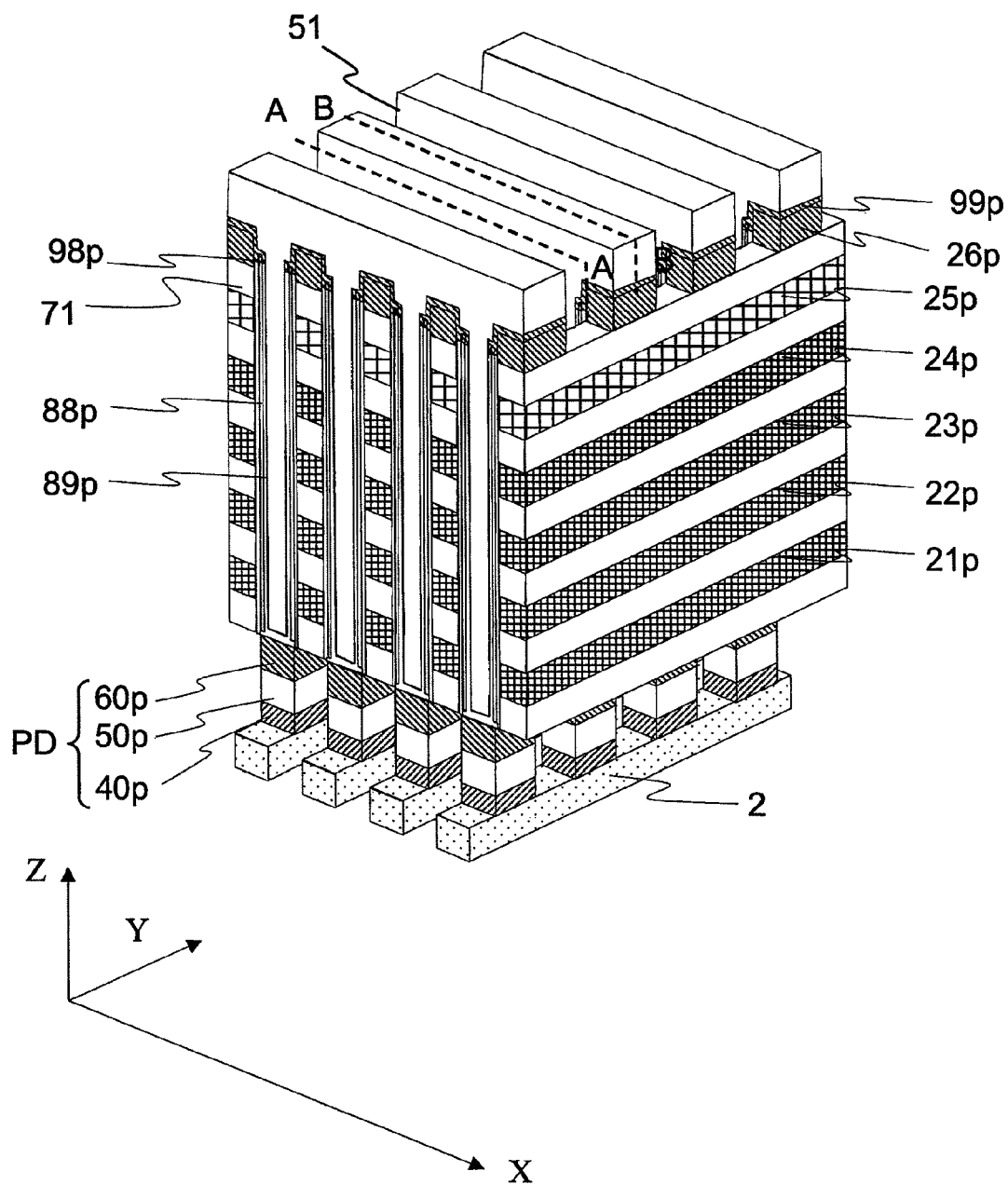
FIG. 14 is a partial 3-dimensional schematic view illustrating a method of fabricating the semiconductor storage device according to the first embodiment of this invention.
Figure 15:
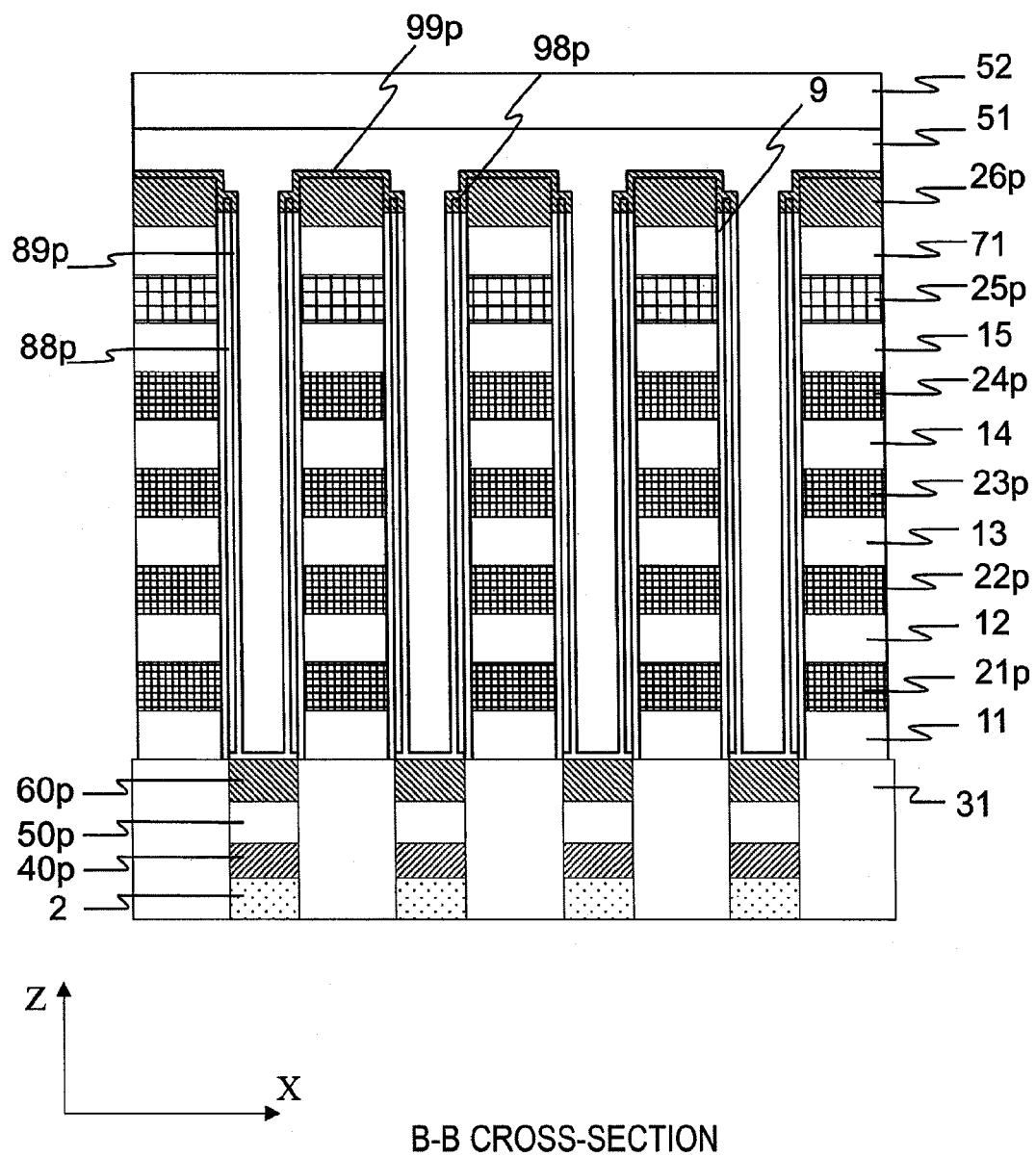
FIG. 15 is a partial cross-sectional view illustrating a method of fabricating the semiconductor storage device according to the first embodiment of this invention.
Figure 16:
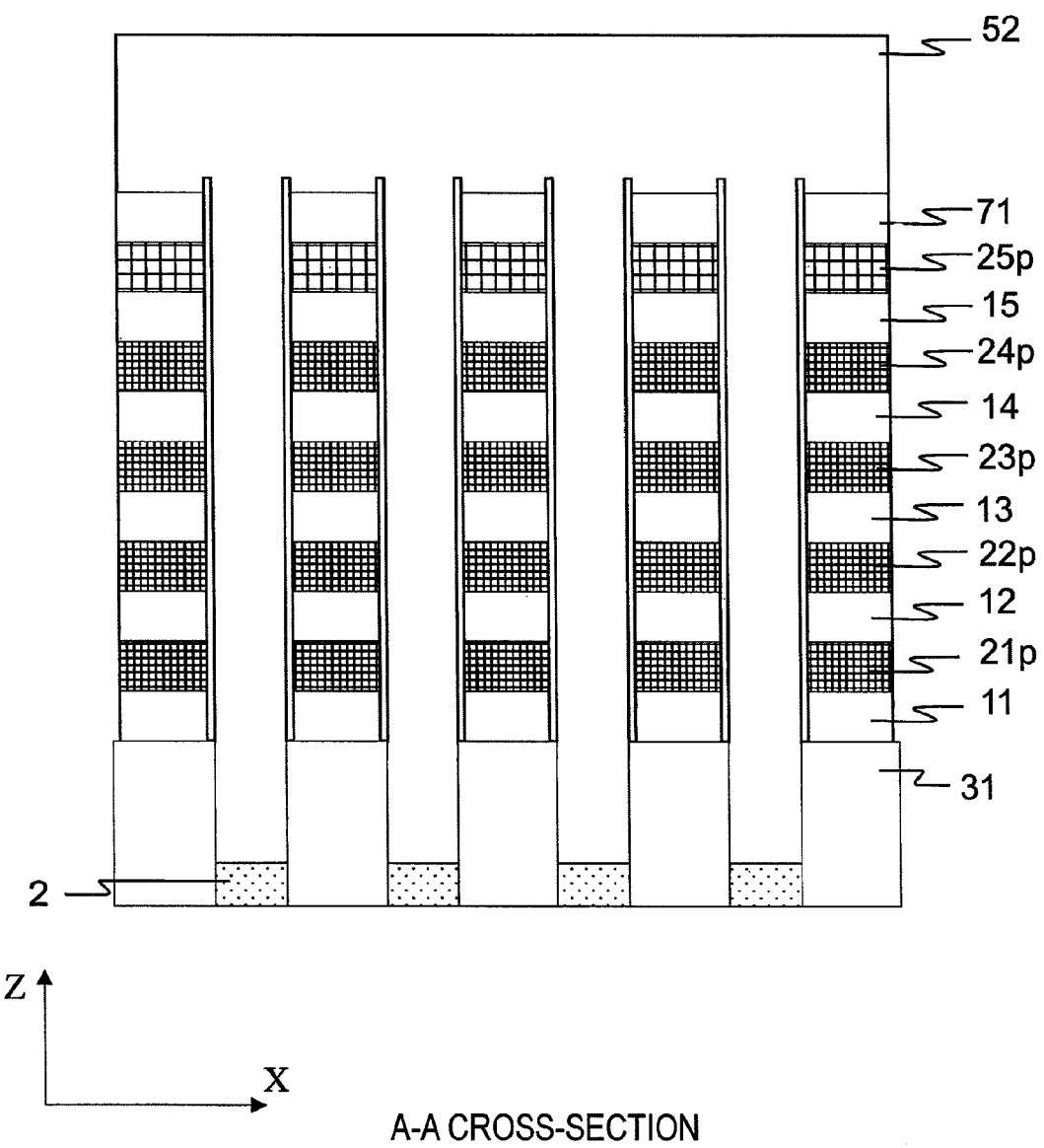
FIG. 16 is a partial cross-sectional view illustrating a method of fabricating the semiconductor storage device according to the first embodiment of this invention.
Figure 17:
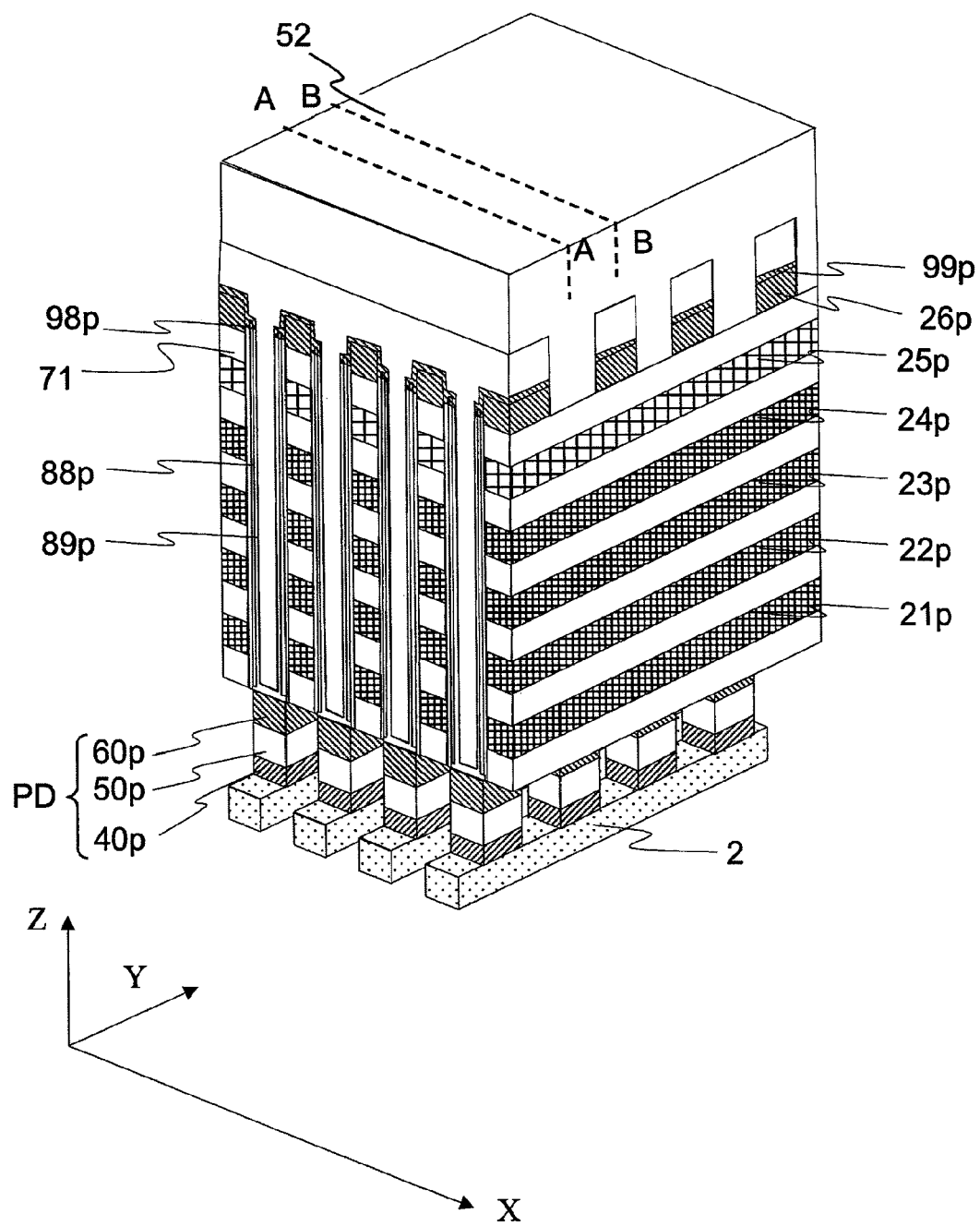
FIG. 17 is a partial 3-dimensional schematic view illustrating a method of fabricating the semiconductor storage device according to the first embodiment of this invention.

Subsequently, the insulator film 52 is deposited so that the spaces processed in FIGS. 13 and 14 are buried. As a result, the B-B cross-section as illustrated in FIG. 15 is obtained, and the A-A cross-section as illustrated in FIG. 16 is obtained. The 3-dimensional schematic view as illustrated in FIG. 17 is obtained.

Figure 18:
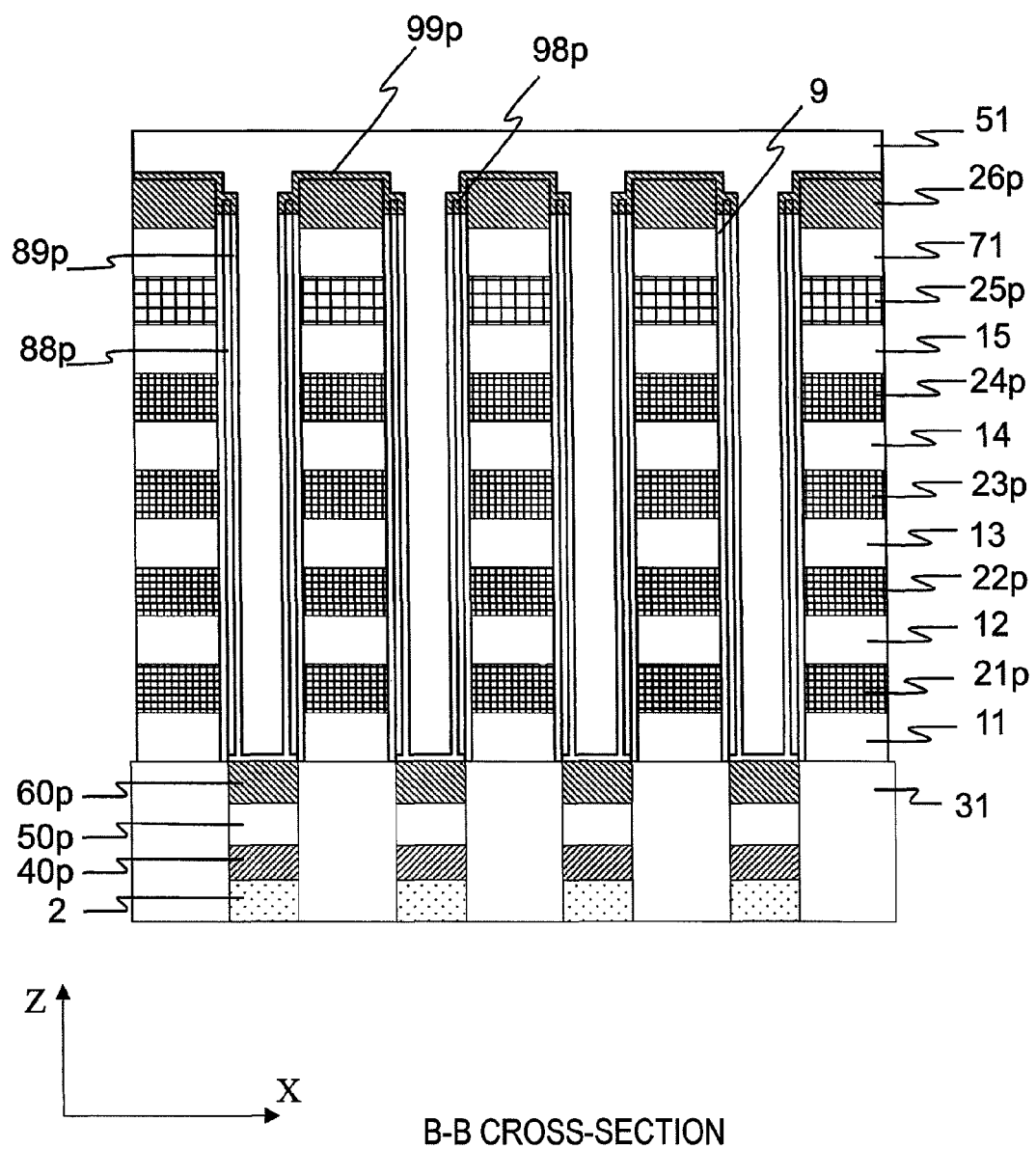
FIG. 18 is a partial cross-sectional view illustrating a method of fabricating the semiconductor storage device according to the first embodiment of this invention.
Figure 19:
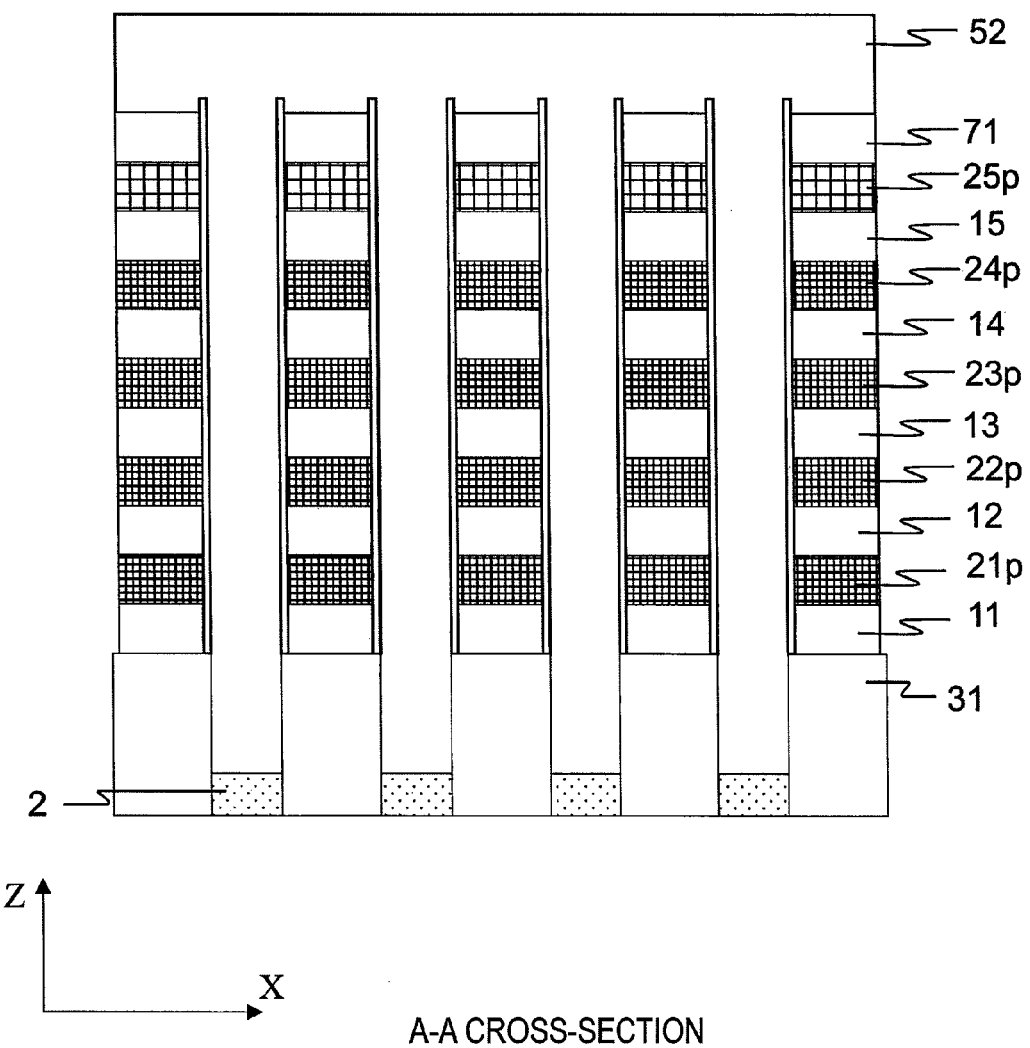
FIG. 19 is a partial cross-sectional view illustrating a method of fabricating the semiconductor storage device advancing to the first embodiment of this invention.

Subsequently, a portion of the insulator film 52 is removed by CMP or etch-back so that the surface of the dummy insulator film 51 is exposed. As a result, the cross-sectional views of FIGS. 15 and 16 and the 3-dimensional schematic view of FIG. 17 are changed to those of FIGS. 18, 19, and 20, respectively.

Figure 20:
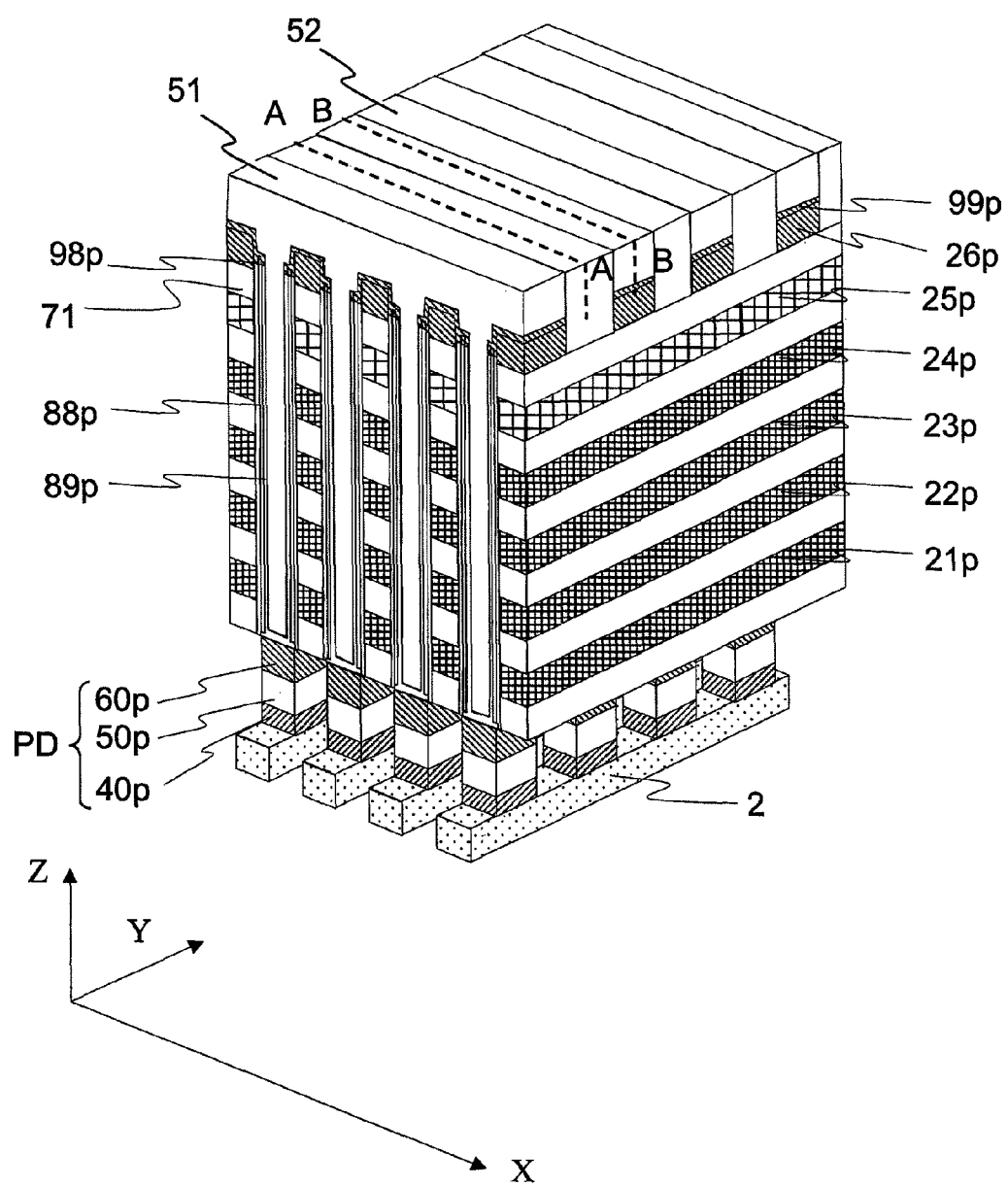
FIG. 20 is a partial 3-dimensional schematic view illustrating a method of fabricating the semiconductor storage device according to the first embodiment of this invention.
Figure 21:
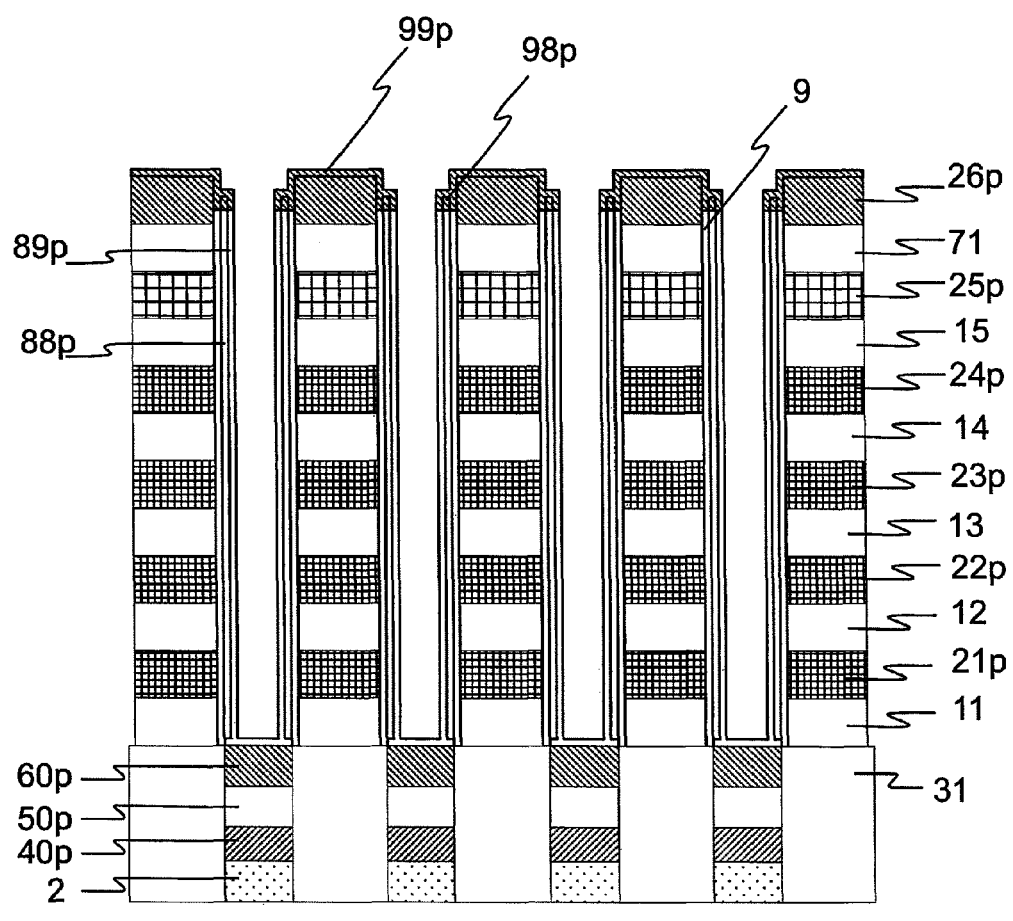
FIG. 21 is a partial cross-sectional view illustrating a method of fabricating the semiconductor storage device according to the first embodiment of this invention.
Figure 22:
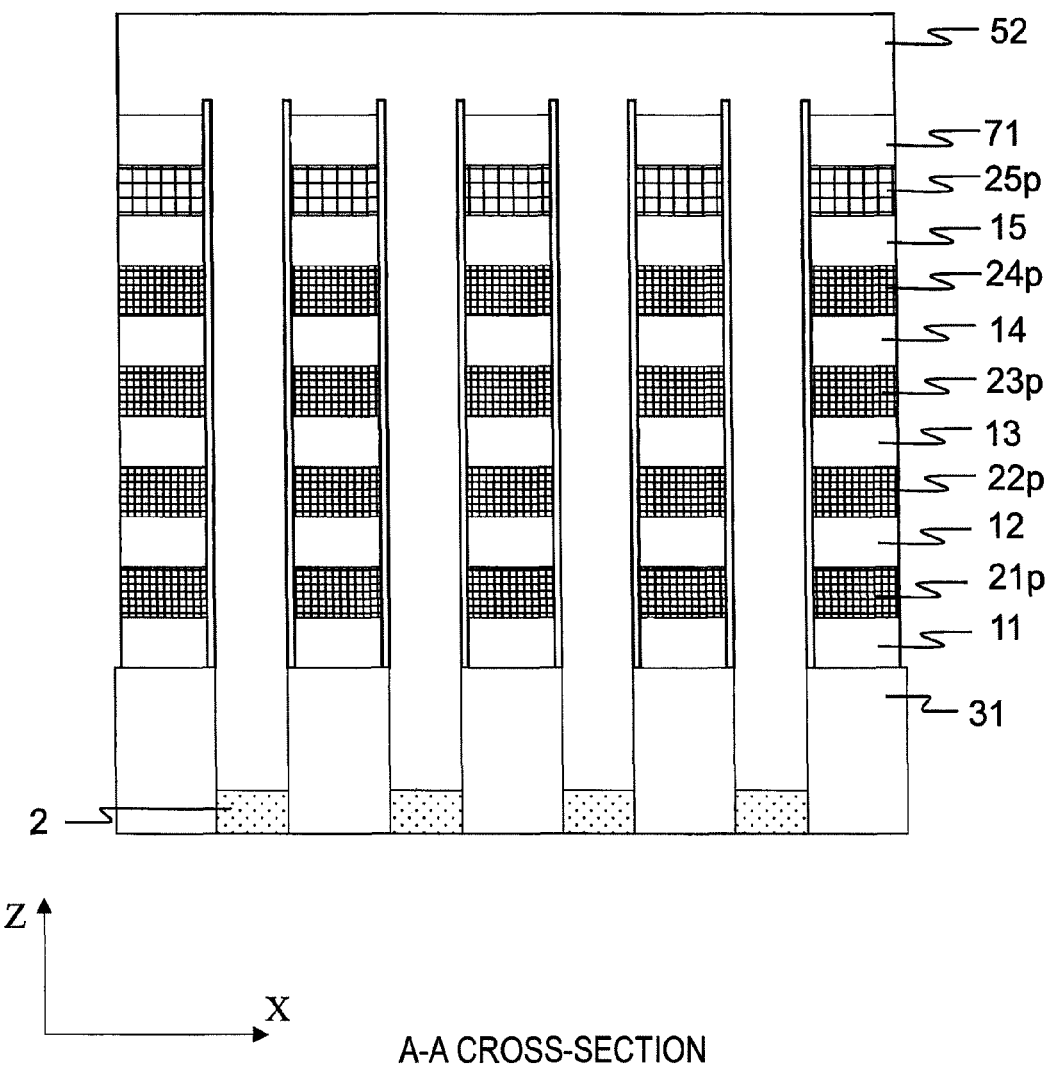
FIG. 22 is a partial cross-sectional view illustrating a method of fabricating the semiconductor storage device according to the first embodiment of this invention.

Subsequently, the dummy insulator film 51 is removed by wet-etching, for example. Here, although both the dummy insulator film 51 and the insulator film 52 are exposed before wet-etching, by changing a formation method such that the dummy insulator film 51 is formed of a SOG film in advance and the insulator film 52 is formed by CVD, the dummy insulator film 51 only can be selectively removed during the wet-etching. As a result, the cross-sectional views of FIGS. 18 and 19 and the 3-dimensional schematic view of FIG. 20 are changed to those of FIGS. 21, 22, and 23, respectively.

Figure 23:
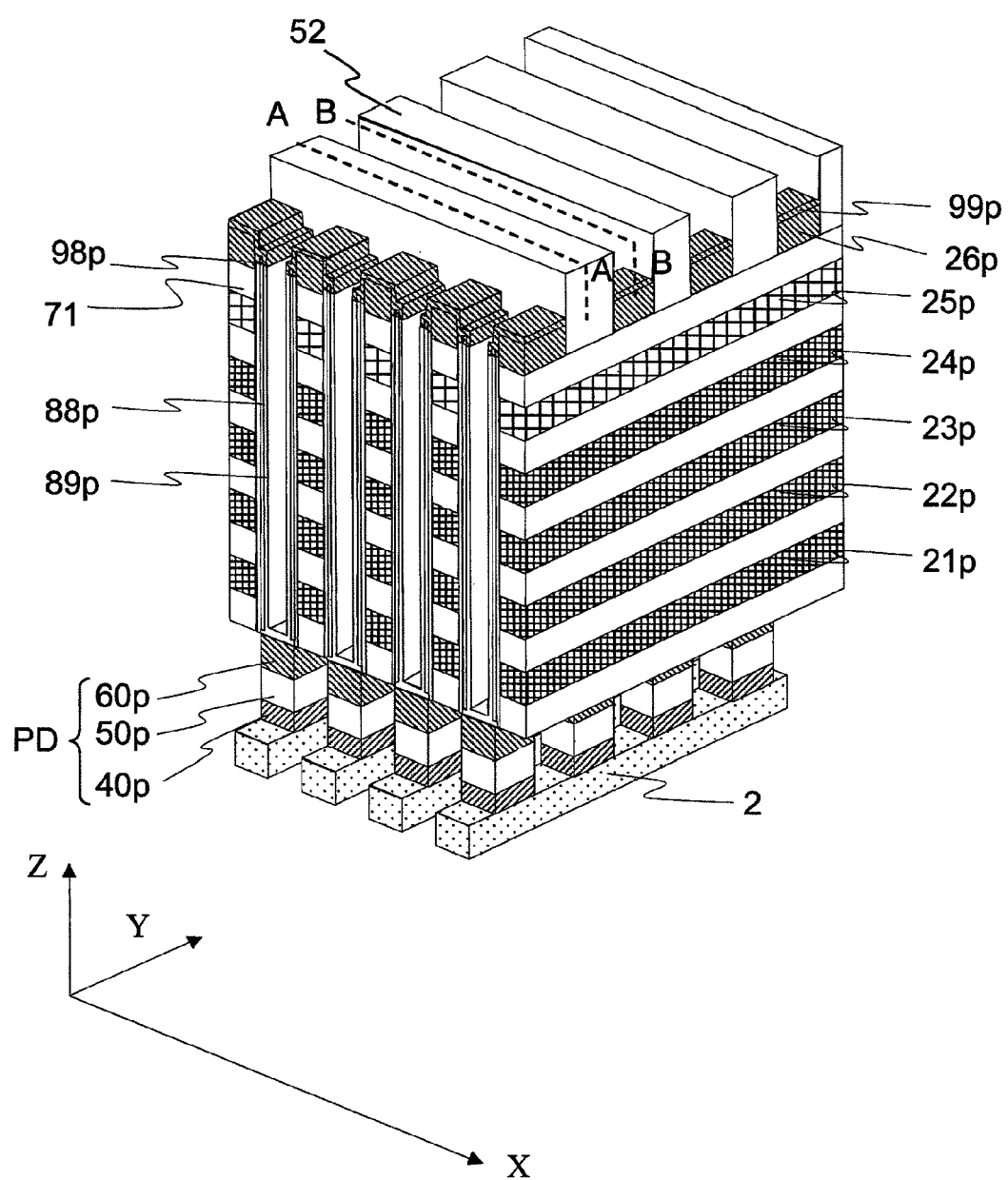
FIG. 23 is a partial 3-dimensional schematic view illustrating a method of fabricating the semiconductor storage device according to the first embodiment of this invention.
Figure 24:
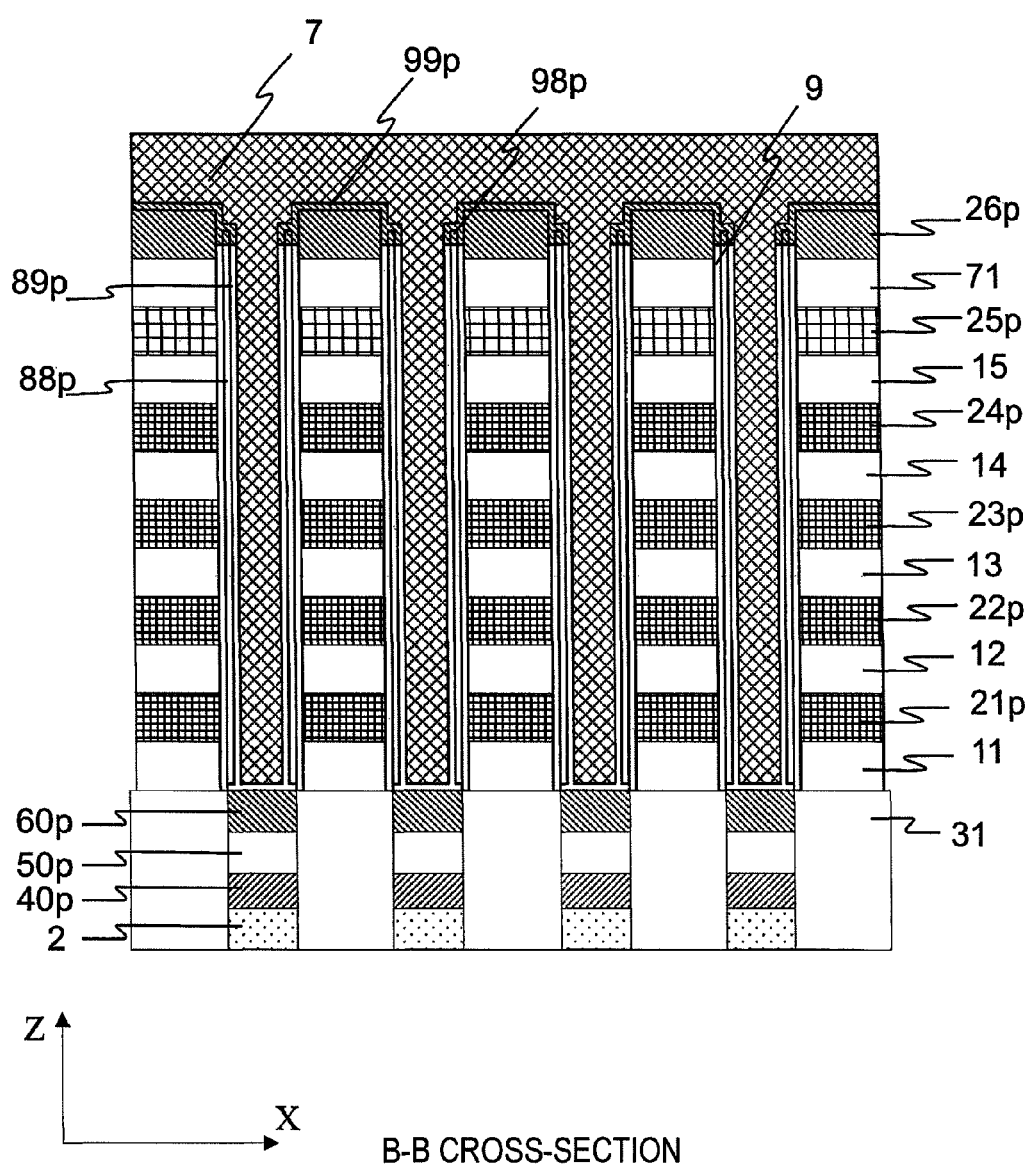
FIG. 24 is a partial cross-sectional view illustrating a method of fabricating the semiconductor storage device according to the first embodiment of this invention.
Figure 25:
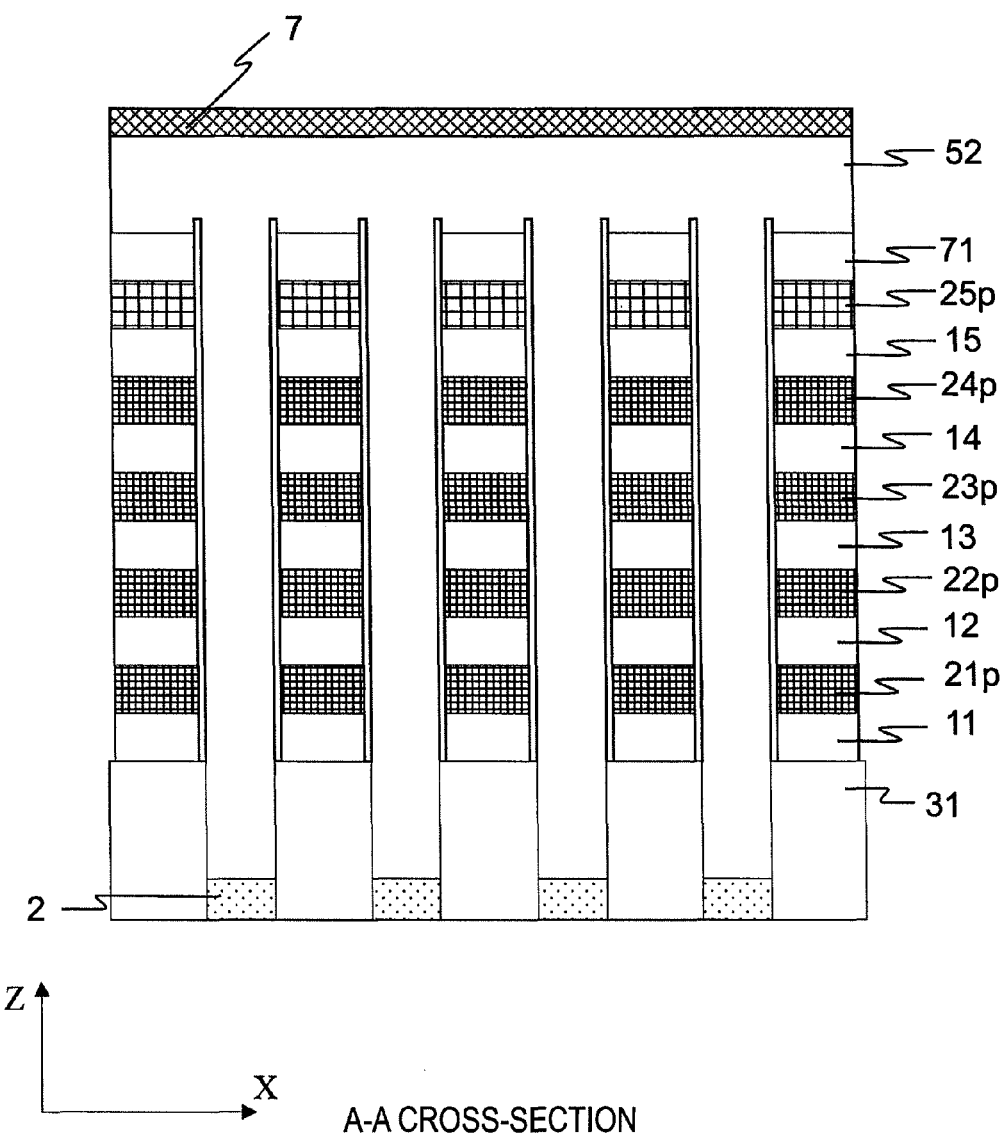
FIG. 25 is a partial cross-sectional view illustrating a method of fabricating the semiconductor storage device according to the first embodiment of this invention.
Figure 26:
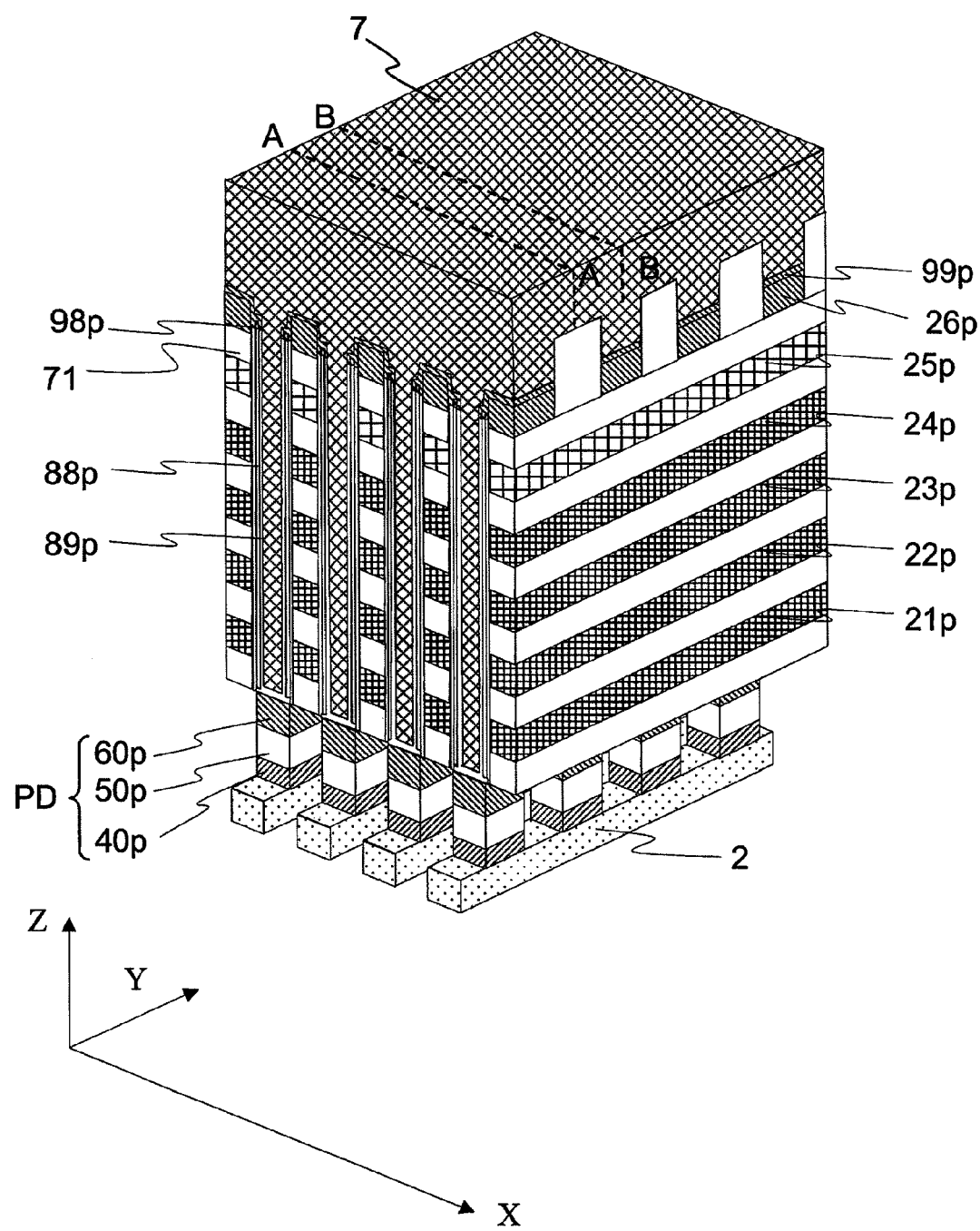
FIG. 26 is a partial 3-dimensional schematic view illustrating a method of fabricating the semiconductor storage device according to the first embodiment of this invention.

Subsequently, the phase-change material layer 7 is deposited. As a result, the cross-sectional views of FIGS. 21 and 22 and the 3-dimensional schematic view of FIG. 23 are changed to those of FIGS. 24, 25, and 26, respectively. Although in this example, the phase-change materials are completely buried in the groove as illustrated in FIGS. 24 and 26, the phase-change material layer may be deposited so that the phase-change materials are not completely buried but the insulator film 91 is completely buried in the remaining spaces, which will be described later. This method will be described later.

Subsequently, etch-back is performed so that the height of the uppermost surface of the phase-change material layer 7 is lower than the height of the uppermost layer of the insulator film layer 15 and is higher than the height of the lowermost layer of the insulator film layer 15. The reason why the height of the uppermost surface of the phase-change material layer 7 is set to be lower than the height of the uppermost layer of the insulator film layer 15 is to prevent current from flowing to the source and the drain through the phase-change material layer 7 when a gate of the gate polysilicon layer 25p is in OFF state. Moreover, the reason why the height of the uppermost surface of the phase-change material layer 7 is set to be higher than the height of the lowermost layer of the insulator film layer 15 is to form the memory cells at the height of the insulator film layer 15. As a result, the cross-sectional views of FIGS. 24 and 25 are changed to those of FIGS. 27 and 28, respectively.

Figure 27:
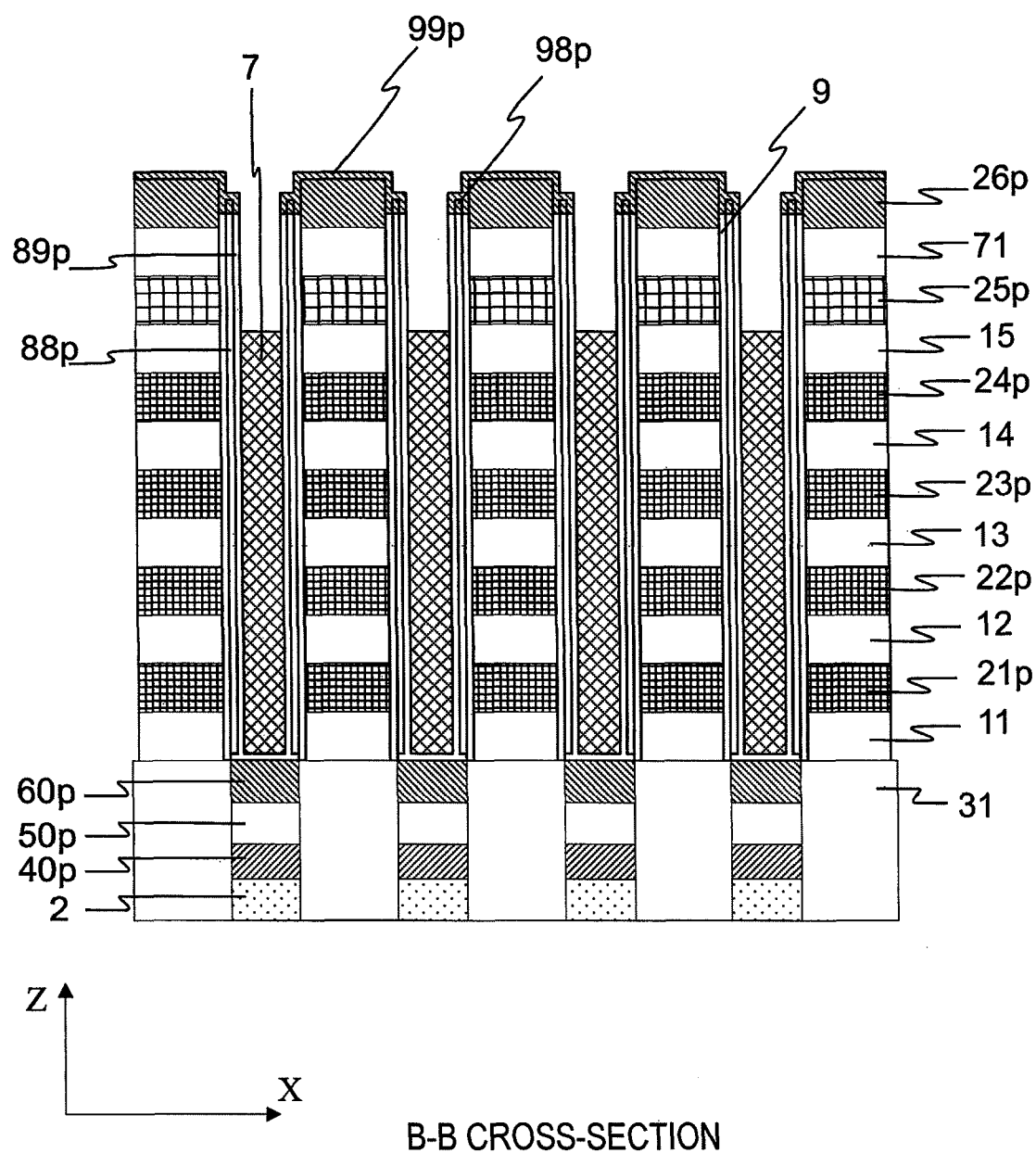
FIG. 27 is a partial cross-sectional view illustrating a method of fabricating the semiconductor storage device according to the first embodiment of this invention.
Figure 28:
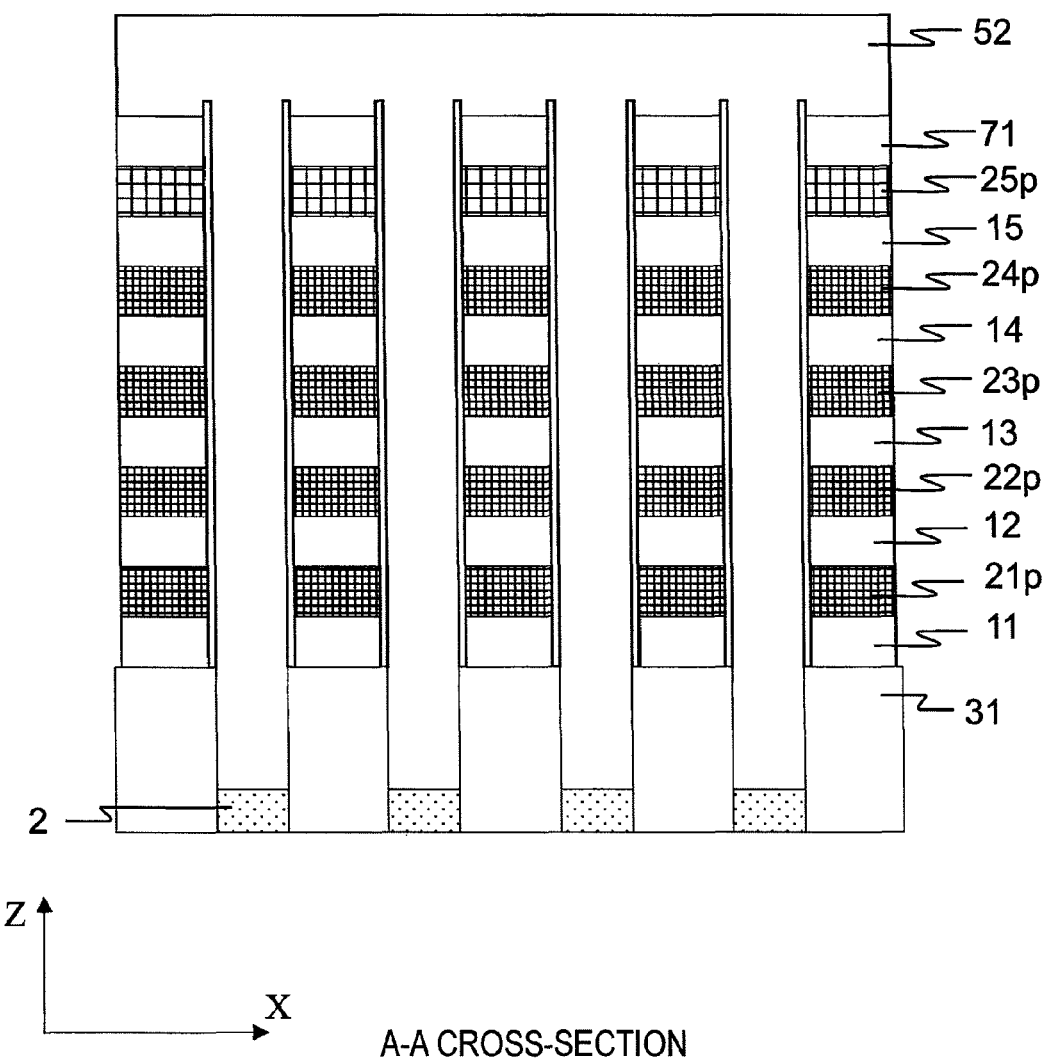
FIG. 28 is a partial cross-sectional view illustrating a method of fabricating the semiconductor storage device according to the first embodiment of this invention.
Figure 29:
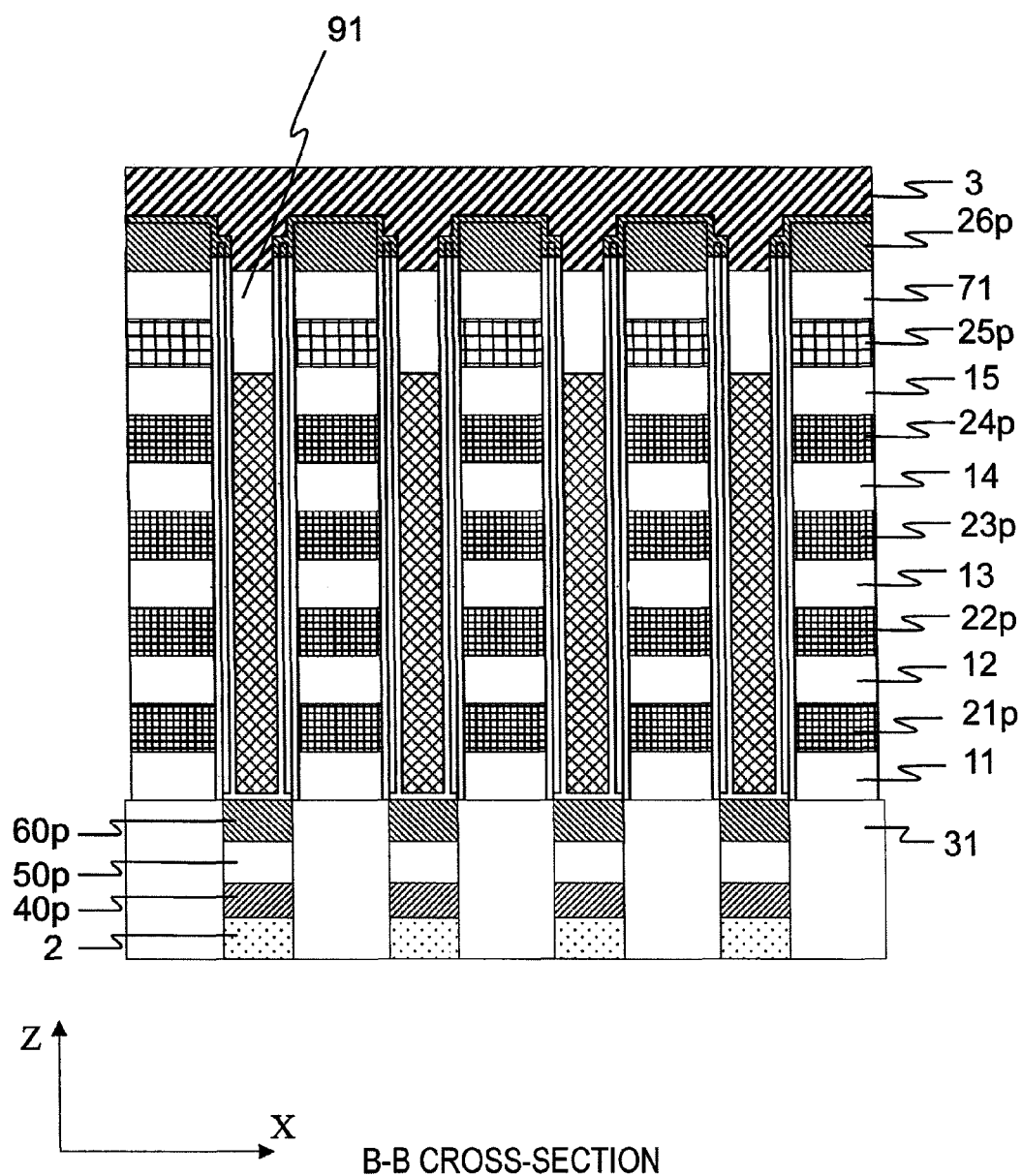
FIG. 29 is a partial cross-sectional view illustrating a method of fabricating the semiconductor storage device according to the first embodiment of this invention.
Figure 30:
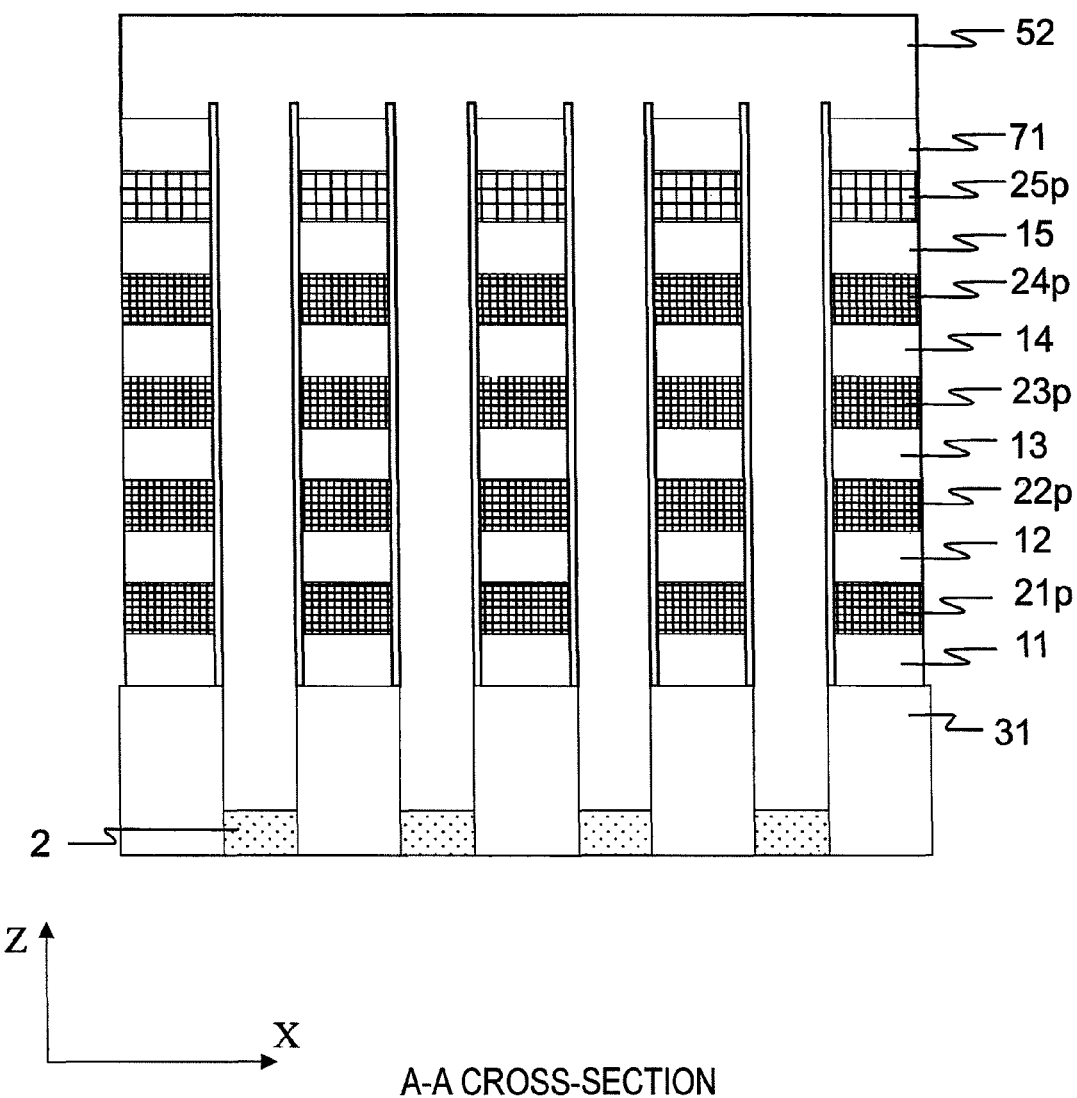
FIG. 30 is a partial cross-sectional view illustrating a method of fabricating the semiconductor storage device according to the first embodiment of this invention.

Subsequently, the insulator film layer 92 is buried, and the uppermost surface of the polysilicon layer 99p is exposed by wet-etching. After that, the BLC of FIGS. 1 and 2 (that is, the contact BLC that connects the bit line 3 and the peripheral circuit formed in the semiconductor substrate) is formed. After that, the material of the bit line 3 is deposited, and the bit line material on the insulator film 52 is removed by CMP. As a result, the cross-sectional views of FIGS. 27 and 28 are changed to those of FIGS. 29 and 30, respectively. Although in this example, the bit line is patterned by removing the bit line material on the insulator film 52 by CMP, the bit line may naturally be patterned by dry etching using a photo resist pattern as a mask.

Here, the present fabricating method is characterized in that the method includes (h) a step of filling a conductive material in the regions between the respective insulator films 52 formed in advance to form the bit line 3 extending in the X direction. This step is a so-called damascene process and enables the bit lines 3 and the insulator film 52 disposed therebetween to be formed in a self-aligned manner. Thus, this step provides an effect that a lithography step for patterning is not necessary as compared to a step of stacking a conductive layer and then performing patterning and that a fluctuation of a bit line resistance due to irregularity during formation of the bit lines 3 can be reduced. After that, the gate polysilicons at the end of the memory array are patterned so that contacts to the respective layers can be formed as illustrated in FIG. 2, and the entire portion patterned in the stripe form is buried with an interpoly dielectric film. The contacts GC1O, GC2O, GC3O, GC4O, GC1E, GC2E, GC3E, and GC4E reaching the gate polysilicon layers 21p, 22p, 23p, and 24p, the contacts STGCO, and STGCE reaching the gate polysilicon layer 25p, the gate signal lines GL1O, GL2O, GL3O, GL4O, GL1E, GL2E, GL3E, GL4E, STGLO, and STGLE, and contacts for connecting the gate signal lines and the peripheral circuit are formed to form a semiconductor storage device.

In summary, the method of fabricating the semiconductor storage device according to the present embodiment is characterized in that the method includes: (a) a step of forming a plurality of stacked structures in which a plurality of first insulating layers (11 to 15) and a plurality of gate semiconductor layers (21a to 24a) are alternately stacked above a semiconductor substrate and which extends in the Y direction (FIGS. 6(a) to 7); (b) a step of forming a plurality of gate insulating layers (9) along the side surfaces of each of the plurality of stacked structures (FIG. 9); (c) a step of forming a plurality of channel layers (88p and 89p) along the side surfaces of each of the plurality of gate insulating layers (FIG. 10); (d) a step of forming a plurality of second insulating layers (dummy insulator films 51) and a plurality of third insulating layers (insulator films 52) between the plurality of channel layers so as to extend in the X direction and be provided alternately in the Y direction (FIGS. 11 to 20); (e) a step of selectively removing the plurality of second insulating layers from the plurality of second insulating layers and the plurality of third insulating layers (FIGS. 21 to 23); and (f) a step of forming a plurality of resistance-change material layers along a region of the side surfaces of each of the plurality of channel layers in which the second insulating layer is removed (FIGS. 24 to 28).

When the characteristics of the invention according to the present embodiment are focused on the semiconductor storage device fabricated according to the fabricating method, the semiconductor storage device is characterized in that the apparatus includes: a plurality of stacked structures in which a plurality of first insulator film layers (11 to 15) and a plurality of first gate semiconductor layers (21a to 24a) extending in the Y direction when X and Y directions are defined as being orthogonal to each other in parallel to a main surface of a semiconductor substrate are alternately stacked and which are periodically formed in the X direction; a plurality of first gate insulator film layers (9) provided on the side surfaces in the X direction of each of the plurality of stacked structures; a plurality of first channel layers (88p and 89p) which is formed on a side of the side surface in the X direction of each of the plurality of first gate insulator film layers where the stacked structure is not formed and which is periodically formed in the Y direction; and a plurality of resistance-change material layers (7) which is periodically formed in the Y direction between the two adjacent stacked structures of the plurality of stacked structures and is electrically connected to the two adjacent channel layers of the plurality of first channel layers and which is formed from a material of which the resistivity changes with a current flowing therein.

Due to such characteristics, since it is possible to form the resistance-change material layers (step (f)) after the step (steps (a) and (d)) of patterning the respective layers in the stripe form, it is not necessary to perform such a very difficult step that processes the resistance-change materials and the silicons at the same time and it is possible to provide the memory cell array with a simpler process.

Further, due to the structure and fabricating method, it is possible to realize a memory array in which the wire width and the space portion of the stripe form in both X and Y directions have the minimum feature size F.

That is, the semiconductor storage device according to the present embodiment is further characterized in that the width in the X direction of the plurality of first insulator film layers and the plurality of first gate semiconductor layers is the same as the interval in the X direction of the plurality of stacked structures and the width in the Y direction of the plurality of first channel layers is the same as the interval in the Y direction of the plurality of first channel layers. More specifically, the semiconductor storage device is further characterized in that the width in the X direction of the plurality of first insulator film layers and the plurality of first gate semiconductor layers and the width in the Y direction of the plurality of channel layers are the minimum feature size F.

Further, as described with reference to FIGS. 3 and 4, since independent pieces of information can be stored in the phase-change material layers 7 at the height of the respective gate lines and at the height of the respective gate insulator films, two independent memory cells can be formed within a unit cell, and a memory cell array in which the memory cell area is $2F^2$ can be provided.

Due to the respective advantages, it is possible to provide a memory cell array having such a structure that can be realized with a simpler process and that is ideal for realizing a higher integration level and to reduce the bit cost of memory.

In particular, the memory cell array of FIG. 2 is characterized in that it further includes: a plurality of word lines (2) provided above the semiconductor substrate and below the plurality of stacked structures so as to extend in the Y direction; a plurality of diodes (40p, 50p, and 60p) provided above the plurality of word lines and below the plurality of stacked structures and electrically connected to two adjacent channel layers of the plurality of channel layers with the resistance-change material layer interposed in the X direction; a plurality of first transistors (transistors including 25p, 88p, and 89p)

which is provided above the plurality of resistance-change material layers and has a second gate semiconductor layer extending in the Y direction and which selects two adjacent channel layers of the plurality of first channel layers with the stacked structure interposed in the X direction; and a plurality of bit lines which extends in the X direction and is electrically connected to channel layers arranged in the X direction among the plurality of first channel layers.

Due to such a configuration, unlike the select transistor of PTL 1, select devices which need to be processed to have a pitch of 3F are not required. This is because the diode falls within the wire width of the word line 2 and the gate 25p of the first transistor can be formed on the upper layer of the stacked structure. Due to this, it is possible to realize a memory cell array in which the memory cell area is 2F2. However, since the combination of wires and select devices is not limited to this, the other configuration will be described with reference to FIG. 36 and the subsequent figures. In the figures of the first embodiment, although an example in which four gate polysilicon layers of the memory cell are stacked has been illustrated, five or more gate polysilicon layers may be stacked.

<Modification of Memory Cell Structure>

Figure 31:
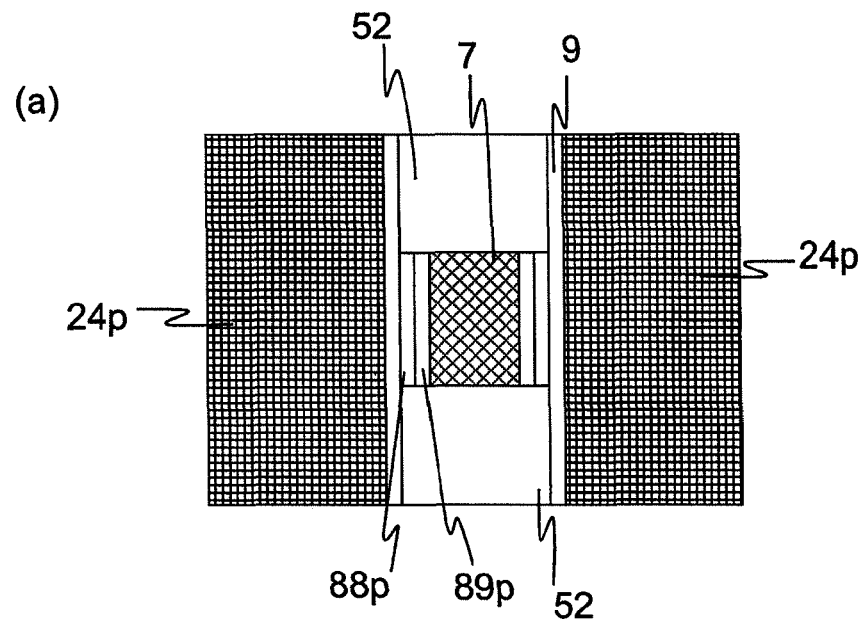
Figure 31:
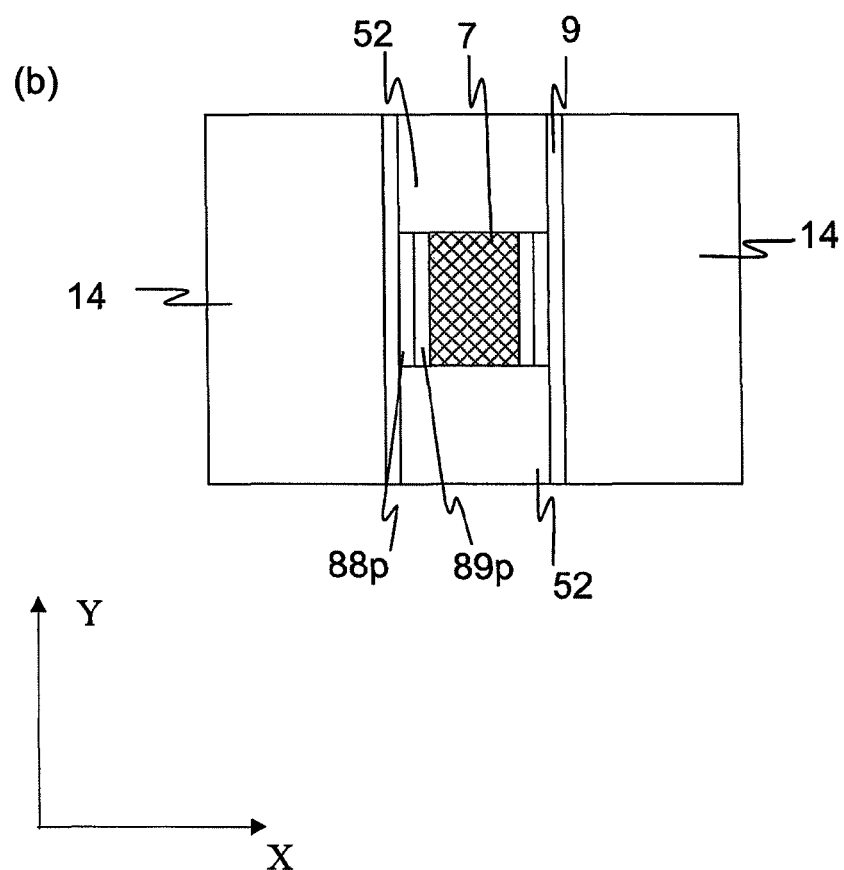

In the steps of FIGS. 24, 25, and 26, the recording layer is formed by completely burying the phase-change material. As a result, the cross-sectional view of the memory array MA when seen on a surface parallel to the XY plane is as illustrated in FIGS. 31(a) and 31(b). FIG. 31(a) is a cross-sectional view at the height of the gate polysilicon 24p and FIG. 31(b) is a cross-sectional view at the height of the insulator film 14.

Figure 32:
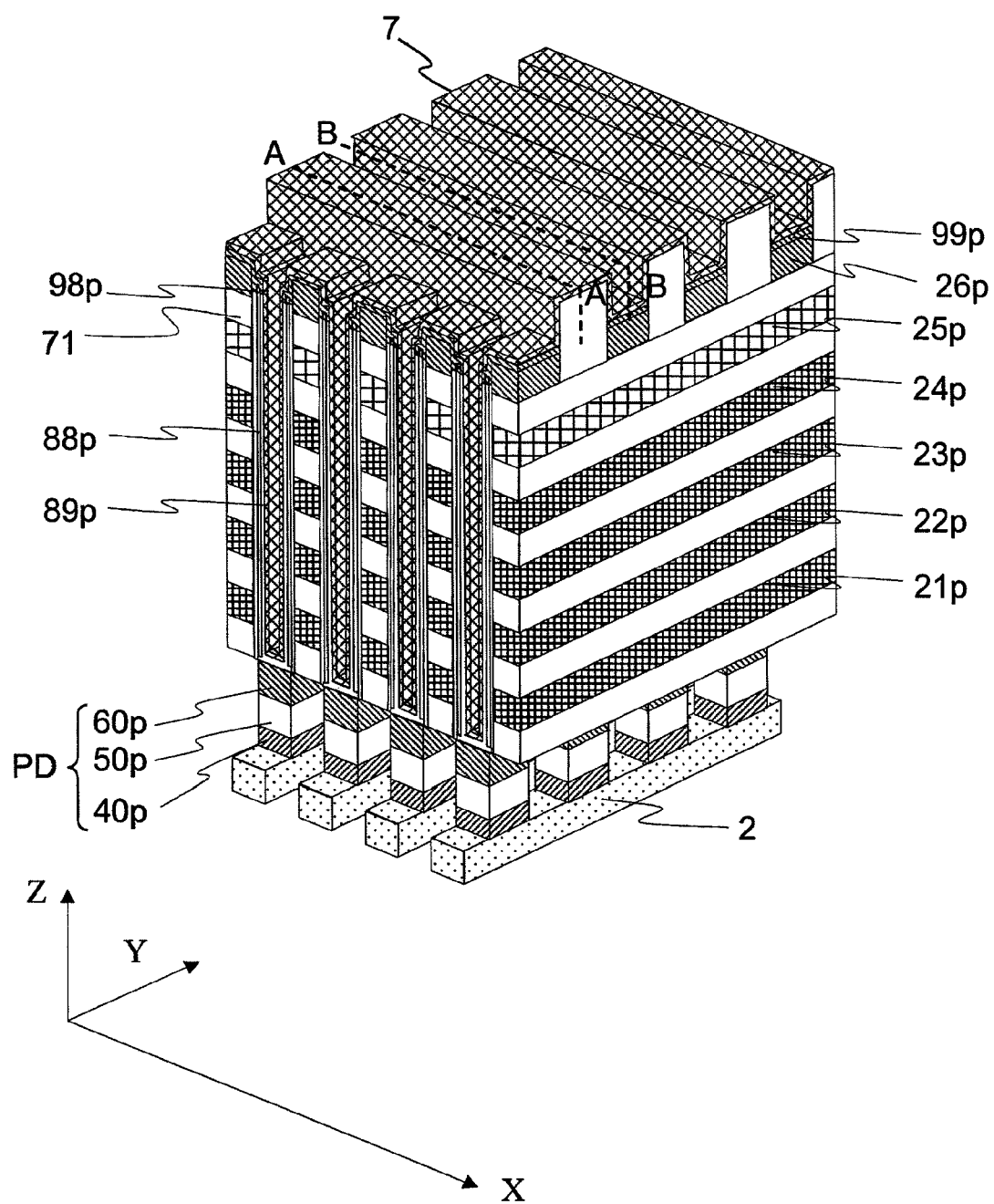
FIG. 32 is a partial 3-dimensional schematic view illustrating a method of fabricating the semiconductor storage device according to the first embodiment of this invention.
Figure 33:
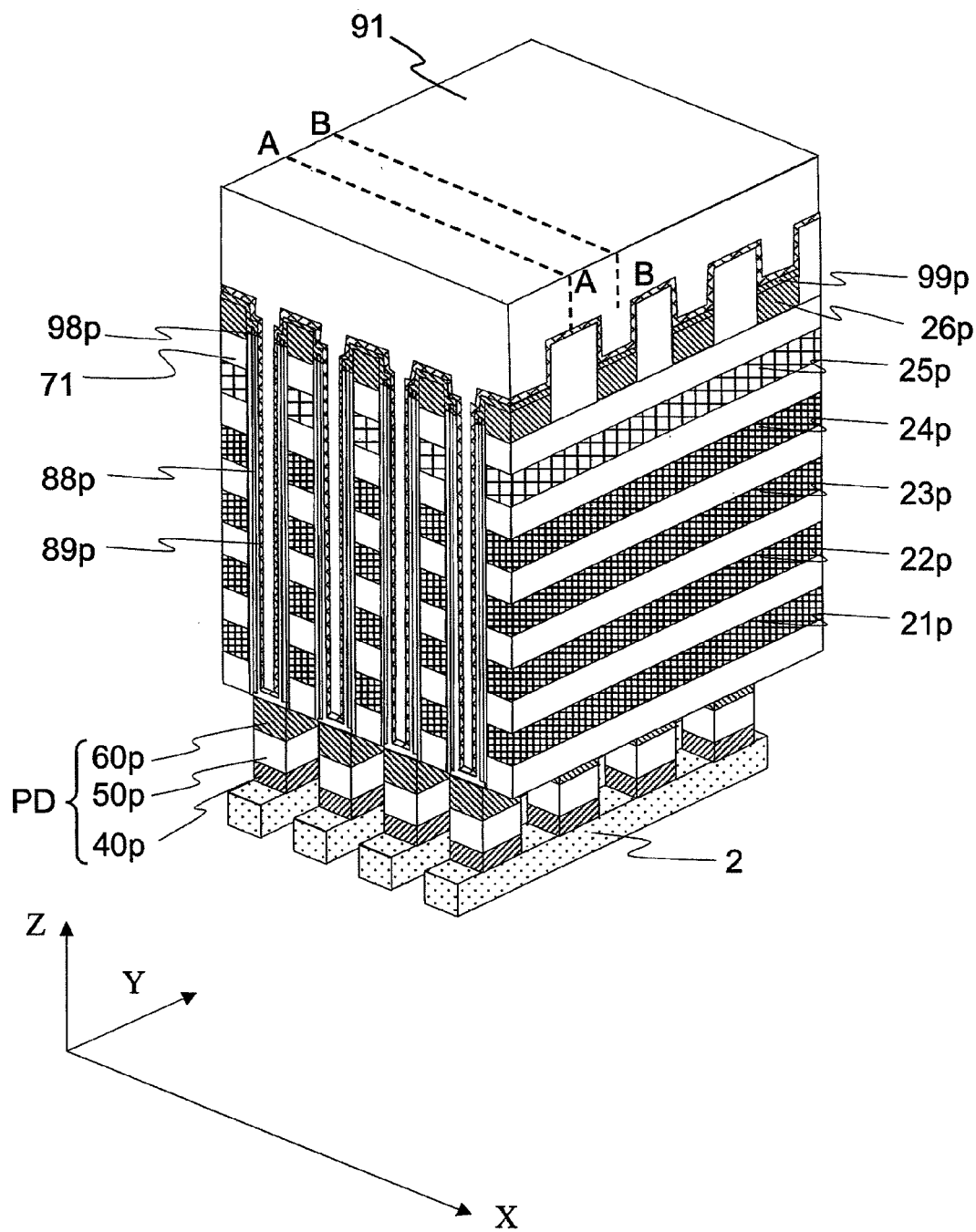
FIG. 33 is a partial 3-dimensional schematic view illustrating a method of fabricating the semiconductor storage device according to the first embodiment of this invention.

However, in the steps of FIGS. 24, 25, and 26, the recording layer may be formed by burying the insulator film in the space that remains without being buried completely with the phase-change material. For example, as illustrated in the 3-dimensional schematic view of FIG. 32, the phase-change material film 7 is deposited so that the phase-change material film 7 is not completely buried in the space in which the dummy insulator film 51 is removed. After that, the insulator film 91 is deposited so that the space of the phase-change material film 7 is completely buried (FIG. 33). After that, like the steps of FIGS. 27 and 28, etch-back is performed so that the height of the phase-change material layer 7 and the uppermost surface of the insulator film 91 is lower than the height of the uppermost layer of the insulator film layer 15 and is higher than the height of the lowermost layer of the insulator film layer 15. Subsequently, like the steps of FIGS. 32 and 33, the insulator film layer 92 is buried and the uppermost surface of the polysilicon layer 99p is exposed by wet-etching. After that, the BLC of FIGS. 1 and 2 (that is, the contact BLC for connecting the bit line 3 and the peripheral circuit formed in the semiconductor substrate) is formed. After that, the material of the bit line 3 is deposited, and the bit line material on the insulator film 52 is removed by CMP. As described above, the bit line may naturally be processed by dry etching.

Figure 34:
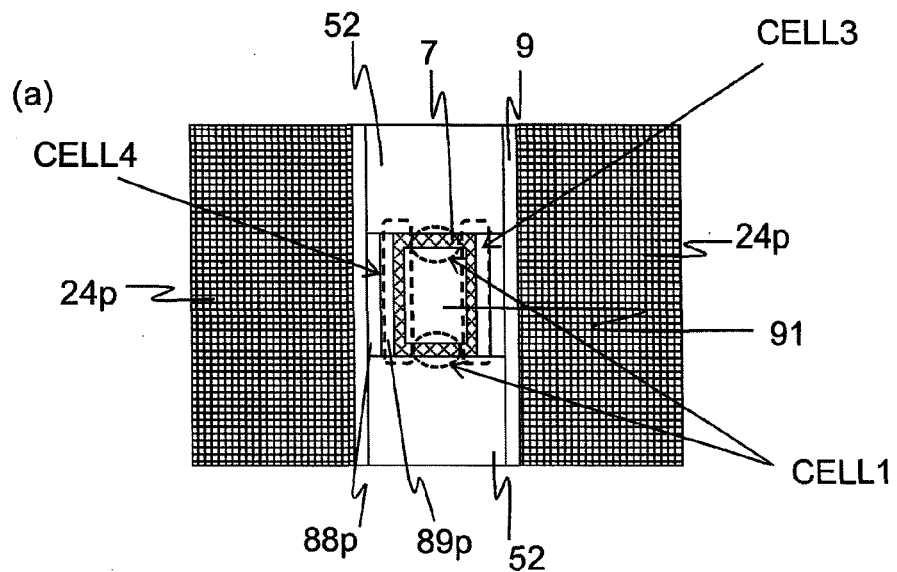
Figure 34:
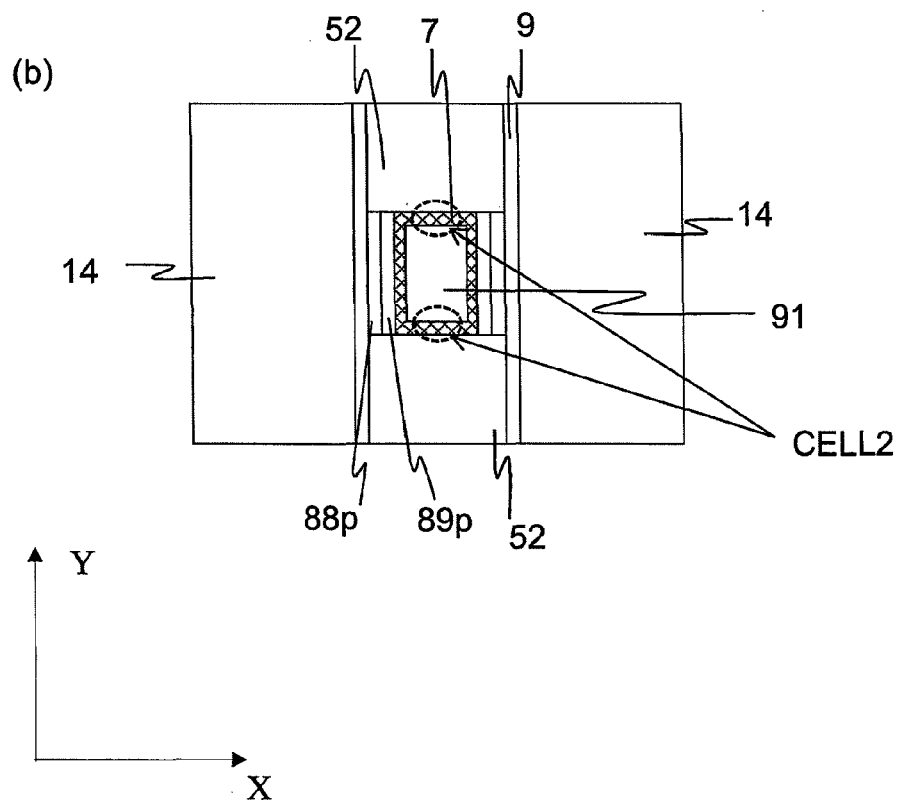
Figure 35:
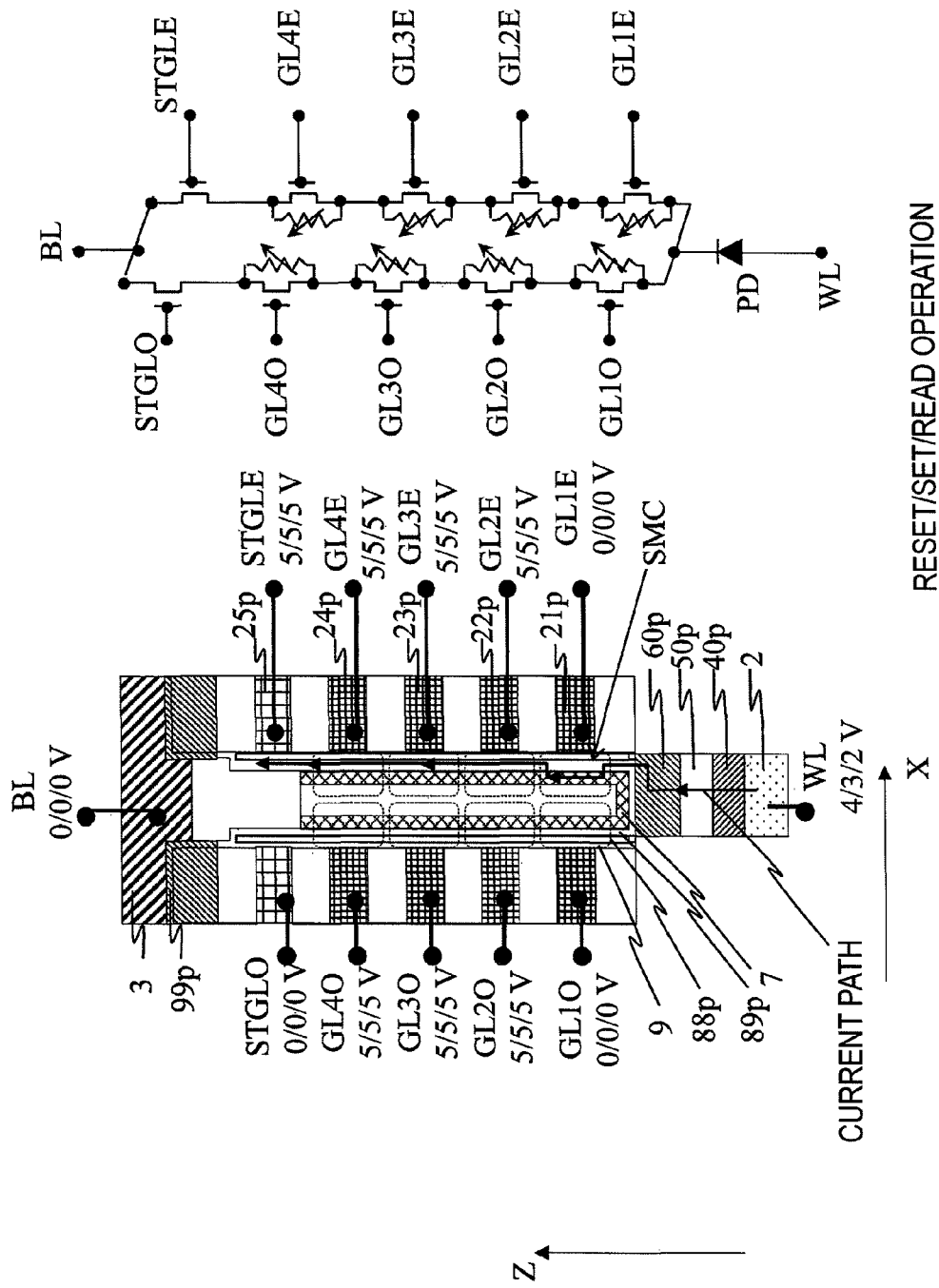
FIG. 35 is a diagram illustrating reset operation, set operation, and a read of the semiconductor storage device according to the first embodiment of this invention illustrated in FIGS. 34(a) and 34(b).

The cross-sectional view of the memory array MA fabricated in this way when seen on the surface parallel to the XY plane is as illustrated in FIGS. 34(a) and 34(b). FIG. 34(a) is a cross-sectional view at the height of the gate polysilicon 24p and FIG. 34(b) is a cross-sectional view at the height of the insulator film 14. The memory cell structure of FIGS. 34(a) and 34(b) can naturally perform the operations of FIGS. 3 and 4 and can further perform such a chain cell operation as illustrated in FIG. 35. That is, 0 V is biased to the gate lines GL1O and GL1E to which the select cell SMC performing the following operation is connected so that transistors of which the channels are the channel polysilicon layers 88p and 89p are put into the OFF state. 5 V is biased to the gate lines GL2O, GL2E, GL3O, GL3E, GL4O, and GL4E to which the select cell SMC is not connected so that transistors are put into the ON state. 0 V is biased to the bit line BL, and 4 V, 3 V, and 2 V are biased to the word line WL during reset operation, set operation, and read operation, respectively. The gate polysilicon of the select transistor applies 5 V to the gate (that is, STGLE) on the side to which the SMC is connected so that transistors are put into the ON state. 0 V is biased to the gate (that is, STGLO) on the side to which the SMC is not connected so that transistors are put into the OFF state. In the unselected cell USMC, the transistors are in the ON state, the channel resistance is low, and the resistance of the channel polysilicon layers 88p and 89p of the STGLE in the ON state is also low. Substantially the same current can be allowed to flow regardless of the state of the phase-change material layer 7 in the USMC portion. Since transistors in the SMC portion are in the OFF state, current flows through the phase-change material layer 7. During the reset operation and the set operation, the operation is performed by changing the resistivity of the phase-change material 7 with the current flowing through the phase-change material layer 7 using the SMC. During the read operation, the operation is performed by determining the current value flowing through the phase-change material layer 7 using the SMC. Since the select transistor in which the STGLO is connected to the gate polysilicon layer 25p is in the OFF state, no current flow through the USMC on the left side (+X side) of FIG. 35. Thus, current flows through the phase-change material layer 7 in the SMC portion only, and selective operation can be performed. The XY select operation can be performed in the same manner as described in FIG. 5.

With the operation illustrated in FIG. 35, two cells can be formed in the area of 4F$^2$ with the operation also illustrated in PTL 2. When the operations of FIGS. 3, 4, and 35 are combined, four cells can be formed in the area of 4F$^2$, and the cell area is 1F$^2$ in each layer. In FIGS. 34(a) and 34(b), portions corresponding to the four memory cells in the unit cell are denoted by CELL1, CELL2, CELL3, and CELL4.

In summary, the memory cell of the present modification is characterized in that it further includes an insulator film layer (insulator film 91) provided on the inner side in the XY plane of the plurality of resistance-change material layers (phase-change material layers 7). Alternatively, when such characteristics are focused on the fabricating method, the fabricating method is characterized in that the method further includes (g) a step of forming an insulator film layer on the inner side in the XY plane of the plurality of resistance-change material layers.

Here, the insulator film 91 is illustrated in FIGS. 34(a) and 34(b) such that the cross-section in the XY plane has a rectangular shape, this invention is not limited to this. If the insulator film 91 is provided at least on the inner side of the phase-change material layer 7, the unit cell can be divided into the four memory cells (CELL1 to CELL4), and the effective cell area can be reduced by ¼.

<First Modification 1 of XY-Select Device>

Although diodes (PDs) are used as the XY-select devices in FIGS. 1 to 35, other methods may be used. Other examples of an XY select method will be described with reference to FIGS. 36 to 44.

Figure 36:
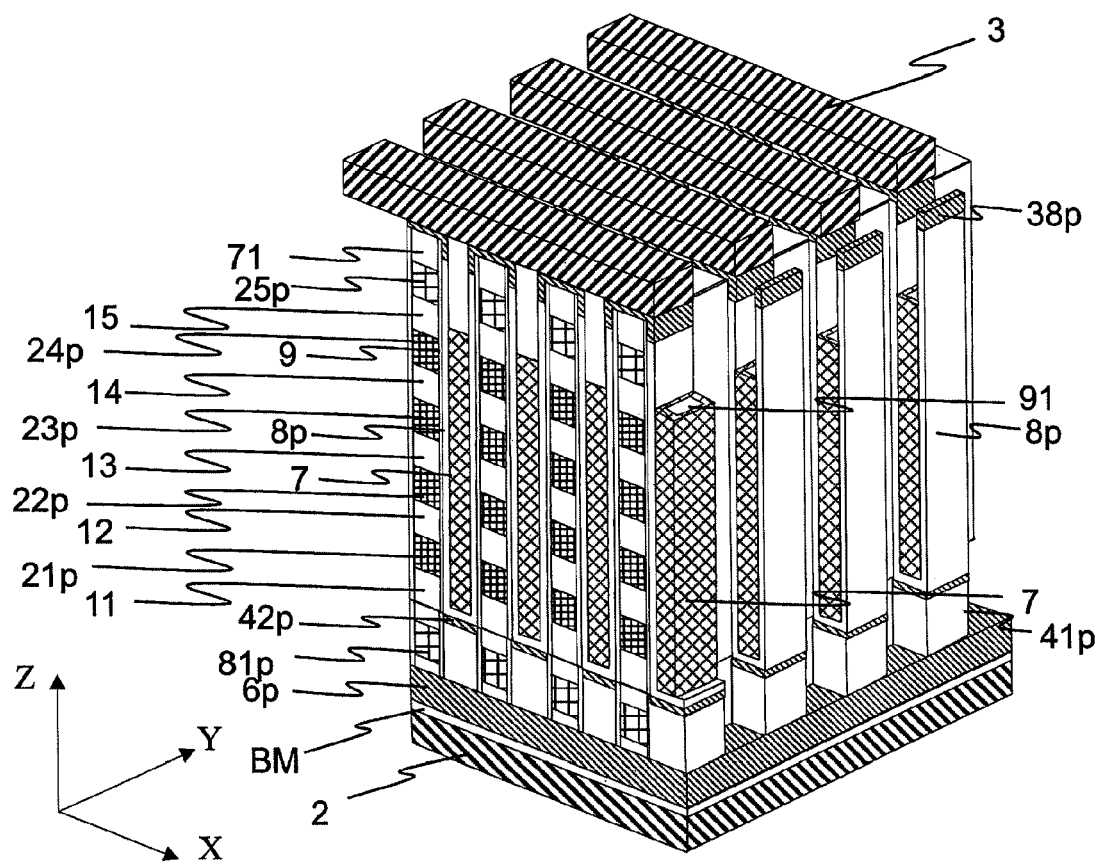
FIG. 36 is a partial 3-dimensional schematic view of an example of the semiconductor storage device according to the first embodiment of this invention.
Figure 37:
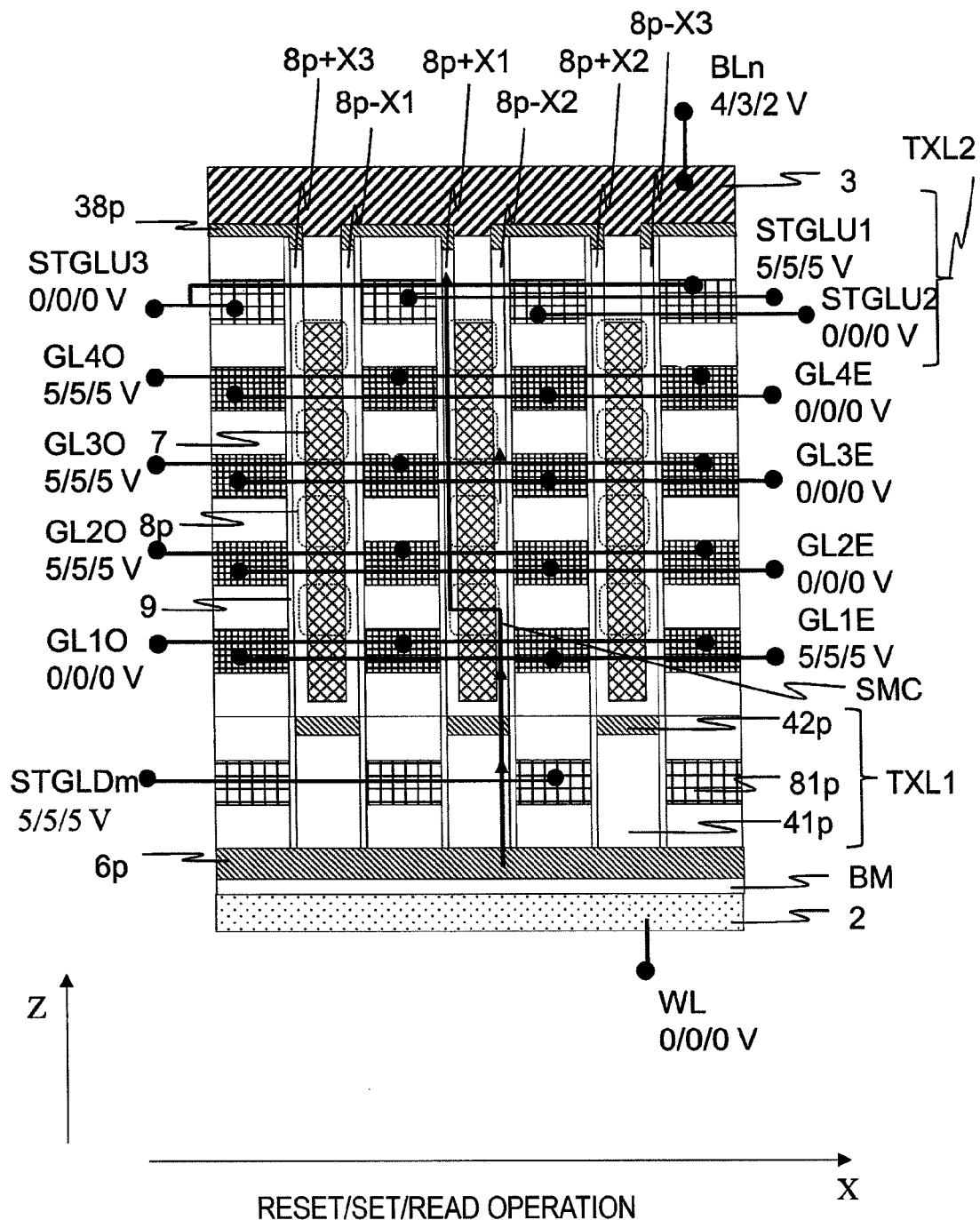
FIG. 37 is a diagram illustrating select operation of an XY-select device of FIG. 36.

In FIG. 36, a select transistor of which the gate is a polysilicon layer 81p is added instead of using the diode PD. FIG. 37 illustrates a cross-sectional view in the XZ plane of FIG. 36 and illustrates the relation between the select transistor and the gate signal lines GL1O, GL2O, GL3O, GL4O, GL1E, GL2E, GL3E, and GL4E when the reset operation, the set operation, and the read operation are performed. The voltages 4/3/2 V of the BLn are the voltages during the reset operation, the set operation, and the read operation, respectively. Similarly, the voltages of the other terminals of FIG. 37 indicate the voltages during the reset operation, the set operation, and the read operation, respectively. When only STGLDm of the select transistors on the lower side is put into the ON state and STGLU1 of the select transistors on the upper side is put into the ON state, the current path is limited to the path that includes the select cell SMC.

In summary, the configuration of FIG. 36 is characterized in that it further includes: a first plate (2) provided above the semiconductor substrate and below the plurality of stacked structures; a plurality of transistors (TXL1) provided above the first plate and below the plurality of stacked structures so as to electrically connect two adjacent channel layers of the plurality of first channel layers with the stacked structure interposed to the first plate; a plurality of transistors (TXL2) which is provided above the plurality of resistance-change material layers and has a second gate semiconductor layer extending in the Y direction and which selects two adjacent channel layers of the plurality of first channel layers with the stacked structure interposed; and a plurality of bit lines (3) extending in the X direction so as to be electrically connected to channel layers arranged in the X direction among the plurality of first channel layers. Due to such a configuration, it is possible to perform an XY select operation of the memory array MA.

The reasons therefor will be described below (hereinafter, among the channel layers $8p$, those channel layers provided on the +X side of the stacked structure that includes the respective gate semiconductor layers will be denoted by $8p+X$ and those channel layers provided on the −X side will be denoted by $8p-X$; the numbers at the end of the notations are appended numbers).

An X-select transistor layer TXL1 selects the channel layers on its +X and −X sides simultaneously. For example, 5/5/5 V are biased to STGLDm as illustrated in FIG. 37, the channel layers $8p+X3$ and $8p-X2$ are selected and are electrically connected to the word line WL. However, the channel layers selected by the X-select transistor layer TXL1 are not only these two channel layers. This is because due to the channel layer $41p$ and the polysilicon layer $42p$, the channel layers $8p+X1$ and $8p-X2$ can be electrically connected to the diode layer PD simultaneously and the channel layers $8p-X1$ and $8p+X2$ can be electrically connected to the word line WL simultaneously. That is, when 5/5/5 V are biased to the STGLDm, four channel layers $8p+X1$, $8p-X2$, $8p+X2$, and $8p-X3$ are selected, and the X-select transistor layer TXL1 is a transistor layer that selects four channel layers in total.

In contrast, an X-select transistor layer TXL2 selects two channel layers. For example, as illustrated in FIG. 37, when 5/5/5 V are biased to the STGLU1, only the channel layers $8p-X1$ and $8p+X1$ are selected. Thus, only two channel layers that are directly connected by the insulator film are selected by the X-select transistor layer TXL2.

Base on the above, as illustrated in FIG. 37, by shifting the gate semiconductor layers to be selected by one in the X direction with respect to the X-select transistor layers TXL1 and TXL2, it is possible to select one current path in the X direction. In FIG. 37, since four channel layers $8p+X1$, $8p-X2$, $8p+X2$, and $8p-X3$ are selected by the TXL1, two channel layers $8p-X1$ and $8p+X1$ are selected by the TXL2, and the other channel layers are in the unselected state, the channel layers which are in the select state and in which current flows are in the path that extends over the channel layers $8p-X2$ and $8p+X1$ that are selected by both TXL1 and TXL2. Thus, the X-select operation can be performed with the configuration of the present embodiment. Y-select operation can be performed by biasing voltages of 4/3/2 V to the bit lines BLn that include select cells during the reset operation, the set operation, and the read operation, respectively, and biasing 0 V to the bit lines that do not include select cells.

From the above, it can be understood that the XY-select operation can be performed with the configuration of FIGS. 36 and 37. Further, since the word line 2 can be formed in a plate form, a larger contact area than the layout of FIG. 2 can be taken and a wire resistance can be reduced.

<Second Modification of XY-Select Device>

Figure 38:
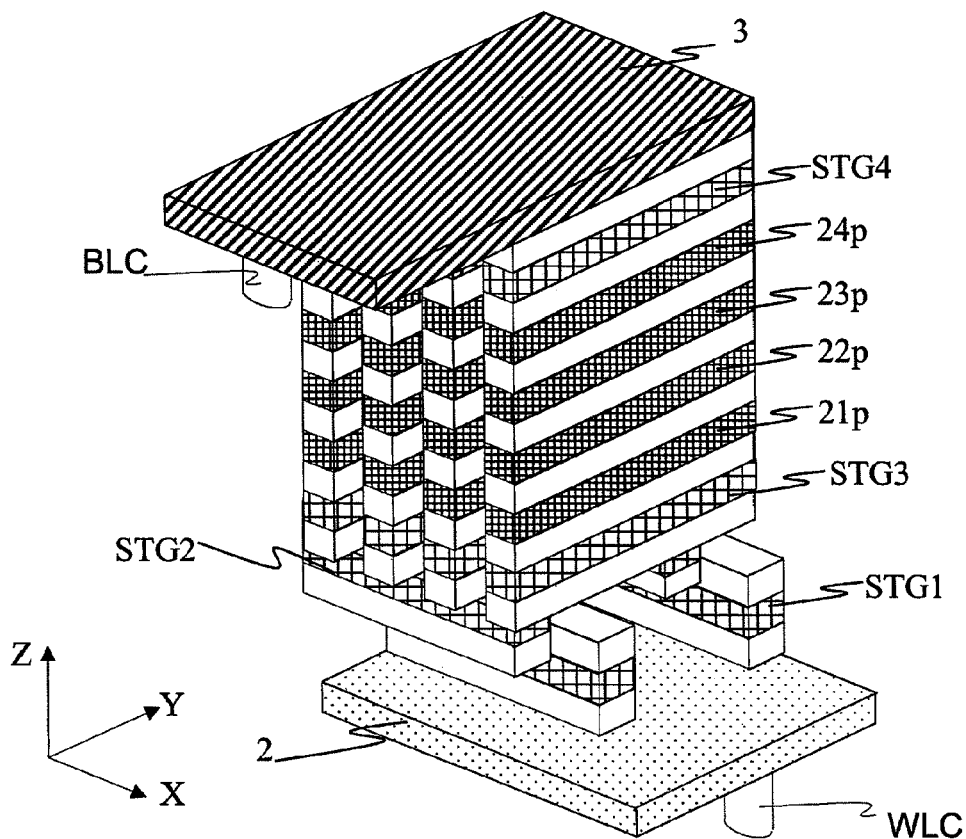
FIG. 38 is a partial 3-dimensional schematic view of an example of the semiconductor storage device according to the first embodiment of this invention and a diagram illustrating select operation of an XY-select device.
Figure 38:
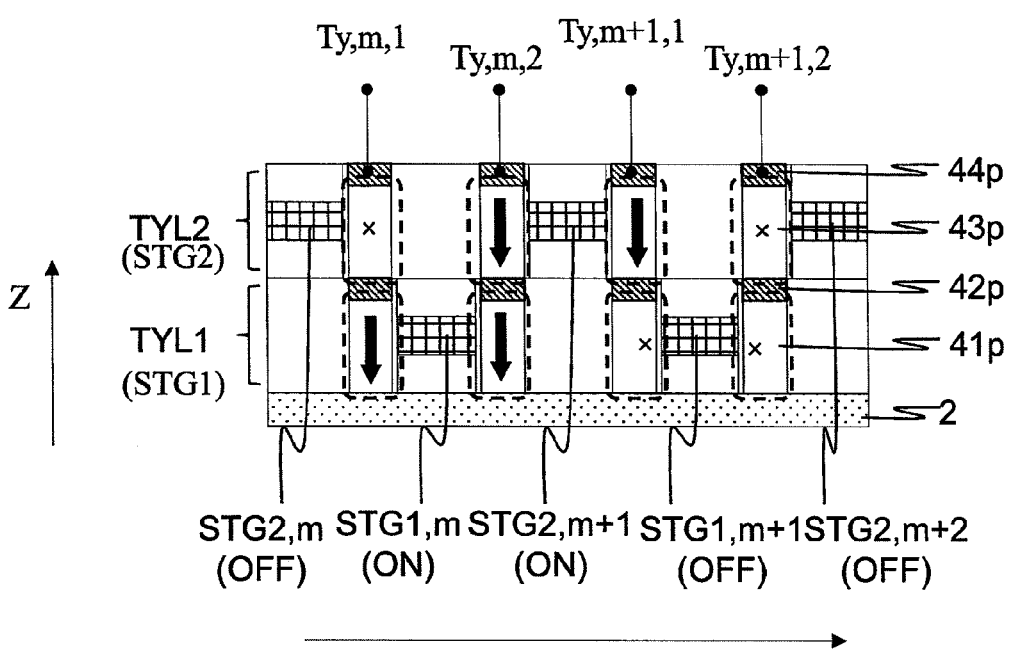

FIG. 38 is a diagram illustrating another XY-select method. The cross-section of the YZ plane is also illustrated. The configuration of FIG. 38 is characterized in that it further includes: a first plate (2) provided above the semiconductor substrate and below the plurality of stacked structures; a plurality of second channel layers (Ty, m, n) electrically connected to the first plate and two adjacent channel layers of the plurality of first channel layers with the resistance-change material layer interposed; a plurality of fourth transistors (TYL1) for selecting two adjacent channel layers in the Y direction of the plurality of second channel layers; a plurality of fifth transistors (TYL2) for selecting two adjacent channel layers in the Y direction of the plurality of second channel layers, different from those selected by the fourth transistors; a plurality of sixth transistors (transistors including STG4) which is provided above the plurality of resistance-change material layers and has the second gate semiconductor layer extending in the Y direction and which selects two adjacent channel layers of the plurality of first channel layers with the stacked structure interposed in the X direction; and a second plate (3) provided above the plurality of sixth transistors and electrically connected to the plurality of first channel layers.

Due to such a configuration, by biasing the ON voltage to STG1,$m$ only using a Y-select transistor layer TYL1 on the first stage, only two channel silicons $41p$ on both sides of the gate can be put into the ON state. Further, by biasing the ON voltage to STG2,$m$+1 only using a Y-select transistor layer TYL2 on the second stage, only the terminal Ty,m,2 is electrically connected to the lower electrode 2. The X-direction configuration and the X-select operation are the same as those of FIGS. 39 and 40. From the above, it can be understood that the XY-select operation can be performed with the configuration of FIG. 38.

Since the method of FIG. 38 selects both X and Y directions using the select transistors, the word lines and the bit lines do not need to be processed in the line-and-space form but may be formed in a plate form as in FIG. 38. Due to this, it is possible to further reduce the wire resistance than FIG. 36.

<Third Modification of XY-Select Device>

Figure 39:
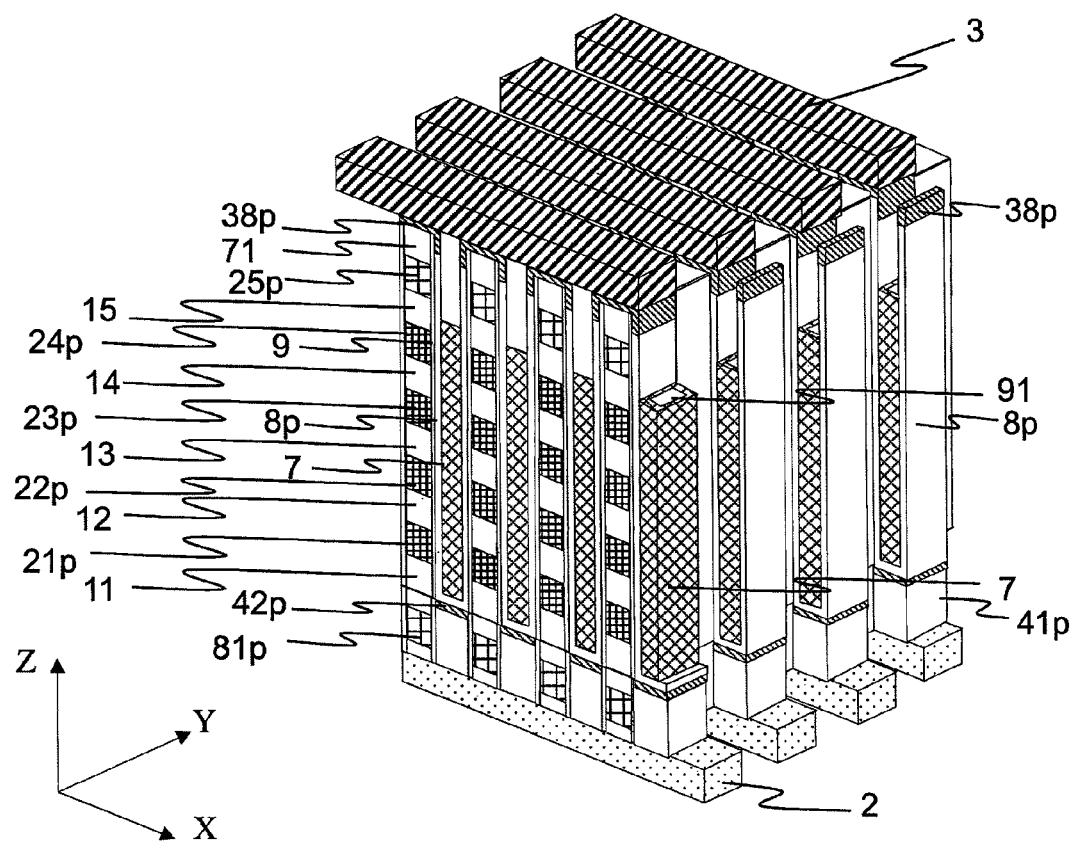
FIG. 39 is a partial 3-dimensional schematic view of an example of the semiconductor storage device according to the first embodiment of this invention.

Although in FIGS. 36 and 37, the lower electrode 2 has a plate form and is processed in a line-and-space form in which the bit line extends in the X direction, the lower electrode 2 (the word line WL) may be processed in the line-and-space form extending in the X direction in the same manner as the bit line as illustrated in FIG. 39. Specifically, the configuration of FIG. 39 is characterized in that it further include: a plurality of word lines (2) provided above the semiconductor substrate and below the plurality of stacked structures so as to extend in the X direction; a plurality of seventh transistors (transistors including $81p$) for electrically connecting any one of the plurality of word lines to two adjacent channel layers of the plurality of first channel layers with the resistance-change material layer interposed; a plurality of eighth transistors (transistors including 71) provided above the plurality of resistance-change material layers so as to select two adjacent channel layers of the plurality of first channel layers with the resistance-change material layer interposed; and a plurality of bit lines (3) extending in the X direction and electrically connected to channel layers arranged in the X direction among the plurality of first channel layers.

In such a structure, the X-select operation of FIG. 39 can be performed in the same manner as that of FIGS. 36 and 37, and the Y-select operation can be realized by selecting the corresponding word lines 2 and bit lines 3. Since both the word lines 2 and the bit lines 3 extend in the X direction, the configuration of FIG. 39 is ideal for a so-called super-laminated structure in which two memory cell arrays of FIG. 39 are stacked and the bit lines 3 on the first layer are used as the bit lines 2 of the second layer and is ideal when increasing the degree of lamination of memory cell arrays and increasing the capacity of the semiconductor storage device.

<Fourth Modification of XY-Select Device>

Figure 40:
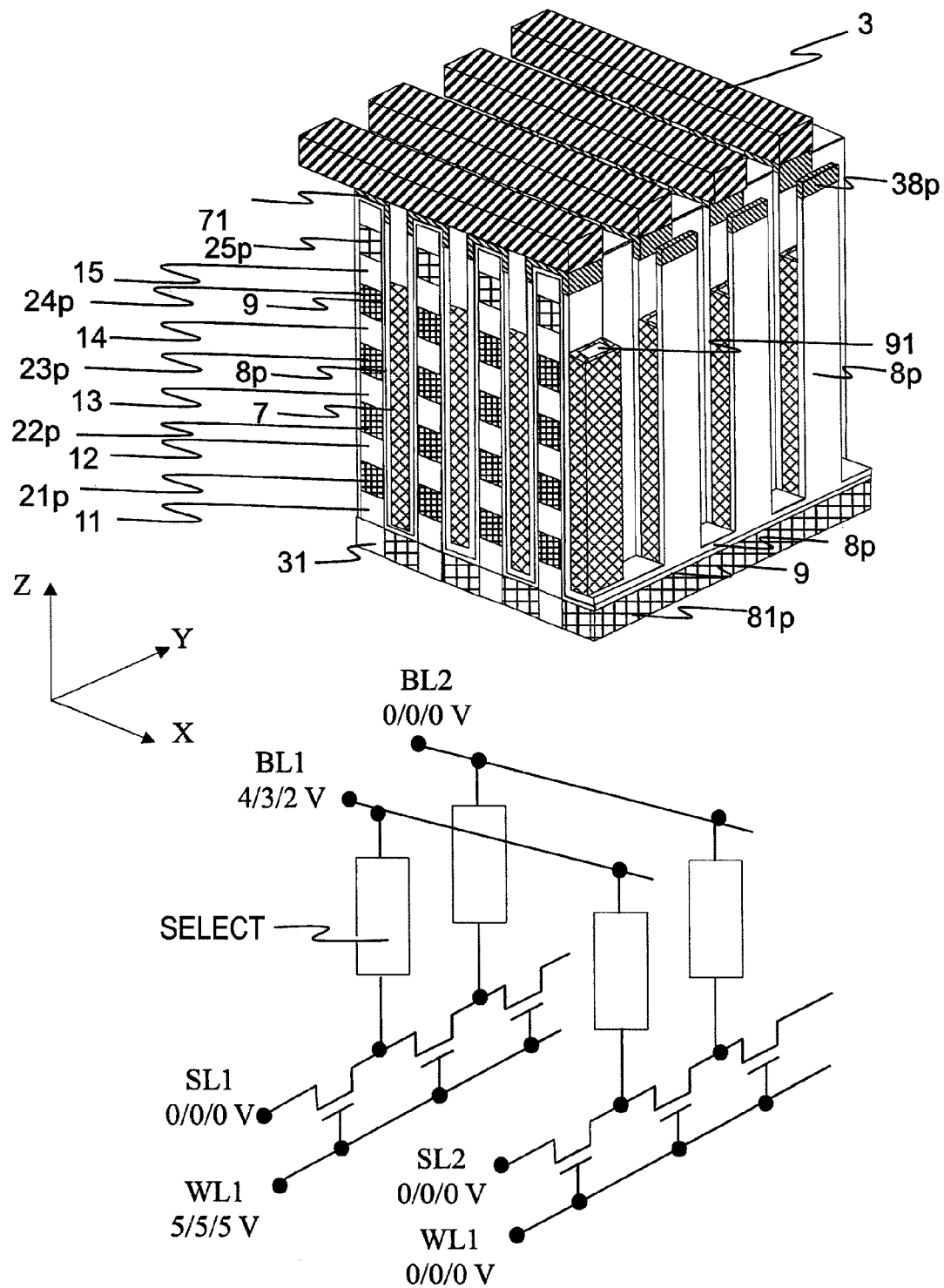
FIG. 40 is a partial 3-dimensional schematic view and an equivalent circuit diagram of an example of the semiconductor storage device according to the first embodiment of this invention.

In FIG. 40, channel semiconductor layers 38p are connected in the Y direction at the bottom of the vertical cells and extend in the Y direction. A polysilicon gate 81p extends in the Y direction with the gate insulator film interposed along the semiconductor layer extending in the Y direction. That is, the configuration of FIG. 40 is characterized in that it further includes: a plurality of third gate semiconductor layers (81p) provided above the semiconductor substrate so as to extend in the Y direction; a plurality of third channel layers (regions of 8p immediately above 81p in particular) provided on an upper layer of each of the plurality of third gate semiconductor layers with the second gate insulator film layer (a region of 9 immediately above 81p in particular) interposed so as to electrically connect two adjacent channel layers of the plurality of first channel layers with the resistance-change material layer interposed; and a plurality of ninth transistors (transistors including 25p) which is provided above the plurality of resistance-change material layers and has a fourth gate semiconductor layer extending in the Y direction and which selects two adjacent channel layers of the plurality of first channel layers with the stacked structure interposed in the X direction.

In such a configuration, the X-select operation is realized by biasing 5 V only to the gate polysilicon of the select portion during the reset operation, the set operation, and the read operation to put the channels extending in the Y direction into the ON state. 0 V is biased to unselected portions to put the same into the OFF state. The Y-select operation can be realized by biasing voltages of 4/3/2 V to the bit lines BLn that include select cells during the reset operation, the set operation, and the read operation, respectively, and biasing 0 V to the bit lines that do not include the select cells. Thus, it can be understood that the XY-select operation can be performed with the configuration of FIG. 40.

The configuration of FIG. 40 does not require a step of removing the insulator film layer 9 at the bottom of the spaces to expose the diodes on the bottom surface, which is performed in FIG. 9. This is because the polysilicon gate 81p extending in the Y direction controls the conduction state of the channel silicon layer 8 at the bottom using the insulator film layer 9 at the bottom to thereby realize the X-select operation. Therefore, it is possible to realize the memory cell array with a simpler process.

<Fifth Modification of XY-Select Device>

Figure 41:
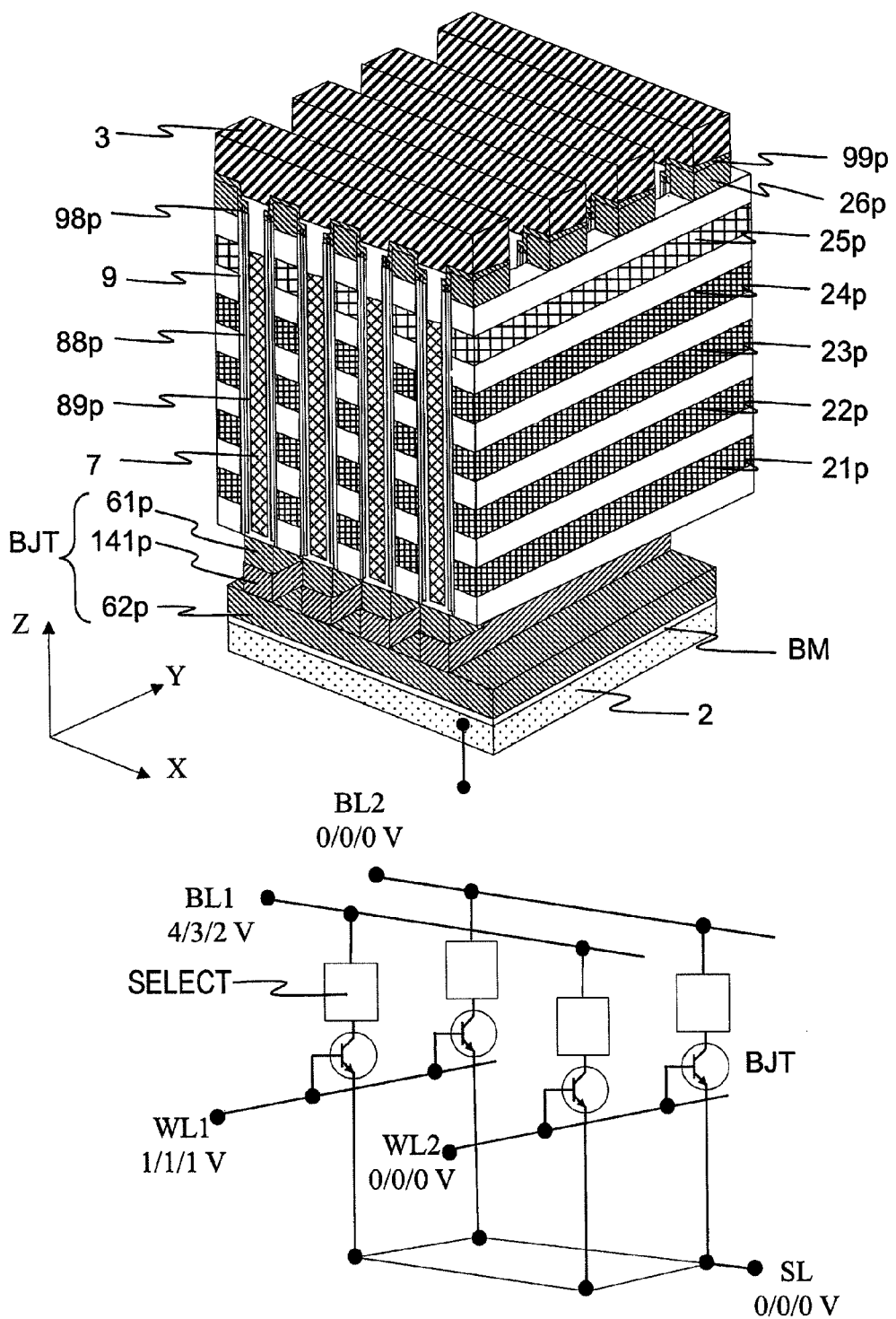
FIG. 41 is a partial 3-dimensional schematic view and an equivalent circuit diagram of an example of the semiconductor storage device according to the first embodiment of this invention.

FIG. 41 illustrates an example in which the XY-select operation is performed using a bipolar transistor (BJT). A BJT in which an n-type polysilicon 61p is a collector, an n-type polysilicon 62p is an emitter, and a p-type polysilicon 141p is a base is used as an XY-select device. The n-type polysilicon 62p has a plate form similarly to a source electrode 2 and is electrically connected to the source electrode 2 by a barrier metal. The p-type polysilicon 141p extends in the Y direction and forms the word lines (WL1, WL2, and the like). The n-type polysilicon 61p is formed at the intersections of the bit lines 3 and the base lines 141p only and is individually divided in both X and Y directions. The X-select operation is performed by biasing 1 V to the base (the word line) of the select portion and biasing 0 V to the other portions. The Y-select operation can be performed by biasing voltages of 4/3/2 V to the bit lines BLn that include select cells during the reset operation, the set operation, and the read operation and biasing 0 V to the bit lines that do not include the select cells. Thus, it can be understood that the XY-select operation can be performed with the configuration of FIG. 41. Since the word lines 2 can be formed in a plate form similarly to the second modification of the XY-select device, a larger contact area than the layout of FIG. 2 can be taken and a wire resistance can be reduced. Moreover, since the bipolar transistor can drive a large amount of current as compared to the MOS transistor of the second modification of the XY-select device, it is possible to reduce the bit line voltage during operation by reducing a voltage drop in the XY-select device portion.

<Sixth Modification of XY-Select Device>

Figure 42:
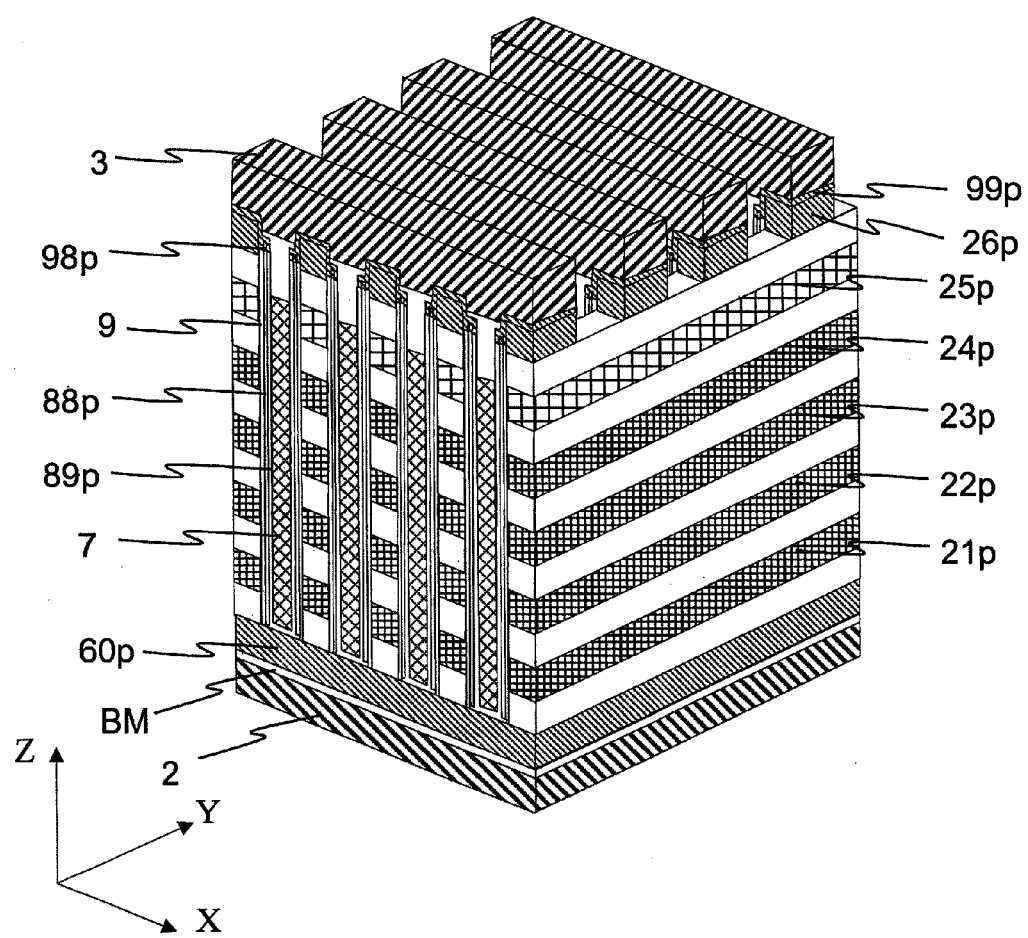
FIG. 42 is a partial 3-dimensional schematic view of an example of the semiconductor storage device according to the first embodiment of this invention.

FIG. 42 illustrates an example in which no select device is present between the word line and the vertical cell. In FIGS. 1 to 41, the gate polysilicon layers 21p, 22p, 23p, and 24p of the memory cell are alternately electrically connected so that odd-numbered layers are connected with each other and even-numbered layers are connected with each other. In the configuration of FIG. 42, the gate polysilicon layers 21p, 22p, 23p, and 24p need to be connected every three layer, for example. That is, 3m-th layers, (3m+1)th layers, or (3m+2)th layers are connected with each other (m is a natural number). Further, the gate polysilicons 25p are not connected but can be operated by controlling the same independently.

Figure 43:
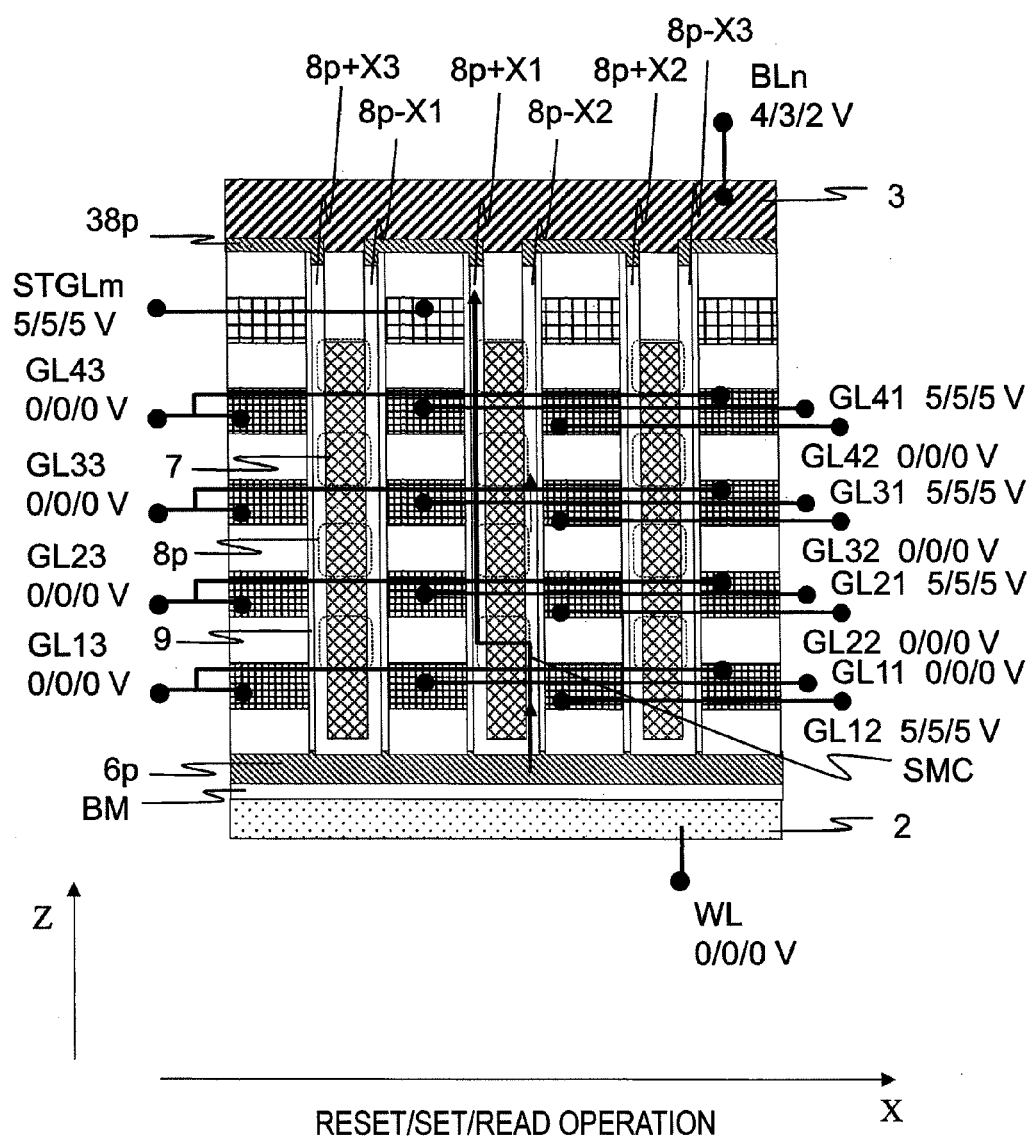
FIG. 43 is a diagram illustrating select operation of the semiconductor storage device of FIG. 42.

FIG. 43 illustrates a cross-sectional view in the XZ plane of FIG. 42 and illustrates the relation between the select transistor and the gate signal lines GL11, GL21, GL31, GL41, GL12, GL22, GL32, GL42, GL13, GL23, GL33, and GL43 when the reset operation, the set operation, and the read operation are performed. The voltages 4/3/2 V of the select bit lines BLn are the voltages during the reset operation, the set operation, and the read operation, respectively. The voltage of the unselected bit line is 0 V. Similarly, the voltages of the other terminals of FIG. 43 indicate the voltages during the reset operation, the set operation, and the read operation, respectively. When only STGLm of the select transistors is put into the ON state, 0 V is biased to GL11, 5/5/5 V are biased to GL21, GL31, and GL41, 5/5/5 V are biased to GL21, 0 V is biased to GL21, GL31, and GL41, and 0 V is biased to GL13, GL23, GL33, and GL43, the current path is limited to the path that includes the select cell SMC.

In summary, the X-select operation can be realized. The Y-select operation can be performed by biasing voltages of 4/3/2 V to the bit lines BLn that include select cells during the reset operation, the set operation, and the read operation, respectively, and biasing 0 V to the bit lines that do not include the select cells. Thus, it can be understood that the XY-select operation and the Z-select operation can be performed with the configuration of FIGS. 42 and 43. Moreover, since the select device is not required, it is possible to fabricate the semiconductor storage device with a simpler process.

<Program Operation for High-Speed Data Transfer>

In order to realize high-speed data transfer, it may be helpful to increase the amount (the number of bits) of information programmed per unit time. As a method of realizing this, a method of performing parallel programming in a plurality of cells simultaneously is used in flash memories. The same can naturally be biased to resistance-change memories like phase-change memories. In addition to this, the use of the semiconductor storage device of the first embodiment enables simultaneous programming/erasing of a plurality of cells connected in series in vertical cells as illustrated in FIG. 44.

Figure 44:
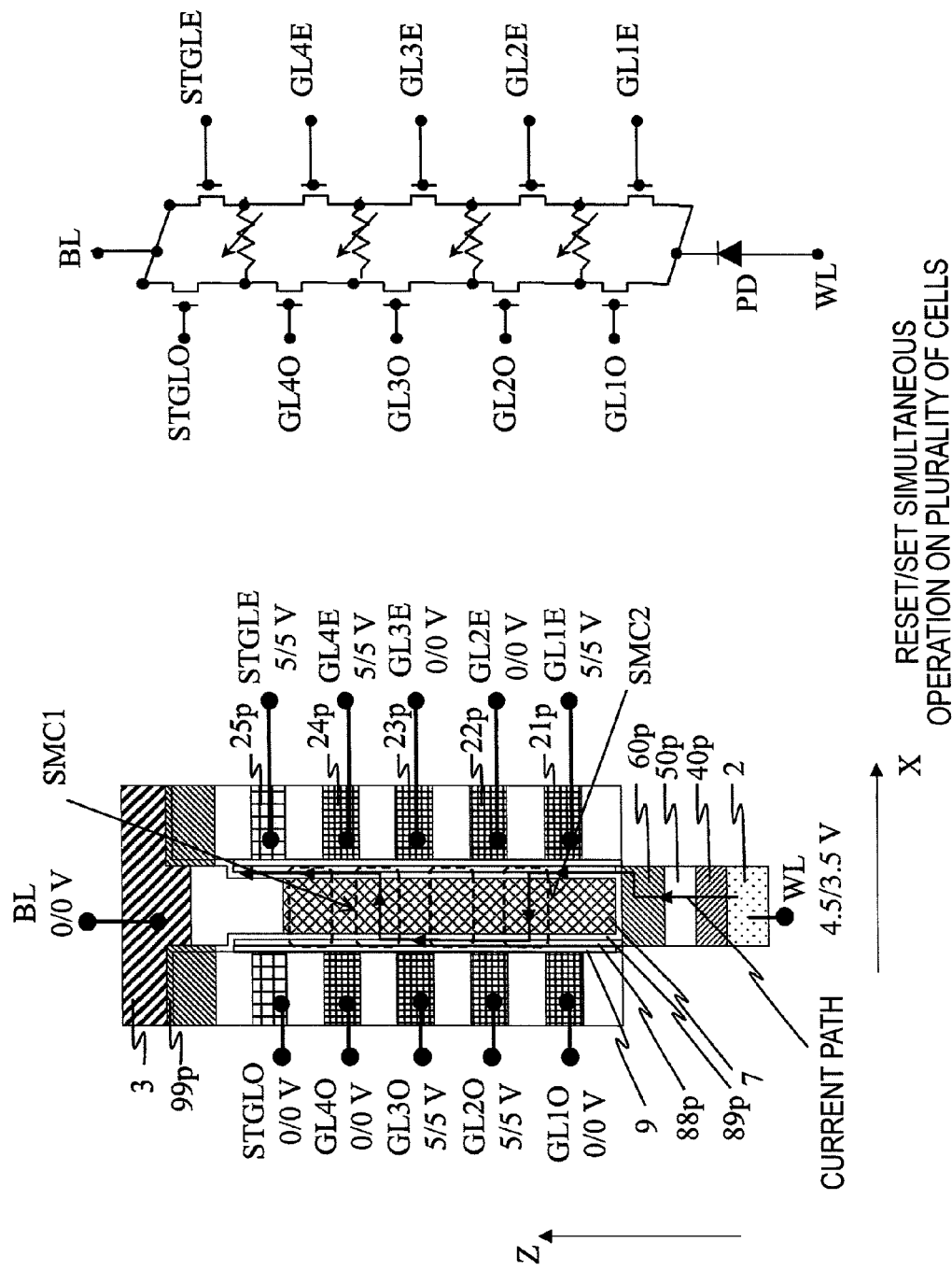
FIG. 44 is a diagram illustrating set operation and reset operation of the semiconductor storage device according to the first embodiment of this invention.

FIG. 44 illustrates an example in which the cell select method according to the method of FIG. 3 is biased to two select cells SMC1 and SMC2. This method is characterized in that, because cells are connected in series, current consumption does not increase twice even when the set or reset operation is performed simultaneously on two select cells. However, a required bit line-to-word line voltage increases as compared to when only one select cell is used. For example, the voltages of the reset and set operation is 4 V and 3 V, respectively, in the case of FIG. 3 where only one select cell is used, whereas the voltages are 4.5 V and 3.5 V, respectively, in the case of FIG. 44 where two select cells are used.

As a method of recording information on memory cells, a method of recording one bit on one cell and a method of recording n bits (n≥2) on one cell are known. In this invention, as a technique of improving the data transfer rate, a method of recording N bits using M cells (N<M) in the semiconductor storage device of the first embodiment has been invented. It is assumed that all programming target cells are put into the set state before a data program operation is performed. FIG. 45(a) illustrates an example of recording two bits using three cells of C1, C2, and C3. Cell states and bit patterns are correlated such that a state where all three cells are in the set state is 00, a state where only the first cell is in the reset state is 01, a state where only the second cell is in the reset state is 10, and a state where only the third cell is in the reset state is 11. By doing so, the numbers of cells in which reset operation needs to be performed to program information of 00, 01, 10, and 11 are 0, 1, 1, and 1, respectively. If all bit patterns are programmed with the same probability, 0.75 cell is programmed on average. Since 0.75 cell is programmed to store two bits of information, 0.375 cell per bit is reset. On the other hand, when one bit of information is stored in one cell as in the general case, when the set state is correlated with 0 and the reset state is correlated with 1, the number of cells that need to be reset when recording one bit of information is 0.5 on average. That is, the method of FIG. 45(a) can decrease the number of reset operation required for recording one bit of information. That is, it is possible to transfer data at high speed. As a method of selecting the cells C1, C2, and C3, three cells CELL2, CELL3, and CELL4 can be selected from the cells CELL1, CELL2, CELL3, and CELL4 of FIG. 37, for example. By doing so, two bits can be recorded in the unit cell. Naturally, the method of selecting the cells C1, C2, and C3 is not limited to this.

FIG. 45(b) illustrates an example of recording three bits using seven cells of C1 to C7. Cell states and bit patterns are correlated such that a state where all seven cells are in the set state is 000, a state where only the first cell is in the reset state is 001, a state where only the second cell is in the reset state is 010, a state where only the third cell is in the reset state is 100, a state where only the fourth cell is in the reset state is 011, a state where only the fifth cell is in the reset state is 101, a state where only the sixth cell is in the reset state is 011, and a state where only the seventh cell is in the reset state is 111. By doing so, the numbers of cells in which reset operation needs to be performed to program information of 000, 001, 010, 100, 011, 101, 110, and 111 are 0, 1, 1, 1, 1, 1, and 1, respectively. If all bit patterns are programmed with the same probability, 7/8 cell is programmed on average. Since 7/8 cell is programmed to store three bits of information, 7/24 cell per bit is reset. The number of reset operation required for recording one bit of information is further decreased from 0.5 which is the case of FIG. 45(a), and it is possible to transfer data at high speed. As a method of selecting the cells C1 to C7, seven cells can be selected from eight cells in the two unit cells each made up of four cells of CELL1 to CELL0, for example. Naturally, the method of selecting the cells C1 to C7 is not limited to this.

FIG. 45(c) illustrates an example of recording three bits using eight cells of C1 to C8. Cell states and bit patterns are correlated such that a state where only the first cell of the eight cells is in the reset state is 000, a state where only the second cell is in the reset state is 001, a state where only the third cell is in the reset state is 010, a state where only the fourth cell is in the reset state is 100, a state where only the fifth cell is in the reset state is 011, a state where only the sixth cell is in the reset state is 101, a state where only the seventh cell is in the reset state is 110, and a state where only the eighth cell is in the reset state is 111. By doing so, the numbers of cells in which reset operation needs to be performed to program information of 000, 001, 010, 100, 011, 101, 110, and 111 are 1. One cell is programmed on average. Since one cell is programmed to store three bits of information, ⅓ cell per bit is reset. The number of reset operation required for recording one bit of information is further decreased from 0.5 which is the case of FIG. 45(a), and it is possible to transfer data at high speed. As a method of selecting the cells C1 to C8, eight cells can be selected from the two unit cells each made up of four cells of CELL1 to CELL4, for example. Naturally, the method of selecting the cells C1 to C8 is not limited to this.

In this way, it can be understood that it is possible to increase the data transfer rate as compared to the case of recording one bit on one cell by (1) performing reset operation on only one cell of $2^n$ (n≥3) cells or (2) performing reset operation on one or smaller cell of $2^n-1$ (n≥2) cells. FIG. 45(c) illustrates the case (1) of n=3, FIG. 45(a) illustrates the case (2) of n=2, and FIG. 45(b) illustrates the case (2) of n=3.

In general, it is possible to reduce the number of reset operation required for programming information per bit as compared to recording one bit on one cell by (3) performing reset operation on L cells of M cells or (4) performing reset operation on L or smaller cells of M cells (L<(M/2)). Thus, it is possible to increase the data transfer rate.

It is possible to form M cells using a plurality of cells that can be selected by the operation of FIGS. 3, 4, and 35 in the vertical chain cells of the first embodiment of this invention and to select L cells from the M cells to perform the operations (1), (2), (3), and (4).

Although in the first embodiment of this invention, the phase-change material 7 is used as the recording material, a resistance-change material rather than the phase-change material may be used as the recording material.

REFERENCE SIGNS LIST 2 electrode wire
3 electrode wire
40*p*, 141*p* polysilicon layer doped with p-type impurities
50*p* polysilicon layer doped with low-concentration impurities
6*p*, 26*p*, 60*p*, 61*p*, 62*p*, 98*p*, 99*p* polysilicon layer doped with n-type impurities
21*p*, 22*p*, 23*p*, 24*p*, 25*p* gate polysilicon layer
9 gate insulator film layer
11, 12, 13, 14, 15, 71 insulator film layer
51 dummy insulator film
31, 52, 91, 92 insulator film layer
7 phase-change material layer 88p, 89p channel polysilicon layer
40a, 50a, 60a, 88a, 89a, 98a, 99a, 21a, 22a, 23a, 24a, 25a, 26a amorphous silicon layer
8p, 8p+X1, 8p+X2, 8p+X3, 8p–X1, 8p–X2, 208p channel polysilicon layer
41p, 43p channel polysilicon layer
42p, 44p, 38p polysilicon layer doped with n-type impurities
MA memory array
BL, BL1, BL2, BLn bit line
WL, WL1, WL2 bit line
BLC bit line contact
WLC word line contact
SL, SL1, SL2 source line
GC1O, GC2O, GC3O, GC4O gate electrode contact
GC1E, GC2E, GC3E, GC4E gate electrode contact
GL1O, GL2O, GL3O, GL4O metal wire for supplying current to gate electrode
GL1E, GL2E, GL3E, GL4E metal wire for supplying current to gate electrode
GL11, GL21, GL31, GL41, GL12, GL22, GL32, GL42, GL13, GL23,
GL33, GL43 metal wire for supplying current to gate electrode
STGCO, STGCE select transistor gate electrode contact
STGLO, STGLE metal wire for supplying current to select transistor gate electrode
SMC, SMC1, SMC2 select memory cell
USMC unselected memory cell
PD diode layer
X, Y, Z direction
CELL1, CELL2, CELL3, CELL4 memory cell corresponding portion in unit cell
C1, C2, C3, C4, C5, C6, C7, C8 memory cell
STGLDm, STGLDm+1 metal wire for supplying current to select transistor gate
STG1, n, STG1, n+1 select transistor gate
STG2, n, STG2, n+1, STG2, n+2 select transistor gate
STG3, m, STG3, m+1 select transistor gate
STG4, m, STG4, m+1, STG4, m+2 select transistor gate
Tx, n, 1, Tx, n, 2, Tx, n+1, 1, Tx, n+1, 2 terminal
Ty, m, 1, Ty, m, 2, Ty, m+1, 1, Ty, m+1, 2 terminal
STG1, STG2, STG3, STG4 select transistor gate
X, Y, Z direction
TXL1, TXL2 X-select transistor layer
TYL1, TYL2 Y-select transistor layer
BM barrier metal
BJT bipolar transistor

The invention claimed is:

1. A semiconductor storage device comprising:
a plurality of stacked structures in which a plurality of first insulator film layers and a plurality of first gate semiconductor layers are alternately stacked above a semiconductor substrate, the stacked structures extending in a Y direction parallel to a main surface of the semiconductor substrate and being arranged at intervals in an X direction parallel to the main surface and orthogonal to the Y direction;
a plurality of first gate insulator film layers provided on side surfaces in the X direction of the plurality of stacked structures;
a plurality of first channel layers formed at intervals in the Y direction on the side surfaces in the X direction of the plurality of first gate insulator film layers; and
a plurality of resistance-change material layers formed from a material of which the resistivity changes with a current flowing therein and disposed at intervals in the Y direction, each resistance-change material layer being between two adjacent stacked structures of the plurality of stacked structures and being electrically connected in the X direction to two adjacent channel layers of the plurality of first channel layers, thereby providing a plurality of current paths in the X direction between the two adjacent channel layers through the resistance-change material layer,
each first channel layer at one side of each resistance-change material layer is coupled to be supplied with voltage independently of the other first gate semiconductor layers at the one side of the resistance-change material layer and independently of the first gate semiconductor layers adjacent to the first channel layer at an opposite side of the resistance-change material layer.

2. The semiconductor storage device according to claim 1, wherein
a width in the X direction of the plurality of first insulator film layers and the plurality of first gate semiconductor layers is the same as an interval in the X direction of the plurality of stacked structures, and
a width in the Y direction of the plurality of first channel layers is the same as an interval in the Y direction of the plurality of first channel layers.

3. The semiconductor storage device according to claim 2, wherein
the width in the X direction of the plurality of first insulator film layers and the plurality of first gate semiconductor layers and the width in the Y direction of the plurality of channel layers are a minimum feature size F.

4. The semiconductor storage device according to claim 1, further comprising:
a plurality of second insulator film layers provided on an inner side in an XY plane of the plurality of resistance-change material layers.

5. The semiconductor storage device according to claim 1, wherein
when two adjacent stacked structures of the plurality of stacked structures with a resistance-change material layer interposed are a first stacked structure and a second stacked structure, and each of the first stacked structure and the second stacked structure includes n first gate semiconductor layers (n is a natural number),
voltage is biased up to a k-th ($1 \leq k \leq n-1$) first gate semiconductor layer from the bottom among the first gate semiconductor layers included in the first stacked structure so that transistors including up to the k-th first gate semiconductor layer of the first stacked structure are put into an OFF state and voltage is biased to the other first gate semiconductor layers of the first stacked structure so that transistors including the other first gate semiconductor layers of the first stacked structure are put into an ON state, and
voltage is biased up to a k-th first gate semiconductor layer from the bottom among the first gate semiconductor layers included in the second stacked structure so that transistors including up to the k-th first gate semiconductor layer of the second stacked structure are put into the ON state and voltage is biased to the other first gate semiconductor layers of the second stacked structure so that transistors including the other first gate semiconductor layers of the second stacked structure are put into the OFF state.

6. The semiconductor storage device according to claim 1, wherein
when two adjacent stacked structures of the plurality of stacked structures with resistance-change material layer interposed are a first stacked structure and a second stacked structure, and each of the first stacked structure and the second stacked structure includes n first gate semiconductor layers (n is a natural number), voltage is biased to a k-th first gate semiconductor layer from the bottom among the first gate semiconductor layers included in the first stacked structure so that a transistor including the k-th first gate semiconductor layer of the first stacked structure is put into a second ON state, voltage is biased to the first to (k−1)th first gate semiconductor layers from the bottom so that transistors including the first to (k−1)th first gate semiconductor layers of the first semiconductor structure are put into a second OFF state, and voltage is biased to the (k+1)th to n-th gate semiconductor layers from the bottom so that transistors including the (k+1)th to n-th first gate semiconductor layers of the first stacked structure are put into a first ON state, voltage is biased to a k-th (1<k≤n−1) first gate semiconductor layer from the bottom among the first gate semiconductor layers included in the second stacked structure so that a transistor including the k-th first gate semiconductor layer of the second stacked structure is put into the second ON state, voltage is biased to the first to (k−1)th first gate semiconductor layers from the bottom so that transistors including the first to (k−1)th first gate semiconductor layers of the second stacked structure are put into the first ON state, and voltage is biased to the c(k+1)th gate semiconductor layer from the bottom so that a transistor including the (k+1)th first gate semiconductor layer is put into a second OFF state, and a first ON-state channel resistivity is smaller than a second ON-state channel resistivity, and a second OFF-state channel resistivity is larger than a first OFF-state channel resistivity.

7. The semiconductor storage device according to claim 1, further comprising:
   a plurality of word lines provided above the semiconductor substrate and below the plurality of stacked structures so as to extend in the Y direction;
   a plurality of diodes provided above the plurality of word lines and below the plurality of stacked structures and each electrically connected to two adjacent channel layers of the plurality of channel layers with one of the resistance-change material layers interposed in the X direction;
   a plurality of first transistors which is provided above the plurality of resistance-change material layers, and each of the first transistors includes a second gate semiconductor layer extending in the Y direction and selects two adjacent channel layers of the plurality of first channel layers with one of the stacked structures interposed in the X direction; and
   a plurality of bit lines extending in the X direction and electrically connected to channel layers arranged in the X direction among the plurality of first channel layers.

8. The semiconductor storage device according to claim 1, further comprising:
   a first plate provided above the semiconductor substrate and below the plurality of stacked structures;
   a plurality of second transistors which is provided above the first plate and below the plurality of stacked structures and is electrically connecting two adjacent channel layers of the plurality of first channel layers with one of the stacked structures interposed to the first plate;
   a plurality of third transistors which is provided above the plurality of resistance-change material layers and includes a second gate semiconductor layer extending in the Y direction and which selects two adjacent channel layers of the plurality of first channel layers with one of the stacked structures interposed; and
   a plurality of bit lines extending in the X direction and electrically connected to channel layers arranged in the X direction among the plurality of first channel layers.

9. The semiconductor storage device according to claim 1, further comprising:
   a plurality of word lines provided above the semiconductor substrate and below the plurality of stacked structures so as to extend in the X direction;
   a plurality of seventh transistors electrically connecting any one of the plurality of word lines and two adjacent channel layers of the plurality of first channel layers with a resistance-change material layer interposed;
   a plurality of eighth transistors which is provided above the plurality of resistance-change material layers so as to select two adjacent channel layers of the plurality of first channel layers with the resistance-change material layer interposed; and
   a plurality of bit lines extending in the X direction so as to be electrically connected to channel layers arranged in the X direction among the plurality of first channel layers.

10. The semiconductor storage device according to claim 1, wherein
    when M (M is a natural number; M>2) memory cells are formed in each of the plurality of resistance-change material layers,
    all resistance-change material layers included in the M memory cells are put into a first state, and
    the resistance-change material layers included in L (L is a natural number; L<M/2) memory cells among the M memory cells are put into a second state in which the resistivity is different from that of the first state.

11. The semiconductor storage device according to claim 10, wherein
    $M=2^n-1$ and L=1 (n is a natural number).

12. The semiconductor storage device according to claim 10, wherein
    $M=2^n$ and L=1 (n is a natural number).

13. A method of fabricating a semiconductor storage device, comprising the steps of:
    (a) forming a plurality of stacked structures in which a plurality of first insulator film layers and a plurality of gate semiconductor layers are alternately stacked above a semiconductor substrate so as to extend in a Y direction when an X-axis and a Y-axis are defined as being orthogonal to each other in parallel to a main surface of the semiconductor substrate;
    (b) after step (a), forming a plurality of gate insulating layers along side surfaces of the plurality of stacked structures;
    (c) after step (b), forming a plurality of channel layers along side surfaces of the plurality of gate insulating layers;
    (d) after step (c), forming a plurality of second insulating layers and a plurality of third insulating layers alternately in the Y direction and extending in the X direction, the second insulating layers being disposed between channel layers opposed in the X direction and the third insulating layers being disposed between channel layers spaced in the Y direction;
    (e) after step (d), selectively removing the plurality of second insulating layers; and
    (f) after step (e), forming a plurality of resistance-change material layers along regions of the side surfaces of the plurality of channel layers where the second insulating layers have been removed, each resistance-change material layer being electrically connected in the X direction to two adjacent channel layers, thereby providing a plurality of current paths in the X direction between the two adjacent channel layers through the resistance-change materials layer.

14. The method of fabricating the semiconductor storage device according to claim 13, further comprising the step of:
  (g) forming a plurality of fourth insulator film layers on an inner side in an XY plane of the plurality of resistance-change material layers.

15. The method of fabricating the semiconductor storage device according to claim 13, further comprising the step of:
  (h) filling a conductive material in regions between the plurality of third insulating layers to form a plurality of bit lines extending in the X direction.

* * * * *